(12) United States Patent
Langhammer et al.

(10) Patent No.: US 11,809,798 B2
(45) Date of Patent: Nov. 7, 2023

(54) IMPLEMENTING LARGE MULTIPLIERS IN TENSOR ARRAYS

(71) Applicant: Intel Corporation, Santa Clara, CA (US)

(72) Inventors: Martin Langhammer, Alderbury (GB); Simon Peter Finn, High Wycombe (GB)

(73) Assignee: Intel Corporation, Santa Clara, CA (US)

(*) Notice: Subject to any disclaimer, the term of this patent is extended or adjusted under 35 U.S.C. 154(b) by 430 days.

(21) Appl. No.: 16/914,018

(22) Filed: Jun. 26, 2020

(65) Prior Publication Data

US 2021/0182465 A1   Jun. 17, 2021

Related U.S. Application Data

(60) Provisional application No. 62/948,114, filed on Dec. 13, 2019, provisional application No. 62/948,124, (Continued)

(51) Int. Cl.
*G06F 30/34* (2020.01)
*G06N 20/00* (2019.01)
(Continued)

(52) U.S. Cl.
CPC .......... *G06F 30/34* (2020.01); *G06F 9/30105* (2013.01); *G06F 9/545* (2013.01); *G06N 20/00* (2019.01)

(58) Field of Classification Search
USPC ........................................................ 716/117
See application file for complete search history.

(56) References Cited

U.S. PATENT DOCUMENTS 3,869,005 A   3/1975   Williams, Jr. et al.
5,522,085 A   5/1996   Harrison et al.
(Continued)

FOREIGN PATENT DOCUMENTS

CN   111722830 A   9/2020
EP    3330861 A1   6/2018
(Continued)

OTHER PUBLICATIONS

Extended European Search Report for EP Application No. 20196629.8 dated Mar. 9, 2021.
(Continued)

*Primary Examiner* — Bryce M Aisaka
(74) *Attorney, Agent, or Firm* — Fletcher Yoder, P.C.

(57) ABSTRACT

The present disclosure describes an integrated circuit device that includes a digital signal processing (DSP) block. The DSP block that includes a plurality of columns of weight registers and a plurality of inputs configured to receive a first plurality of values and a second plurality of values. The first plurality of values is stored in the plurality of columns of weight registers after being received. Also, the first plurality of inputs, the second plurality of inputs, or both are derived from higher precision values. Additionally, the DSP block includes a plurality of multipliers configured to simultaneously multiply each value of the first plurality of values by each value of the second plurality of values.

20 Claims, 42 Drawing Sheets

Related U.S. Application Data filed on Dec. 13, 2019, provisional application No. 62/948,110, filed on Dec. 13, 2019.

(51) Int. Cl.
  *G06F 9/30* (2018.01)
  *G06F 9/54* (2006.01)

(56) References Cited

U.S. PATENT DOCUMENTS

| | | | |
|---|---|---|---|
| 5,935,197 | A | 8/1999 | Aldworth |
| 6,631,461 | B2 | 10/2003 | Ganapathy et al. |
| 6,883,084 | B1 | 4/2005 | Donohoe |
| 7,437,401 | B2 | 10/2008 | Zheng et al. |
| 8,521,800 | B1 | 8/2013 | Bergland et al. |
| 9,098,332 | B1 | 8/2015 | Langhammer |
| 10,089,078 | B2 | 10/2018 | Vincenzoni et al. |
| 10,489,116 | B1 | 11/2019 | Esposito |
| 10,879,904 | B1 | 12/2020 | Gunter et al. |
| 2015/0295579 | A1* | 10/2015 | How .................. G06F 30/34 716/134 |
| 2017/0357891 | A1* | 12/2017 | Judd .................. G06N 3/049 |
| 2018/0137075 | A1 | 5/2018 | Linderman et al. |
| 2019/0042538 | A1 | 2/2019 | Koren et al. |
| 2019/0228051 | A1 | 7/2019 | Langhammer et al. |
| 2020/0097253 | A1 | 3/2020 | Clark et al. |
| 2020/0326948 | A1 | 10/2020 | Langhammer |
| 2020/0327271 | A1 | 10/2020 | Langhammer et al. |
| 2020/0401414 | A1 | 12/2020 | Ware et al. |
| 2021/0182022 | A1 | 6/2021 | Langhammer et al. |
| 2021/0182023 | A1 | 6/2021 | Langhammer et al. |
| 2021/0182465 | A1 | 6/2021 | Langhammer et al. |

FOREIGN PATENT DOCUMENTS

| | | |
|---|---|---|
| EP | 3299952 B1 | 4/2019 |
| JP | 5074602 B2 | 11/2012 |
| WO | 2018213628 | 11/2018 |

OTHER PUBLICATIONS

Extended European Search Report for EP Application No. 20196801.3 dated Mar. 10, 2021.

Extended European Search Report for EP Application No. 20196562.1 dated Mar. 10, 2021.

Wang et al.; "Convolutional Neural Network Accelerator on FPGA"; 2019 IEEE International Conference on Integrated Circuits, Technologies and Applications (ICTA); Year: 2019 I Conference Paper I Publisher: IEEE; (Year: 2019).

Shu et al.; "High Energy Efficiency FPGA-based Accelerator for Convolutional Neural Networks Using Weight Combination"; 2019 IEEE 4th International Conference on Signal and Image Processing (ICSIP); Conference Paper | Publisher: IEEE; (Year: 2019).

Foltin et al.; "FPGA demonstrator of a Programmable Ultraefficient Memristor-based Machine Learning Inference Accelerator"; 2019 IEEE International Conference on Rebooting Computing (ICRC); Year: 2019; Conference Paper; Publisher: IEEE) (Year: 2019).

* cited by examiner

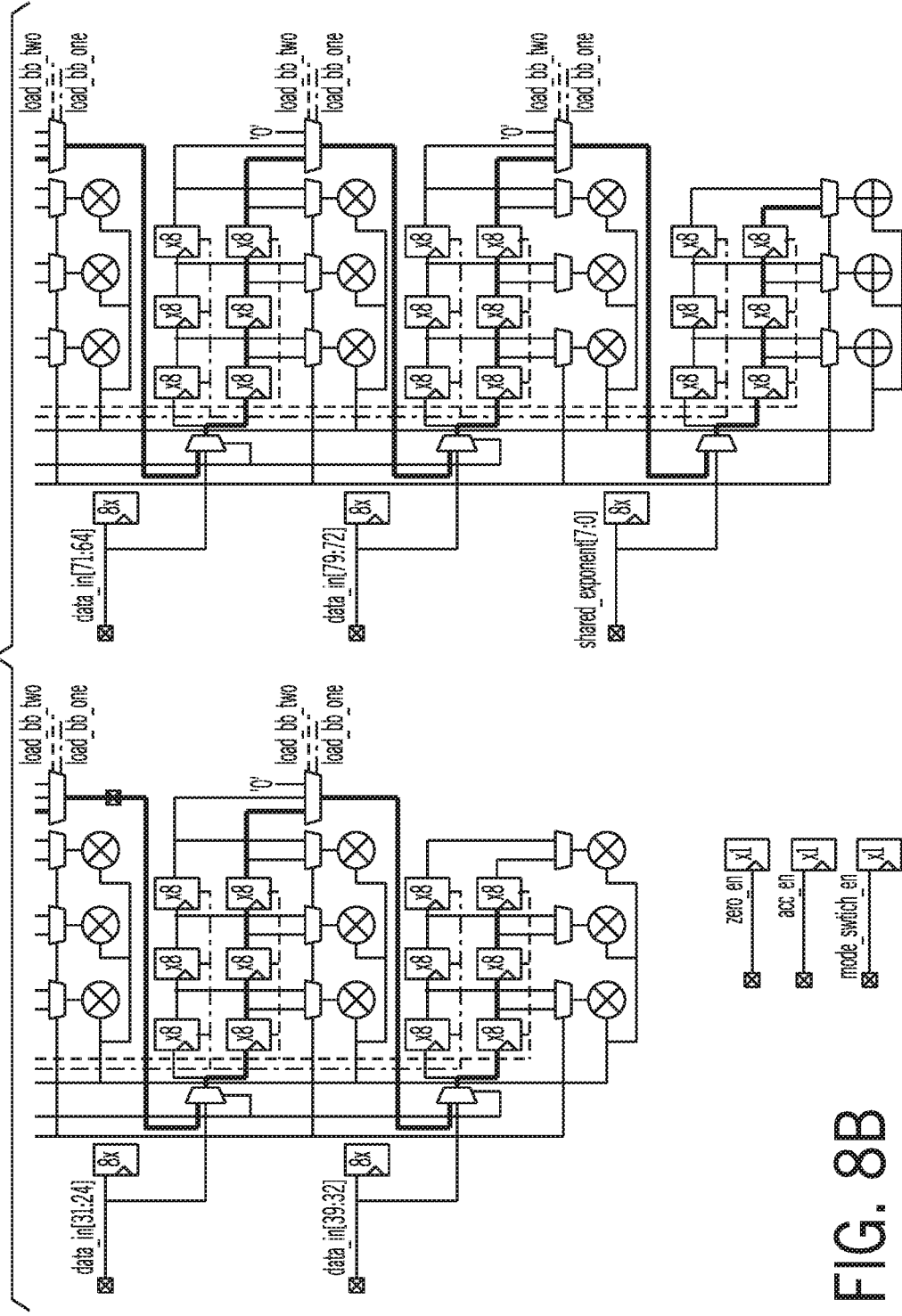

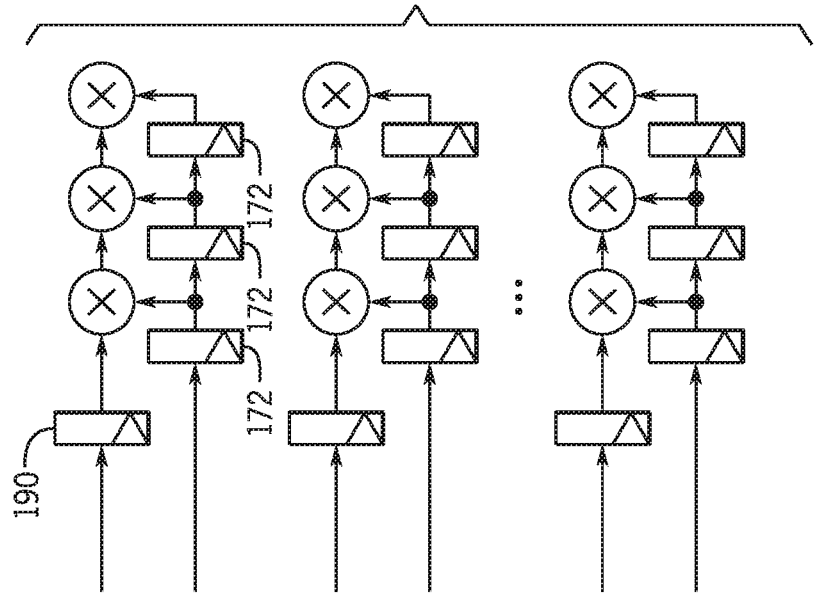
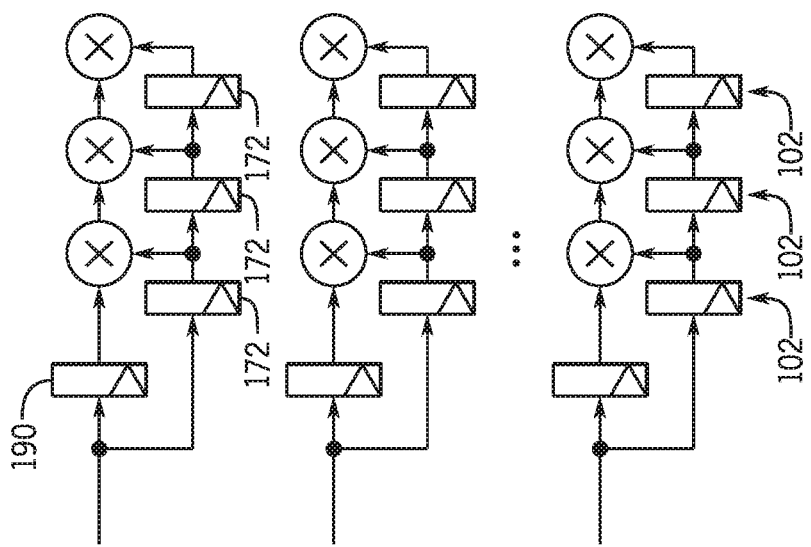

IMPLEMENTING LARGE MULTIPLIERS IN TENSOR ARRAYS

CROSS-REFERENCE TO RELATED APPLICATIONS

This application claims priority to U.S. Application No. 62/948,110, filed Dec. 13, 2019, entitled "FPGA Specialist Processing Block for Artificial Intelligence," U.S. Application No. 62/948,114, filed Dec. 13, 2019, entitled "Implementing Large Multipliers in Tensor Arrays," and U.S. Application No. 62/948,124, filed Dec. 13, 2019, entitled "Systems and Methods for Loading Weights into a Tensor Processing Block," all of which are incorporated by reference in their entireties for all purposes. This application is related to U.S. application Ser. No. 16/914,009, filed Jun. 26, 2020, entitled "FPGA Specialist Processing Block for Machine Learning" and U.S. application Ser. No. 16/914,025, filed Jun. 26, 2020, entitled "Systems and Methods for Loading Weights into a Tensor Processing Block", both of which are incorporated herein by reference in their entireties for all purposes.

BACKGROUND

The present disclosure relates generally to integrated circuit (IC) devices such as programmable logic devices (PLDs). More particularly, the present disclosure relates to a processing block that may be included on an integrated circuit device as well as applications that can be performed utilizing the processing block.

This section is intended to introduce the reader to various aspects of art that may be related to various aspects of the present disclosure, which are described and/or claimed below. This discussion is believed to be helpful in providing the reader with background information to facilitate a better understanding of the various aspects of the present disclosure. Accordingly, it may be understood that these statements are to be read in this light, and not as admissions of prior art.

Integrated circuit devices may be utilized for a variety of purposes or applications, such as digital signal processing and machine learning. Indeed, machine learning and artificial intelligence applications have become ever more prevalent. Programmable logic devices may be utilized to perform these functions, for example, using particular circuitry (e.g., processing blocks). In some cases, particular circuitry that is effective for digital signal processing may not be well suited for machine learning, while particular circuitry for machine learning may not be well suited for digital signal processing.

BRIEF DESCRIPTION OF THE DRAWINGS

Various aspects of this disclosure may be better understood upon reading the following detailed description and upon reference to the drawings in which:

FIG. 8A and FIG. 8B illustrate port weight loading, in accordance with an embodiment of the present disclosure;

FIG. 9 illustrates parallel weight loading of weights into weight registers, in accordance with an embodiment of the present disclosure;

FIG. 10 illustrates parallel weight loading, in accordance with another embodiment of the present disclosure;

DETAILED DESCRIPTION OF SPECIFIC EMBODIMENTS

Figure 1:
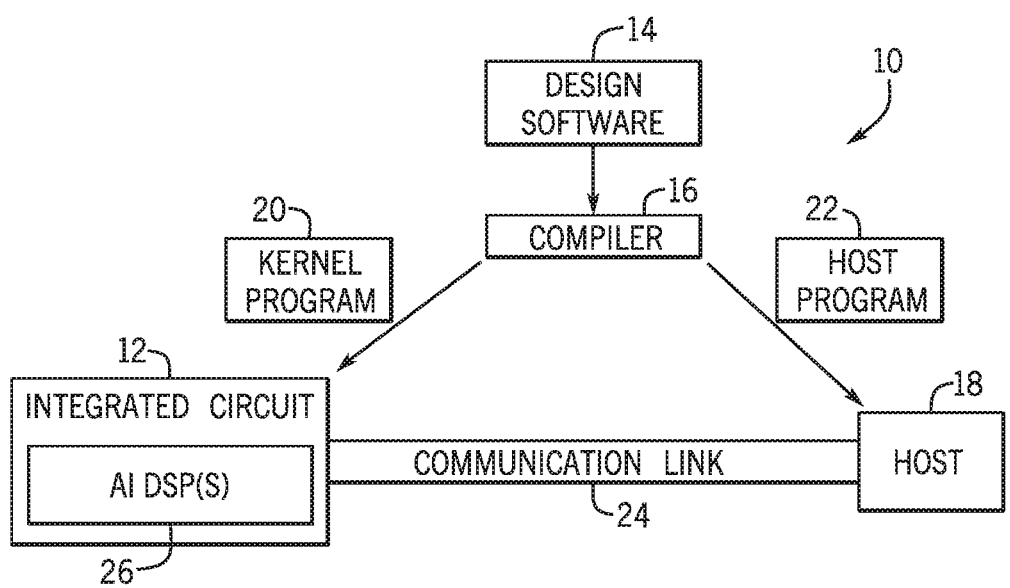
FIG. 1 is a block diagram of a system that may implement arithmetic operations using a DSP block, in accordance with an embodiment of the present disclosure.

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

When introducing elements of various embodiments of the present disclosure, the articles "a," "an," and "the" are intended to mean that there are one or more of the elements. The terms "including" and "having" are intended to be inclusive and mean that there may be additional elements other than the listed elements. Additionally, it should be understood that references to "some embodiments," "embodiments," "one embodiment," or "an embodiment" of the present disclosure are not intended to be interpreted as excluding the existence of additional embodiments that also incorporate the recited features. Furthermore, the phrase A "based on" B is intended to mean that A is at least partially based on B. Moreover, the term "or" is intended to be inclusive (e.g., logical OR) and not exclusive (e.g., logical XOR). In other words, the phrase A "or" B is intended to mean A, B, or both A and B.

As machine learning and artificial intelligence applications have become ever more prevalent, there is a growing desire for circuitry to perform calculations utilized in machine-learning and artificial intelligence applications that is also able to be used for digital signal processing applications. The present systems and techniques relate to embodiments of a digital signal processing (DSP) block that may provide a similar level of arithmetic performance (TOPs/TFLOPs) as an application-specific standard product (ASSP) or application-specific integrated circuit (ASIC) for artificial intelligence (AI) operations. In general, a DSP block is a type of circuitry that is used in integrated circuit devices, such as field programmable gate arrays (FPGAs), to perform multiply, accumulate, and addition operations. The DSP block described herein may take advantage of the flexibility of an FPGA to adapt to emerging algorithms or fix bugs in a planned implementation. The number representations used can be fixed point or floating point. Floating point numbers can also be expressed in block floating point, where a single exponent can be shared for multiple input values.

An FPGA can also provide other types of flexibility. For example, non-linear activation functions, such as tanh(x) and sigmoid(x), can be inserted anywhere into the dataflow, and the precision or range supported by such functions can be tailored to the application requirement, thereby saving area and power. Furthermore, an FPGA that includes the DSP circuitry described herein can also be used for non-AI signal processing or applications that do not involve any signal processing or hard arithmetic.

The presently described techniques also provide improved computational density and power consumption (e.g., a higher amount of TOPs/TFLOPs per W). For instance, as discussed herein, DSP blocks may perform virtual bandwidth expansion so that the bandwidth available can be used more effectively for the processing used and so that the cost of the computation (e.g., area for arithmetic) is balanced with the availability of the wires of an FPGA in a desirable (e.g., optimal) way for artificial intelligence applications. Moreover, the DSP blocks described herein may use the area and interface of the other DSP blocks that perform multiply-accumulate operations. Bounded box floating point may be used to provide floating point accuracy, along with full single-precision floating point (e.g., FP32) output capability.

With this in mind, FIG. 1 illustrates a block diagram of a system 10 that may implement arithmetic operations using a DSP block. A designer may desire to implement functionality, such as the large precision arithmetic operations of this disclosure, on an integrated circuit device 12 (such as a field-programmable gate array (FPGA) or an application-specific integrated circuit (ASIC)). In some cases, the designer may specify a high-level program to be implemented, such as an OpenCL program, which may enable the designer to more efficiently and easily provide programming instructions to configure a set of programmable logic cells for the integrated circuit device 12 without specific knowledge of low-level hardware description languages (e.g., Verilog or VHDL). For example, because OpenCL is quite similar to other high-level programming languages, such as C++, designers of programmable logic familiar with such programming languages may have a reduced learning curve than designers that are required to learn unfamiliar low-level hardware description languages to implement new functionalities in the integrated circuit device 12.

The designers may implement their high-level designs using design software 14, such as a version of Intel® Quartus® by INTEL CORPORATION. The design software 14 may use a compiler 16 to convert the high-level program into a lower-level description. The compiler 16 may provide machine-readable instructions representative of the high-level program to a host 18 and the integrated circuit device 12. The host 18 may receive a host program 22 which may be implemented by the kernel programs 20. To implement the host program 22, the host 18 may communicate instructions from the host program 22 to the integrated circuit device 12 via a communications link 24, which may be, for example, direct memory access (DMA) communications or peripheral component interconnect express (PCIe) communications. In some embodiments, the kernel programs 20 and the host 18 may enable configuration of one or more DSP blocks 26 on the integrated circuit device 12. The DSP block 26 may include circuitry to implement, for example, operations to perform matrix-matrix or matrix-vector multiplication for AI or non-AI data processing. The integrated circuit device 12 may include many (e.g., hundreds or thousands) of the DSP blocks 26. Additionally, DSP blocks 26 may be communicatively coupled to another such that data outputted from one DSP block 26 may be provided to other DSP blocks 26.

While the techniques above discussion described to the application of a high-level program, in some embodiments, the designer may use the design software 14 to generate and/or to specify a low-level program, such as the low-level hardware description languages described above. Further, in some embodiments, the system 10 may be implemented without a separate host program 22. Moreover, in some embodiments, the techniques described herein may be implemented in circuitry as a non-programmable circuit design. Thus, embodiments described herein are intended to be illustrative and not limiting.

Figure 2:
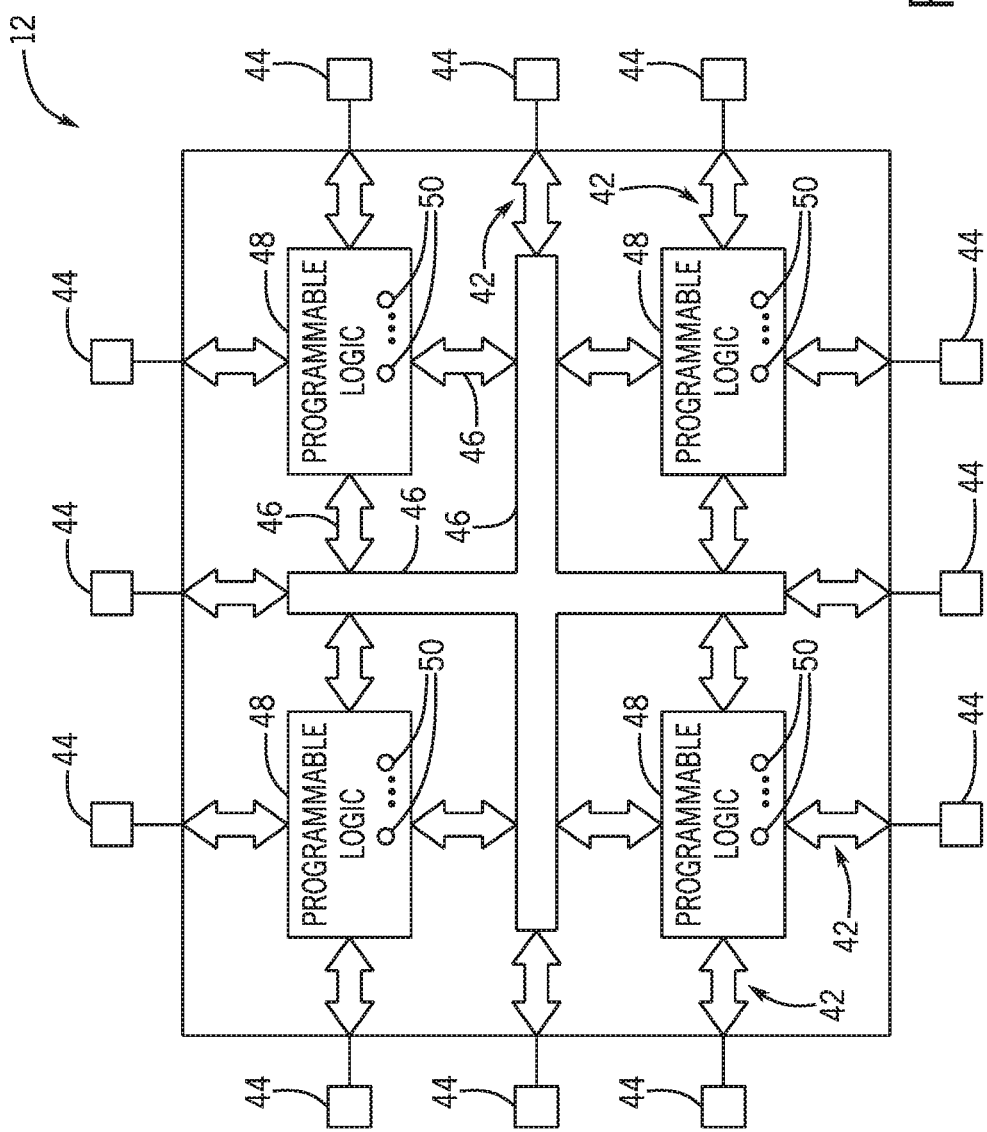
FIG. 2 is a block diagram of the integrated circuit device of FIG. 1, in accordance with an embodiment of the present disclosure.

Turning now to a more detailed discussion of the integrated circuit device 12, FIG. 2 illustrates an example of the integrated circuit device 12 as a programmable logic device, such as a field-programmable gate array (FPGA). Further, it should be understood that the integrated circuit device 12 may be any other suitable type of integrated circuit device (e.g., an application-specific integrated circuit and/or application-specific standard product). As shown, the integrated circuit device 12 may have input/output circuitry 42 for driving signals off device and for receiving signals from other devices via input/output pins 44. Interconnection resources 46, such as global and local vertical and horizontal conductive lines and buses, may be used to route signals on integrated circuit device 12. Additionally, interconnection resources 46 may include fixed interconnects (conductive lines) and programmable interconnects (e.g., programmable connections between respective fixed interconnects). Programmable logic 48 may include combinational and sequential logic circuitry. For example, programmable logic 48 may include look-up tables, registers, and multiplexers. In various embodiments, the programmable logic 48 may be configured to perform a custom logic function. The programmable interconnects associated with interconnection resources may be considered to be a part of the programmable logic 48.

Programmable logic devices, such as integrated circuit device 12, may contain programmable elements 50 within the programmable logic 48. For example, as discussed above, a designer (e.g., a customer) may program (e.g., configure) the programmable logic 48 to perform one or more desired functions. By way of example, some programmable logic devices may be programmed by configuring their programmable elements 50 using mask programming arrangements, which is performed during semiconductor manufacturing. Other programmable logic devices are configured after semiconductor fabrication operations have been completed, such as by using electrical programming or laser programming to program their programmable elements 50. In general, programmable elements 50 may be based on any suitable programmable technology, such as fuses, antifuses, electrically-programmable read-only-memory technology, random-access memory cells, mask-programmed elements, and so forth.

Many programmable logic devices are electrically programmed. With electrical programming arrangements, the programmable elements 50 may be formed from one or more memory cells. For example, during programming, configuration data is loaded into the memory cells using pins 44 and input/output circuitry 42. In one embodiment, the memory cells may be implemented as random-access-memory (RAM) cells. The use of memory cells based on RAM technology is described herein is intended to be only one example. Further, because these RAM cells are loaded with configuration data during programming, they are sometimes referred to as configuration RAM cells (CRAM). These memory cells may each provide a corresponding static control output signal that controls the state of an associated logic component in programmable logic 48. For instance, in some embodiments, the output signals may be applied to the gates of metal-oxide-semiconductor (MOS) transistors within the programmable logic 48.

Figure 3:
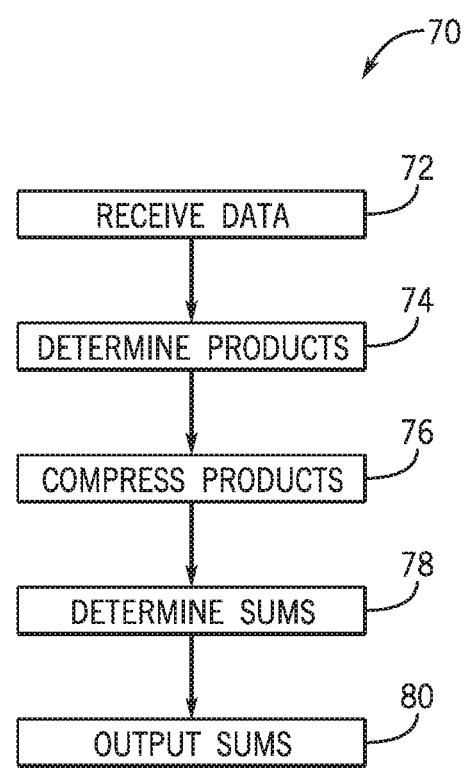
FIG. 3 is a flow diagram of a process the digital signal processing (DSP) block of the integrated circuit device of FIG. 1 may perform when conducting multiplication operations, in accordance with an embodiment of the present disclosure.

Keeping the foregoing in mind, the DSP block 26 discussed here may be used for a variety of applications and to perform many different operations associated with the applications, such as multiplication and addition. For example, matrix and vector (e.g., matrix-matrix, matrix-vector, vector-vector) multiplication operations may be well suited for both in AI and digital signal processing applications. As discussed below, the DSP block 26 may simultaneously calculate many products (e.g., dot products) by multiplying one or more rows of data by one or more columns of data. Before describing circuitry of the DSP block 26, to help provide an overview for the operations that the DSP block 26 may perform, FIG. 3 is provided. In particular, FIG. 3 is a flow diagram of a process 70 that the DSP block 26 may perform, for example, on data the DSP block 26 receives to determine the product of the inputted data. Additionally, it should be noted the operations described with respect to the process 70 are discussed in greater detail with respect to subsequent drawings.

At process block 72, the DSP block 26 receives data. The data may include values that will be multiplied. The data may include fixed-point and floating-point data types. In some embodiments, the data may be fixed-point data types that share a common exponent. Additionally, the data may be floating-point values that have been converted for fixed-point values (e.g., fixed-point values that share a common exponent). As described in more detail below with regard to circuitry included in the DSP block 26, the inputs may include data that will be stored in weight registers included in the DSP block 26 as well as values that are going to be multiplied by the values stored in the weight registers.

At process block 74, the DSP block 26 may multiply the received data (e.g., a portion of the data) to generate products. For example, the products may be subset products (e.g., products determined as part of determining one or more partial products in a matrix multiplication operation) associated with several columns of data being multiplied by data that the DSP block 26 receives. For instance, when multiplying matrices, values of a row of a matrix may be multiplied by values of a column of another matrix to generate the subset products.

At process block 76, the DSP block 26 may compress the products to generate vectors. For example, as described in more detail below, several stages of compression may be used to generate vectors that the DSP block 26 sums.

At process block 78, the DSP block 26 may determine the sums of the compressed data. For example, for subset products of a column of data that have been compressed (e.g., into fewer vectors than there were subset products), the sum of the subset products may be determined using adding circuitry (e.g., one or more adders, accumulators, etc.) of the DSP block 26. Sums may be determined for each column (or row) of data, which as discussed below, correspond to columns (and rows) of registers within the DSP block 26. Additionally, it should be noted that, in some embodiments, the DSP block 26 may convert fixed-point values to floating-point values before determining the sums at process block 78.

At process block 80, the DSP block 26 may output the determined sums. As discussed below, in some embodiments, the data the DSP block 26 outputs may be received by post-processing circuitry, which may further process the data. Moreover, the outputs may be provided to another DSP block 26 that is chained to the DSP block 26.

Figure 4:
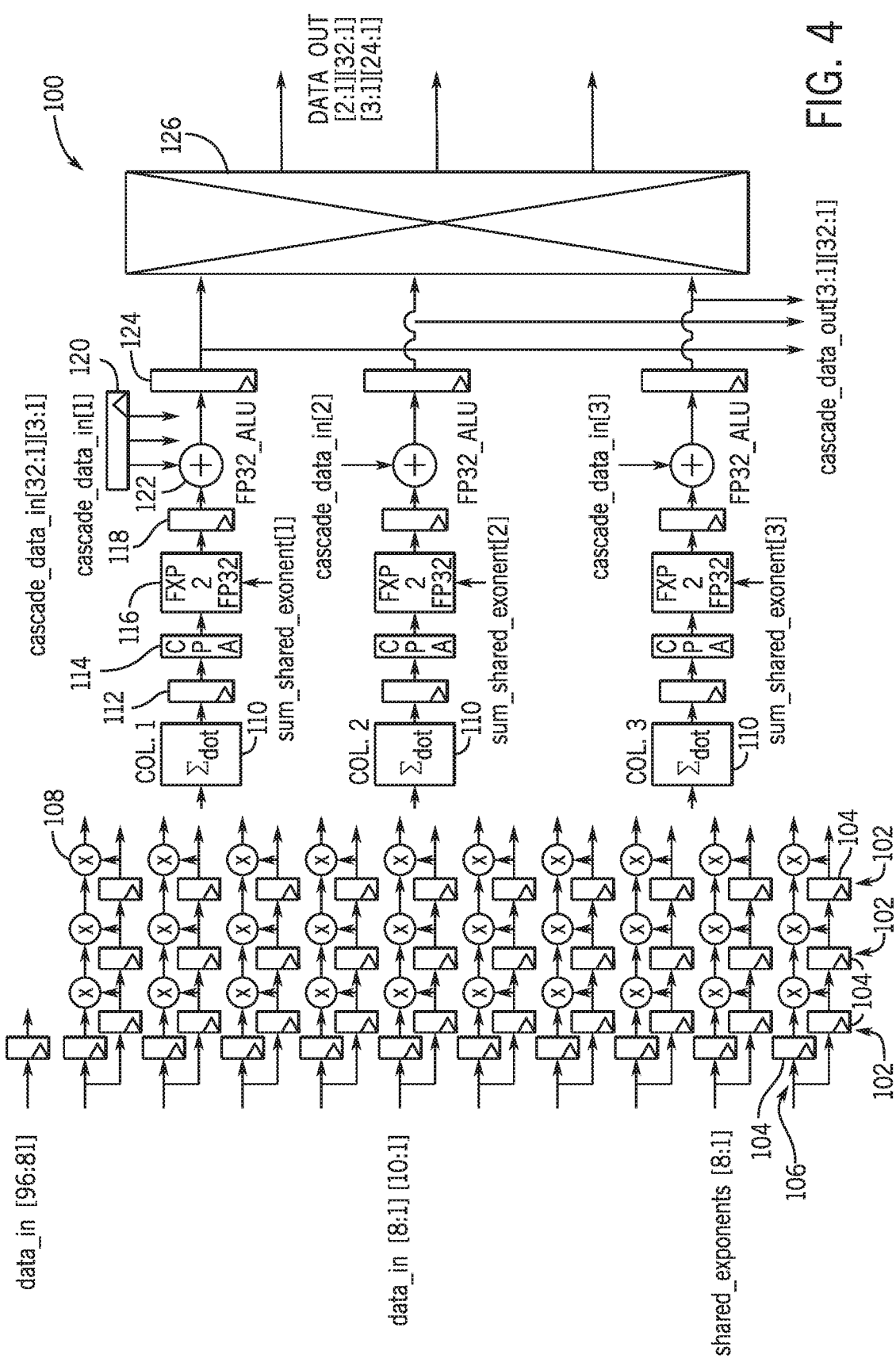
FIG. 4 is a block diagram of a virtual bandwidth expansion structure implementable via the DSP block of FIG. 1, in accordance with an embodiment of the present disclosure.

Keeping the discussion of FIG. 3 in mind, FIG. 4 is a block diagram illustrating a virtual bandwidth expansion structure 100 implemented using the DSP block 26. The virtual bandwidth expansion structure 100 includes columns 102 of registers 104 that may store data values the DSP block 26 receives. For example, the data received may be fixed-point values, such as four-bit or eight-bit integer values. In other embodiments, the received data may be fixed-point values having one to eight integer bits, or more than eight integer bits. Additionally, the data received may include a shared exponent in which case the received data may be considered as floating-point values. While three columns 102 are illustrated, in other embodiments, there may be fewer than three columns 102 or more than three columns 102. The registers 104 of the columns 102 may be used to store data values associated with a particular portion of data received by the DSP block 26. For example, each column 102 may include data corresponding to a particular column of a matrix when performing matrix multiplication operations. As discussed in more detail below, data may preloaded into the columns 102, and the data can be used to perform multiple multiplication operations simultaneously. For example, data received by the DSP block 26 corresponding to rows 106 (e.g., registers 104) may be multiplied (using multipliers 108) by values stored in the columns 102. More specifically, in the illustrated embodiment, ten rows of data can be received and simultaneously multiplied with data in three columns 102, signifying that thirty products (e.g., subset products) can be calculated.

For example, when performing matrix-matrix multiplication, the same row(s) or column(s) is/are may be applied to multiple vectors of the other dimension by multiplying received data values by data values stored in the registers 104 of the columns 102. That is, multiple vectors of one of the dimensions of a matrix can be preloaded (e.g., stored in the registers 104 of the columns 102), and vectors from the other dimension are streamed through the DSP block 26 to be multiplied with the preloaded values. Accordingly, in the illustrated embodiment that has three columns 102, up to three independent dot products can be determined simultaneously for each input (e.g., each row 106 of data). As discussed below, these features may be utilized to multiply generally large values. Additionally, as noted above, the DSP block 26 may also receive data (e.g., 8 bits of data) for the shared exponent of the data being received.

The partial products for each column 102 may be compressed, as indicated by the compression blocks 110 to generate one or more vectors (e.g., represented by registers 112), which can be added via carry-propagate adders 114 to generate one or more values. A fixed-point to floating-point converter 116 may convert the values to a floating-point format, such as a single-precision floating point value (e.g., FP32) as provided by IEEE Standard 754, to generate a floating-point value (represented by register 118).

The DSP block 26 may be communicatively coupled to other DSP blocks 26 such that the DSP block 26 may receive data from, and provide data to, other DSP blocks 26. For example, the DSP block 26 may receive data from another DSP block 26, as indicated by cascade register 120, which may include data that will be added (e.g., via adder 122) to generate a value (represented by register 124). Values may be provided to a multiplexer selection circuitry 126, which selects values, or subsets of values, to be output out of the DSP block 26 (e.g., to circuitry that may determine a sum for each column 102 of data based on the received data values.) The outputs of the multiplexer selection circuitry 126 may be floating-point values, such as FP32 values or floating-point values in other formats such as bfloat24 format (e.g., a value having one sign bit, eight exponent bits, and sixteen implicit (fifteen explicit) mantissa bits).

Figure 5A:
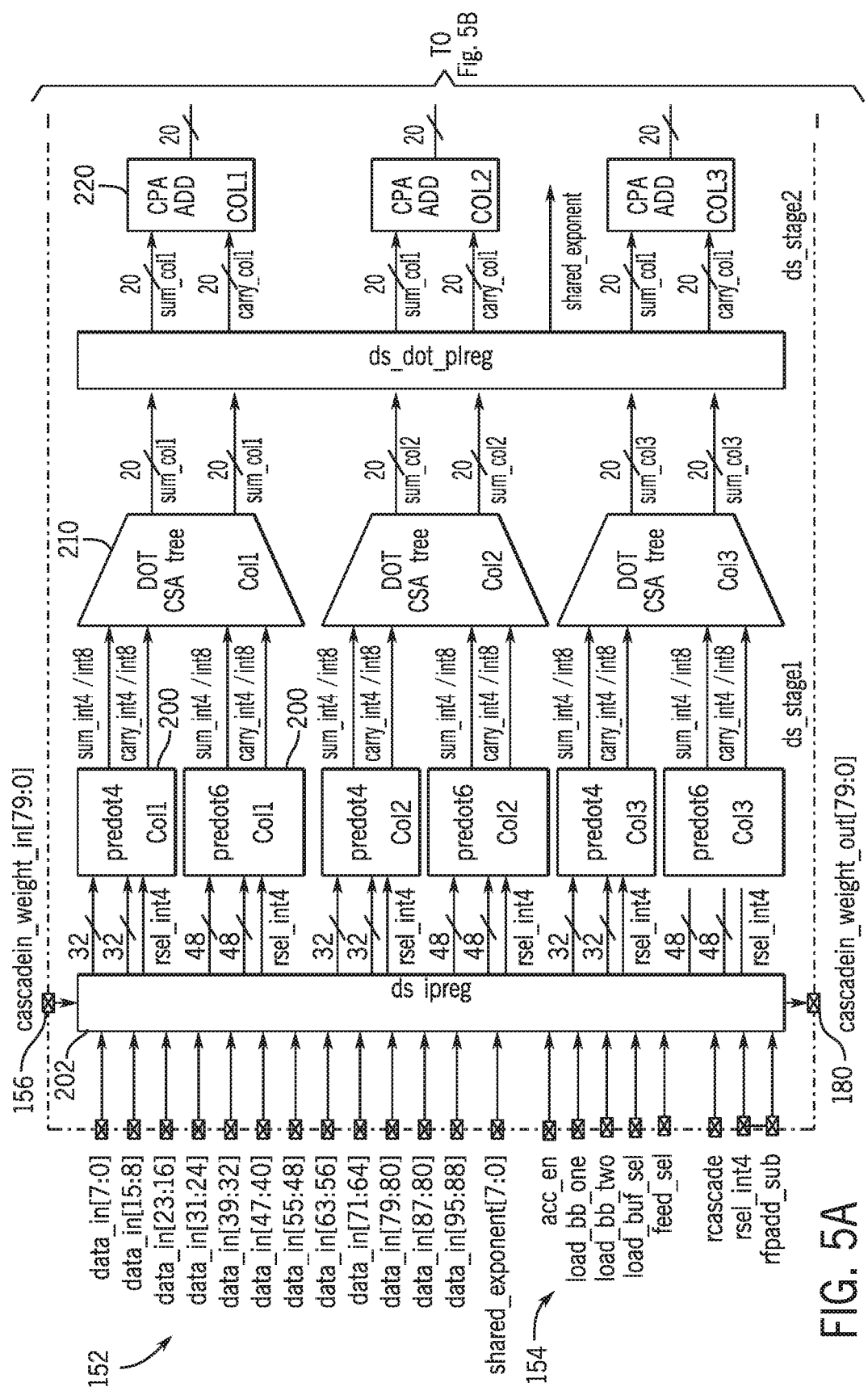
FIG. 5A and FIG. 5B are block diagrams of portions of a tensor processing block in the DSP block of FIG. 1, in accordance with an embodiment of the present disclosure.
Figure 5B:
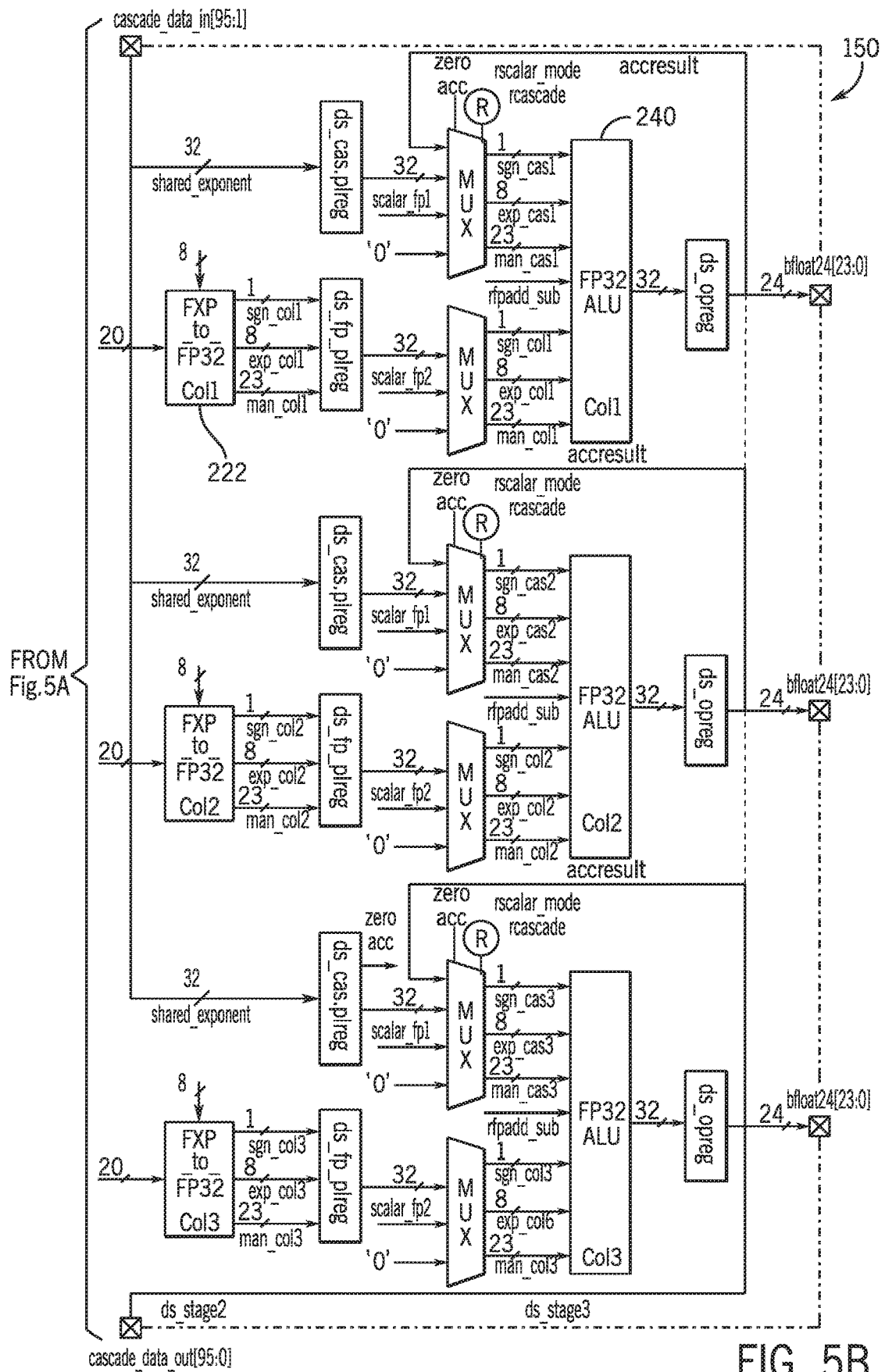
Figure 6A:
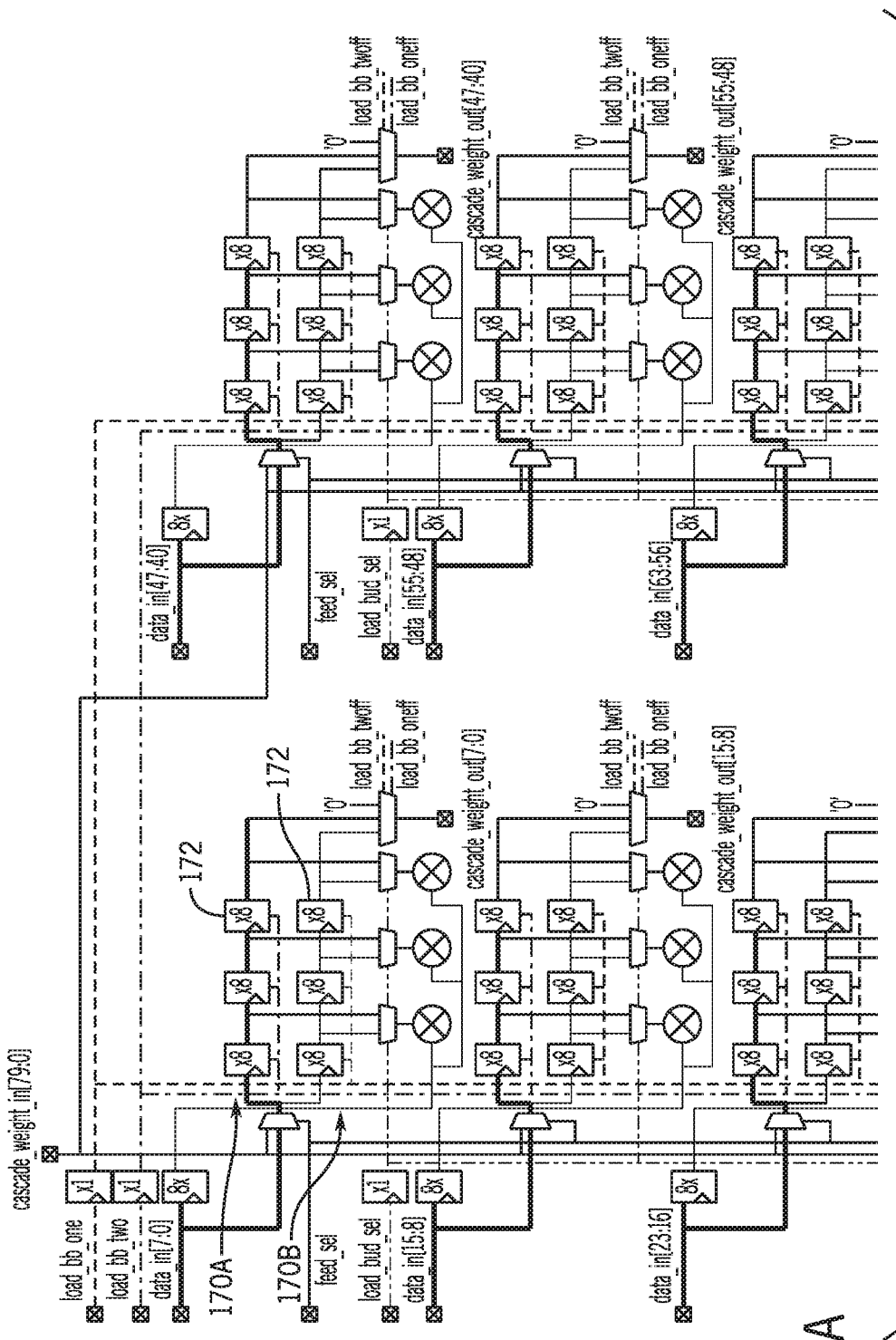
FIG. 6A and FIG. 6B illustrate parallel weight loading, in accordance with an embodiment of the present disclosure.
Figure 6B:
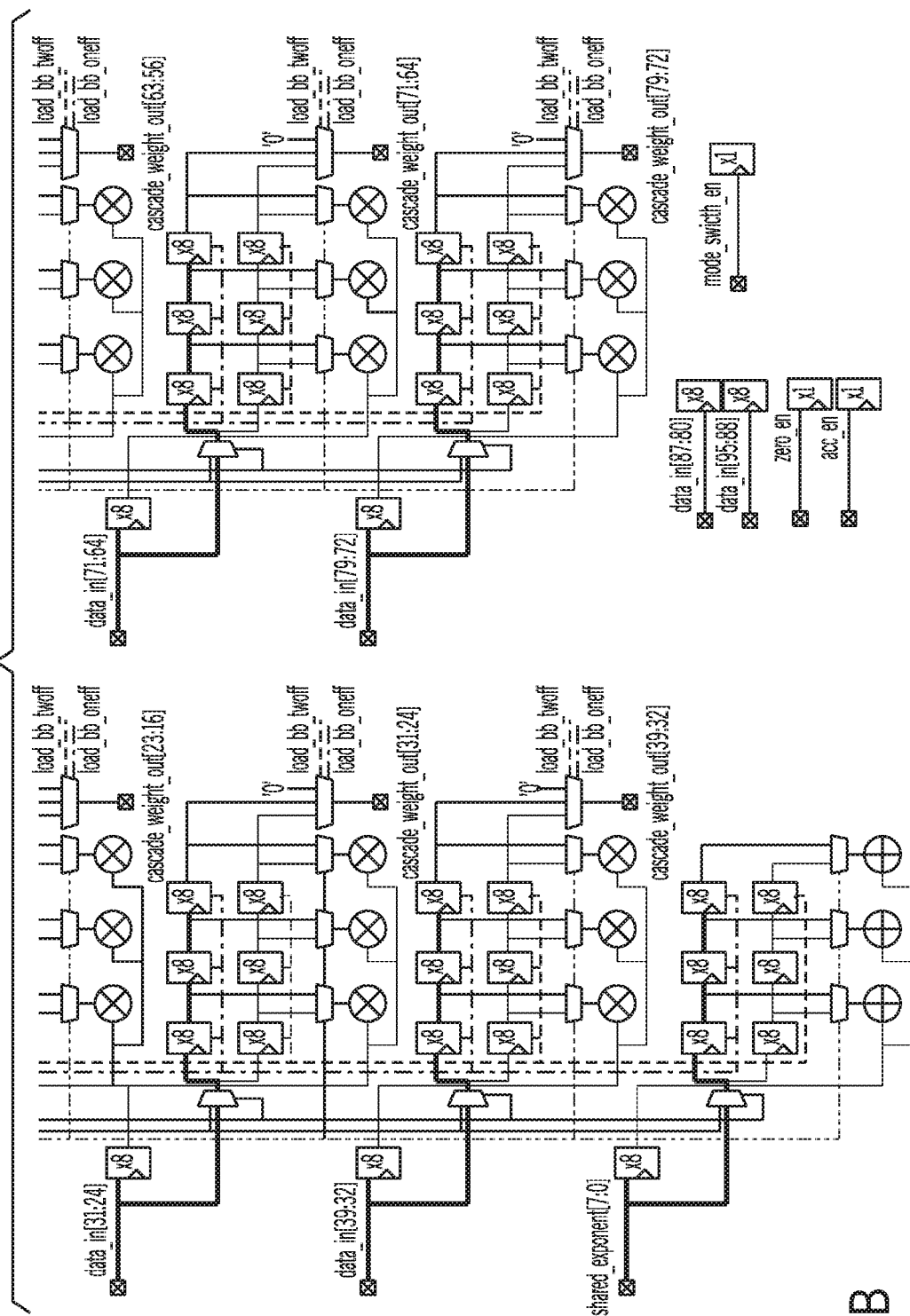

Continuing with the drawings, FIG. 5A and FIG. 5B are block diagrams that each illustrate a portion of a tensor processing block 150 that is included within the DSP block 26. The tensor processing block 150 includes circuitry that performs the process 70 described above with respect to FIG. 3, and the tensor processing block 150 is a hardware implementation of the virtual bandwidth expansion structure 100 depicted in FIG. 4. As illustrated, the tensor processing block 150 can receive data via inputs 152 that will be multiplied by the "weights" or "constants," which refer to values associated with the columns 102 discussed above. In other words, "weights" and "constants" are values that are stored in registers (e.g., associated with columns) that will be multiplied by other received data (e.g., data associated with the rows 106). The tensor processing block 150 may also include inputs 154 that receive shared exponent bits (e.g., a value of an input shared by the data that is multiplied the weights), inputs 156 that can receive weights from another DSP block 26 that is communicatively coupled to the DSP block 26 that includes that tensor processing block 150, and inputs 158 that can receive data from another DSP block 26 that is communicatively coupled to the DSP block 26 that includes that tensor processing block 150.

To help discuss various techniques for loading weights into the DSP block 26, FIGS. 6-14 are provided. In particular, values may be loaded into the DSP block 26 using three techniques. FIG. 6A and FIG. 6B illustrate a first technique: parallel weight loading. In parallel weight loading, the weights are loaded into registers as regular data inputs. For instance, as illustrated, two sets 170A, 170B of weight registers 172 may be provided, and both may be loaded (e.g., using one clock cycle per weight loaded). Because weights are loaded using the same inputs (e.g., ports) as inputs that will be used to receive values that will be multiplied by the weights (e.g., values stored in the weight registers 172), loading of the weights may occur before multiplication is performed. However, in the case of three columns of weights being loaded using a single set of the weight registers 172, three clock cycles would be used. If the weights are to be used for many calculations (e.g., dozens or hundreds or thousands or more), using parallel weight loading may be highly efficient. For instance, because the same values (i.e., the weights) can be multiplied by many values that are received without being changed, the DSP block 26 may determine products involving the weights for each determination that will involve the weights. For instance, in a matrix-matrix multiplication operation, the weights may correspond to values of a column of a matrix. Once the weights have been preloaded, the weights may be multiplied by each value of each row of another matrix with the values of the weights having only been inputted a single time.

As noted above, there are two sets 170A, 170B of weight registers 172. The sets 170A, 170B of weight registers 172 can be switched dynamically. For example, the DSP block 26 may instantly switch from set 170A of weight registers 172 to the set 170B in the middle of processing. For instance, after each partial product for a column, which corresponds to one set of weigh registers 172, has been calculated, the DSP block 26 may switch to another set of weight registers 172 to determine partial products involving another column of data. Another example of the weight registers 172 can be switched dynamically is alternating between sets of weight registers 172 in the middle of processing. Additionally, it should be noted that while FIG. 6A and FIG. 6B (in addition to FIG. 7A and FIG. 7B as well as FIG. 8A and FIG. 8B) include two sets 170A, 170B of weight registers 172, in other embodiments, fewer or more sets of weight registers 172 may be included.

Parallel weight loading will now be discussed in an example describing operations that can be performed during various clock cycles while the DSP block 26 is operating. In clock cycles 1 to 3, dynamic control bus feed_sel=2 'b00 to select the data_in[79:0] and shared_exponent[7:0] as the feed input source. Control bits load_bb_oneff=1 'b1 and load_bb_twoff=1 'b0 to preload the weights and their shared exponents into the first set 170A weight registers 172. Additionally, the bit load_buf_sellf=1 'b0.

From clock cycles 4 to 6, dynamic control bus feed_sel=2 'b00 is unchanged, but load_bb_oneff=1 'b0 and load_bb_twoff=1 'b1 to preload the weights and shared exponent into the second set 170B of weigh registers. The bit load_buf_sellf=1 'b0 is also unchanged.

From clock cycles 7 to N (depending on how many vectors are processed with the current weight set), the weights stored in the first set 170A of weight registers 172 are used in multiplication operations. Loading of the weight registers 172 is disabled by load_bb_oneff=1 'b0 and load_bb_twoff=1 'b0. Activation data and the shared exponent are fed in from data_in[79:0] and shared_exponent[7:0] respectively. The bit load_buf_sellf=1 'b0 is indicative of the first set 170A being utilized.

From clock cycle N+1 to 2N, loading is again disabled for the weight registers 172, but the bit load_buf_sellf=1 'b1 to select the second set 170B of weight registers 172. Thus, multiplication operations involving values stored in the second set 170B of weight registers 172 may be performed. From 2N+1 cycle, the DSP block 26 may begin to load new weights and shared exponents (e.g., as described above).

Figure 7A:
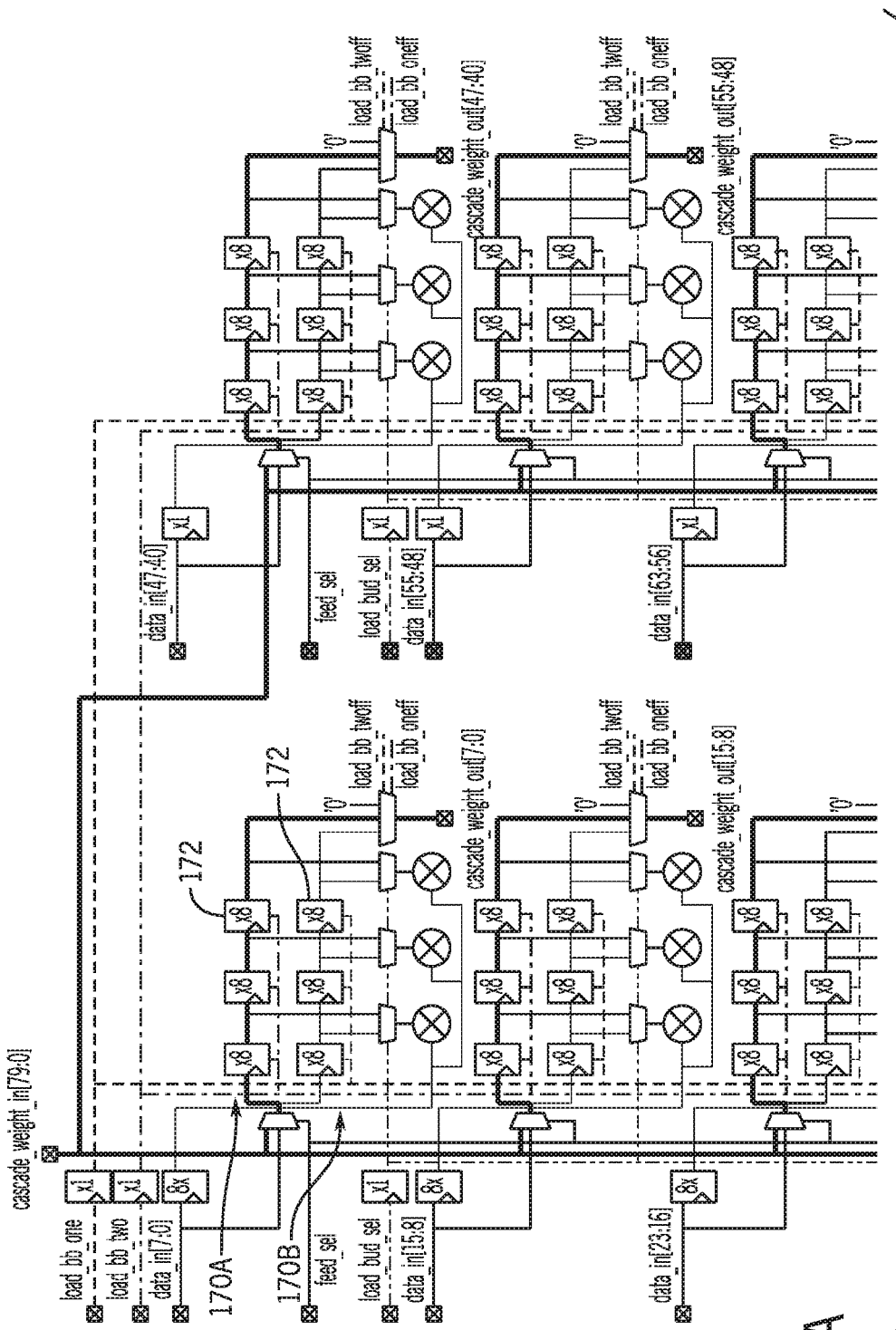
FIG. 7A and FIG. 7B illustrate cascade weight loading, in accordance with an embodiment of the present disclosure.
Figure 7B:
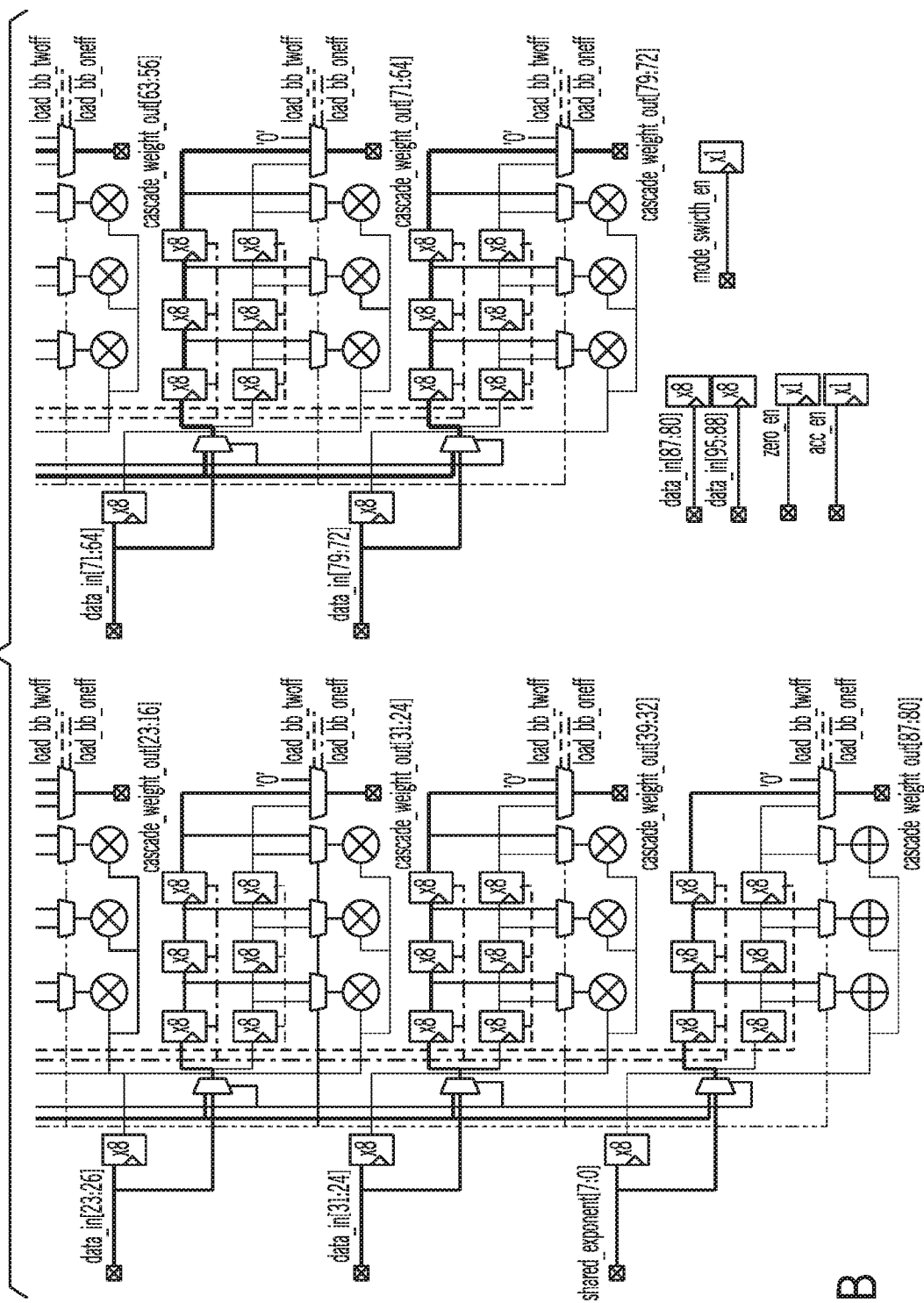
Figure 8A:
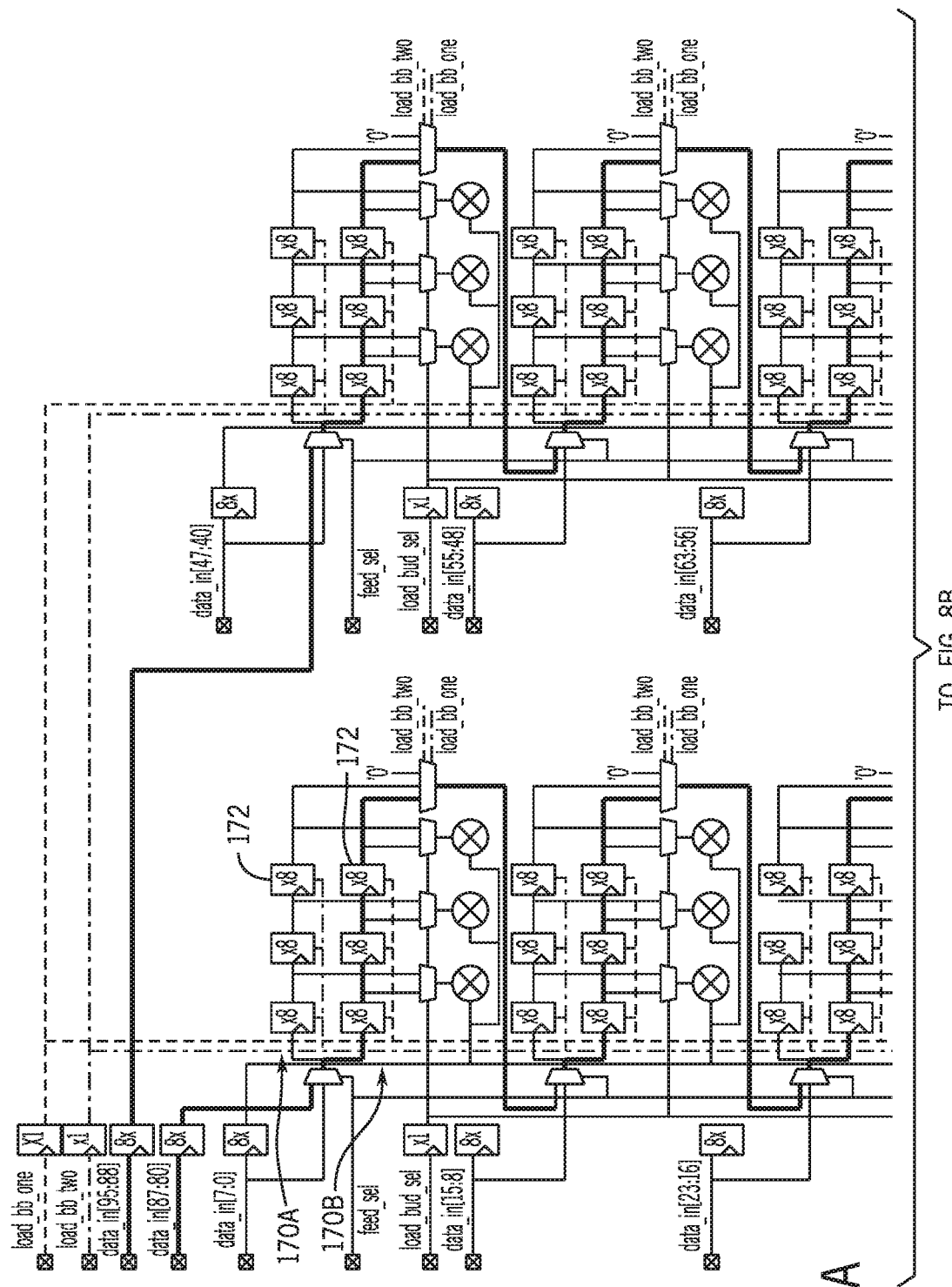
Figure 11:
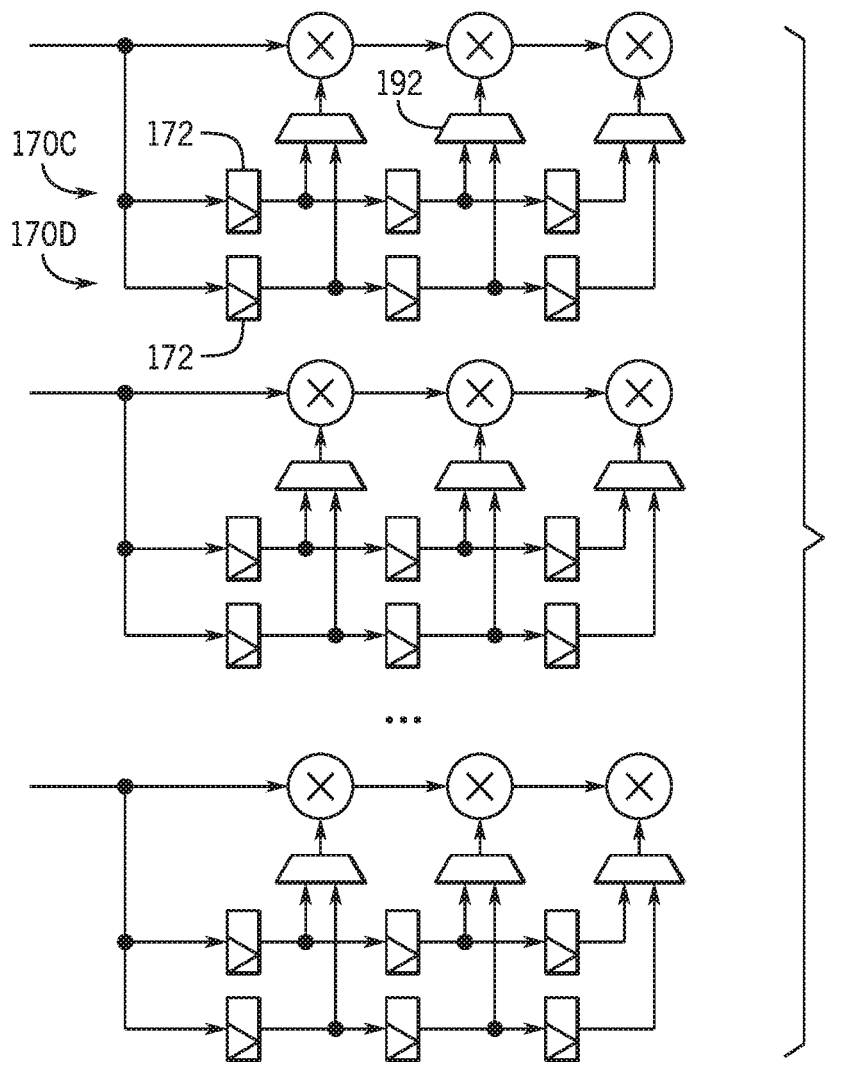
FIG. 11 illustrates weight loading with multiple sets of weights, in accordance with embodiments of the present disclosure.

Another technique that the DSP block 26 may employ to load weights is illustrated in FIG. 7A and FIG. 7B, which show block diagrams of portions of the DSP block 26. This second technique is called "cascade weight loading." In cascade weight loading, weights can be provided to a first DSP block 26 that provides the weight values to other DSP blocks 26 that are communicatively coupled to the DSP block 26. The values for the weights may be sent (e.g., via outputs 180 of FIG. 5A) from one DSP block 26 to another DSP block 26, which may receive the values via "cascade_weight_in" illustrated in FIG. 7A, which corresponds to the inputs 156 of FIG. 5A.

Each DSP block 26 in the cascade chain may use one to three clock cycles to load its weights depending on how many columns will be utilized (e.g., one clock cycle for one column, two clock cycles for two columns, three clock cycles for three columns). Additionally, the weight buffer can be selected externally.

When using cascade weight loading, the weights can be loaded while processing is occurring. In other words, while a DSP block 26 is setting weight values (e.g., values of the weight registers 172), multiplication may be performed on incoming data and weights.

As an example of timing when performing cascade weight loading, the first DSP block in the cascade chain is configured as the weights feeder, meaning the DSP block 26 will cascade the values of the weight to another DSP block 26 in a chain of DSP blocks 26. From clock cycle 1 to 3N, dynamic control bus feed_sel=2 'b00 to select the data_in [79:0] and shared_exponent[7:0] as the feed input source. Control bits load_bb_oneff=1 'b1 and load_bb_twoff=1 'b0 to preload the weights and their shared exponents into the first set 170A of weight register 172. Additionally, the bit load_buf_sellf=1 'b0.

Other DSP blocks 26 of the cascade chain are configured as the computation engines. From cycles 4 to ~3N, the dynamic control bus feed_sel=2 'b01 to select cascade_weight_in[87:0] as the feed input source. The control bus load_bb_oneff=1 'b1 and load_bb_twoff=1 'b0 preload the weights and their shared exponents to the first set 170A of the weight registers 172. The bit load_buf_sellf=1 'b0. After ~3N cycles, the weights of the entire cascade chain have been loaded.

From cycles ~3N+1 to ~6N cycles, the activation data and their shared exponents are fed in from data_in[79:0] and shared_exponent[7:0] respectively. The dynamic signal load_buf_sellf=1 'b0, and the weight registers 172 of the first set 170A are used (e.g., for the dot product computations). Moreover, feed_sel=2 'b01 again to select cascade_weight_in[87:0] as the feed input source. The bits load_bb_oneff=1 'b0 and load_bb_twoff=1 'b1 to preload the weights and their shared exponents into the second set 170B of weight registers 172. This is performed while the first set 170A of weight registers 172 is being utilized in multiplication operations (e.g., dot product computations). Additionally, the bit load_buf_sellf=1 'b0 remains unchanged.

From 6N+1 to 9N cycle, the activation data and their shared exponents are fed in from data_in[79:0] and shared_exponent[7:0] respectively. The dynamic signal load_buf_sellf=1 'b1, and the weights from the second set 170B of weight registers 172 are used for the dot product computations. From ~6N+1 to 9N cycles, the procedure may restart (e.g., revert back to the operations described above starting at cycle 1.)

Continuing with the drawings and the discussion of weight loading, a third type of weight loading is "port weight loading," which is illustrated in FIG. 8. In particular, port weight loading utilizes data ports separate from the data ports used to load other data values into the DSP block 26. Such data ports may be included in the inputs 152 of FIG.

5A (e.g., sixteen bits of the ninety-six "data_in" bits). For example, the DSP block 26 may include an eighty-bit wide port that receives data that will be multiplied by the weights, an eight-bit wide port that receives the shared exponent of this data, and a sixteen-bit wide port that can receive sixteen bits of weight data that is used to load weights. The weight data that is streamed via the weight ports may be streamed separately from the other data types. Additionally, multiplication operations may occur while port weight loading occurs. For example, in embodiments with multiple sets of weights registers 172, multiplication operations involving one set of weight registers 172 may be performed while weights are loaded into the weight registers 172 of another set of weight registers 172.

Depending on the width of the port compared to the width of each register, the weight registers can be divided into multiple regions. For instance, in the illustrated embodiment, the port is sixteen bits wide, and the weight registers 172 are eight bits wide. The columns having ten weight registers may be divided into two columns that each have five weight registers 1 and that can be loaded simultaneously.

An example of port weight loading will now be discussed. From 1 to 18 clock cycles, the dynamic control bus is set to feed_sel=2 'b10 to select data_in[87:80] and data_in[95:88] as the feed input source. The control bits load_bb_oneff=1 'b1 and load_bb_twoff=1 'b0 preload the weights and their shared exponents to the first set 170A of weight registers 172. Also, the bit load_buf_selff=1 'b0.

From 19 to ~N cycles, the activation data and their shared exponents are fed in from data_in[79:0] and shared_exponent[7:0] respectively. Loading is disabled by load_buf_selff=1 'b0. The previously loaded weights in the first set 170A of weight registers 172 are used for the dot product computations. From 19 to 36 cycles (simultaneously with operations taking place from 19 to ~N cycles), the control bus feed_sel=2 'b10 to select data_in[87:80] and data_in[95:88] as the feed input source. The control bus load_bb_oneff=1 'b0 and load_bb_twoff=1 'b1 preload weights and their shared exponents into the second set 170B of weight buffers 172. The control bit load_buf_selff=1 'b0, as the first set of loaded weights is still in use.

From ~N+1 to ~2N+1 cycles, the activation data and their shared exponents are fed in from data_in[79:0] and shared_exponent[7:0] The control bit load_buf_selff=1 'b1, so that the weights from the second set 170B of weight registers 172 are used for the dot product computations. From ~N+1 to ~N+18 cycles, the procedure can return to perform the operations described above at clock cycle 1 so that new weights can be loaded into the first set 170A of weight buffers 172.

To help further illustrate weight loading, FIGS. 9-18 are provided. FIG. 9 illustrates a logical flow of the parallel load method. Weights share the same bus as the data (e.g., data provided to register 190 to be multiplied by values stored in weight registers 172). The multiple sets of weights each correspond to an independent column. The columns are streamed in and shifted across. As noted above, while three columns 102 of weight registers 172 are included in the illustrated, other numbers of columns 102 (e.g., fewer than three columns or more than three columns) may be included in other embodiments. Additionally, in some cases, only a portion of the weight registers (e.g., a portion of the columns) may be used. As noted above, it may take one clock cycle to load the weights for each column 102. When columns 102 are not used, such columns 102 can be loaded with zeros or ignored. Additionally or alternatively, a column wide or block wide reset can be used to clear all or unwanted columns without requiring a load of zeros into the weight registers 172 of columns 102 that are not utilized.

FIG. 10 illustrates another approach to parallel weight loading. More specifically, in cases in which enough input pins are available, the weight registers 172 can be loaded directly without sharing an input port with the data. This may simplify the control and multiplexing in soft logic of the integrated circuit device 12 prior to the data being provided to the weight registers 172 of the DSP block 26.

Figure 12:
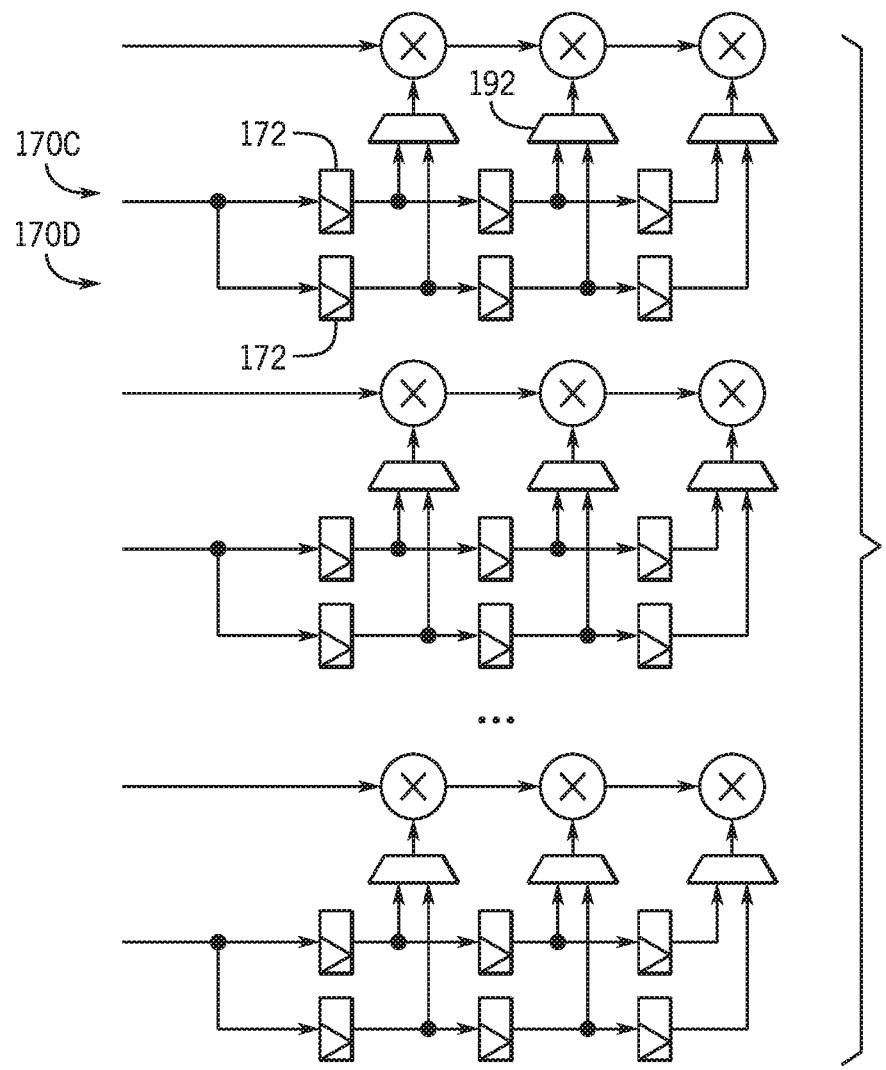
FIG. 12 illustrates weight loading with multiple sets of weights, in accordance with embodiments of the present disclosure.
Figure 13:
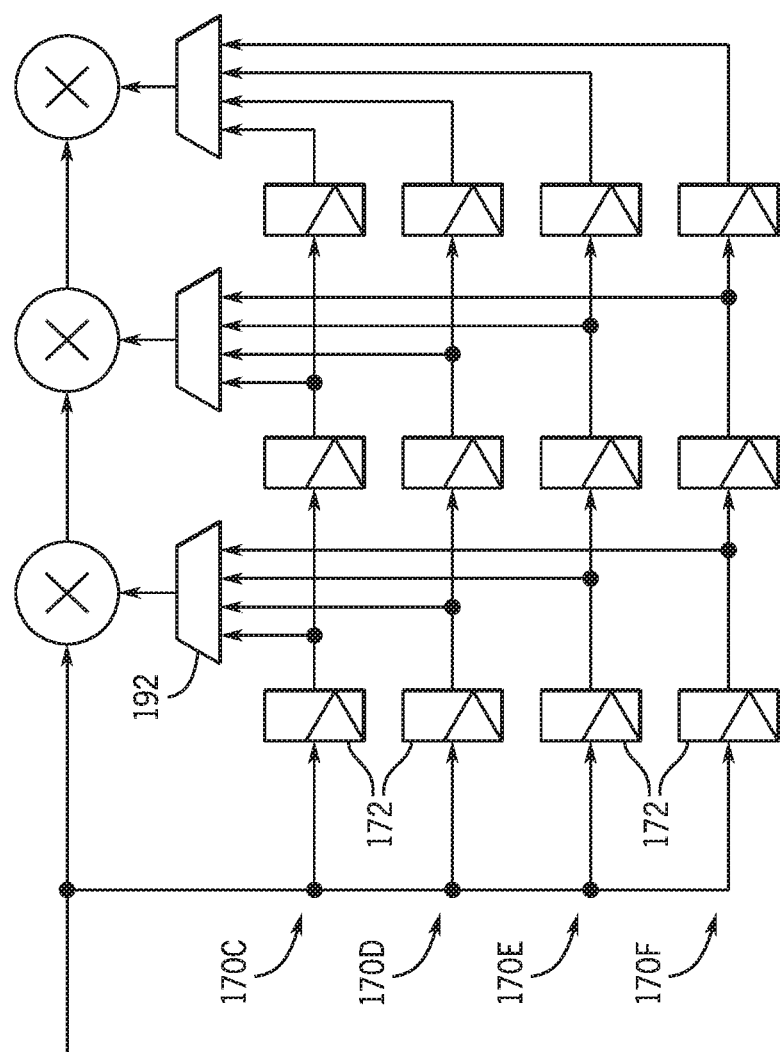
FIG. 13 illustrates weight loading with multiple sets of weights, in accordance with embodiments of the present disclosure.

As shown FIGS. 11-14, multiple sets 170 of weights can also be supported. The sets 170 of weights can be loaded at different times or loaded together. For example, before performing multiplication operations, data values may be loaded into the weight registers 172 of the sets 170 or a portion thereof. When weights are loaded together, the weights can be alternated on a clock cycle by clock cycle basis so that multiplication operations involving both sets of weights can be performed. Additionally, when performing multiplication operations, multiplexers 192 select which set 170 will be used to provide an input that will be multiplied. Similar to FIG. 10, FIG. 12 illustrates an alternative approach to parallel weight loading in which independent ports are utilized. Furthermore, while FIG. 13 illustrates that the loading port is shared with the data port, an independent load port can also be used, for instance, as shown in FIG. 12. The register loaded can be controlled with individual load ports, or a load set address port. For the four sets 170 (i.e., sets 170C-170F) illustrated in FIG. 13, a two-bit address may be used. In embodiments having more sets 170 of weights, larger addresses may be used (e.g., a three-bit address for embodiments having five, six, seven, or eight sets 170).

Figure 14:
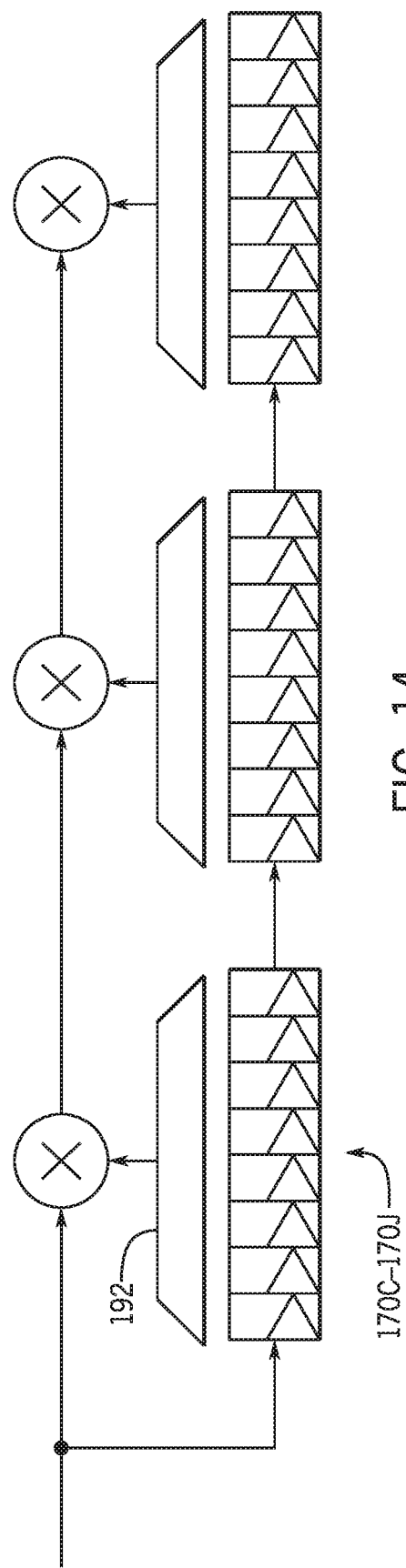
FIG. 14 illustrates weight loading with multiple sets of weights, in accordance with embodiments of the present disclosure.

FIG. 14 illustrates an approach in which eight sets 170 of weights are utilized. Using the illustrated approach may reduce wiring loads for deep submicron implementations. In this case, an address counter could also be used to cycle through the weight sets on a clock cycle by clock cycle basis. This might be applicable to cases such as small 2D matrixes.

Figure 15:
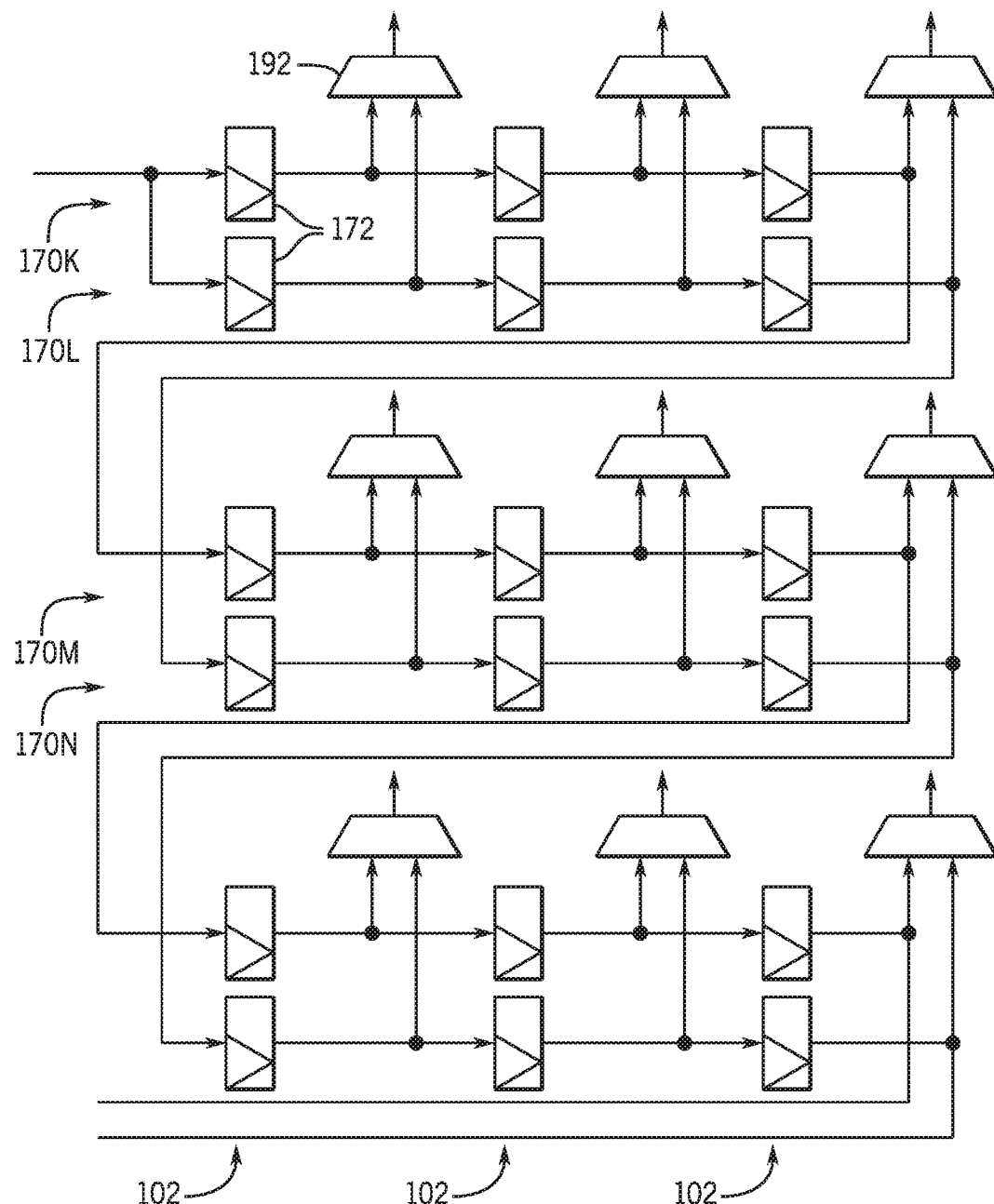
FIG. 15 illustrates loading weights into weight registers, in accordance with an embodiment of the present disclosure.

If the ports used to load the weights are not as wide as the first set of registers they meet, a number of different methods can be used to access the registers 172. As illustrated in FIG. 15, data can be streamed across the columns 102, and then into the following row 170. In some cases, even if only a portion of the columns 102 are utilized, each column 102 may still be loaded (e.g., with values of zero in weight registers 172 of columns 102 that will not be used).

Figure 16:
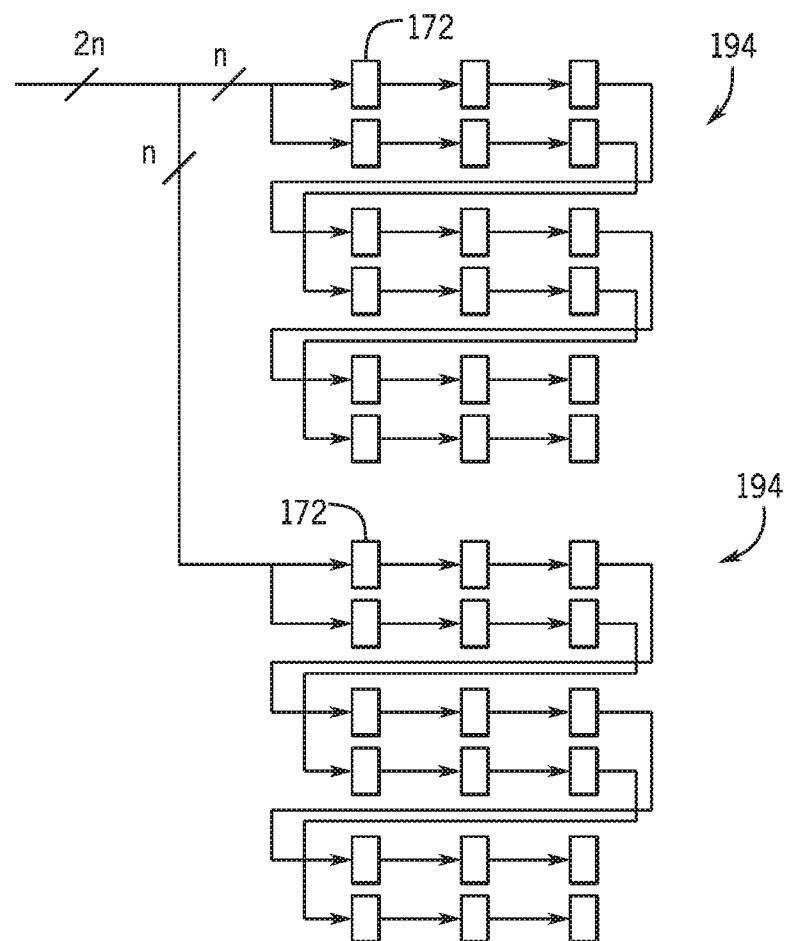
FIG. 16 illustrates weight loading when a data port that provides weights is wider than weight registers, in accordance with an embodiment of the present disclosure.

FIG. 16 illustrates that if the port width (e.g., 2n bits) is greater than the register width (e.g., n bits), the port can be used to load multiple groups 194 of registers. In the illustrated embodiment, the registers 172 are loaded sequentially as described above with respect to FIG. 12, but the groups 194 are loaded in parallel. In other words, multiple groups 194 of weights can be loaded simultaneously.

In other embodiments, weights may be provided to specific weight registers 172, for example, using addressing. For instance, in FIG. 17, an address decoder 196 may receive addresses (e.g., row addresses), converts the address to an enable bit to load data to a single row 170 or weight registers 172. The weight registers 172 of each row 170 can be loaded sequentially. Additionally, in cases in which the data port is wider than the registers, the structure illustrated in FIG. 17 can be replicated in parallel, similar to the structure illustrated in FIG. 16.

Figure 17:
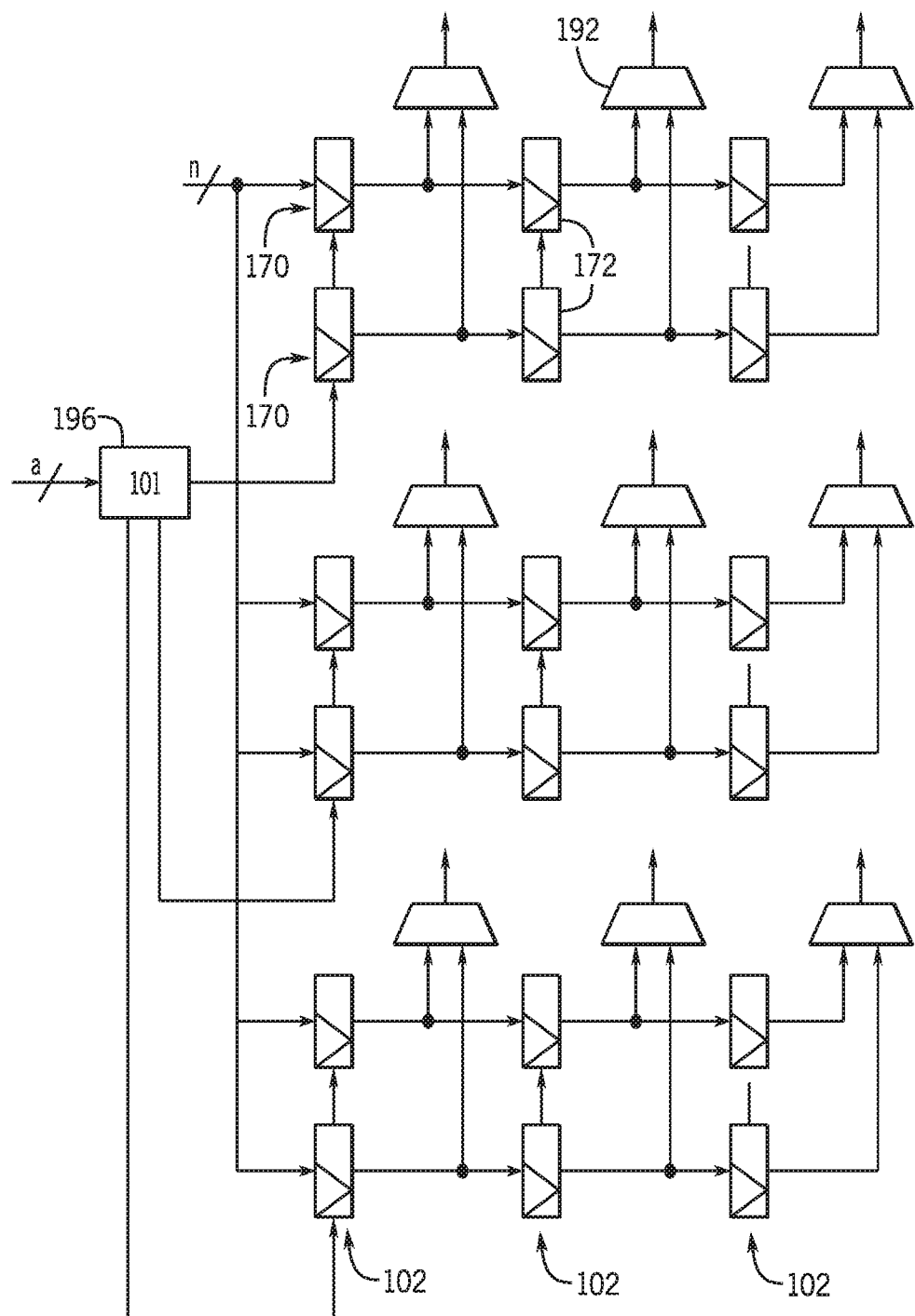
FIG. 17 illustrates a block diagram of weight registers that can receive inputs based on addressing, in accordance with an embodiment of the present disclosure.

By using the structure illustrated in FIG. 17, each row 170 can be loaded independently. For example, a subset of rows 170 may be changed this can be done without reloading data throughout each of the illustrated weight registers 172. If only one column or a subset of columns is used, weights can be loaded without streaming data through columns that may not be used. This may save both area and power. Once data has been loaded, multiplexers 192 may be utilized to provide particular data (e.g., data from a particular set of weight registers 172) to be multiplied.

Figure 18:
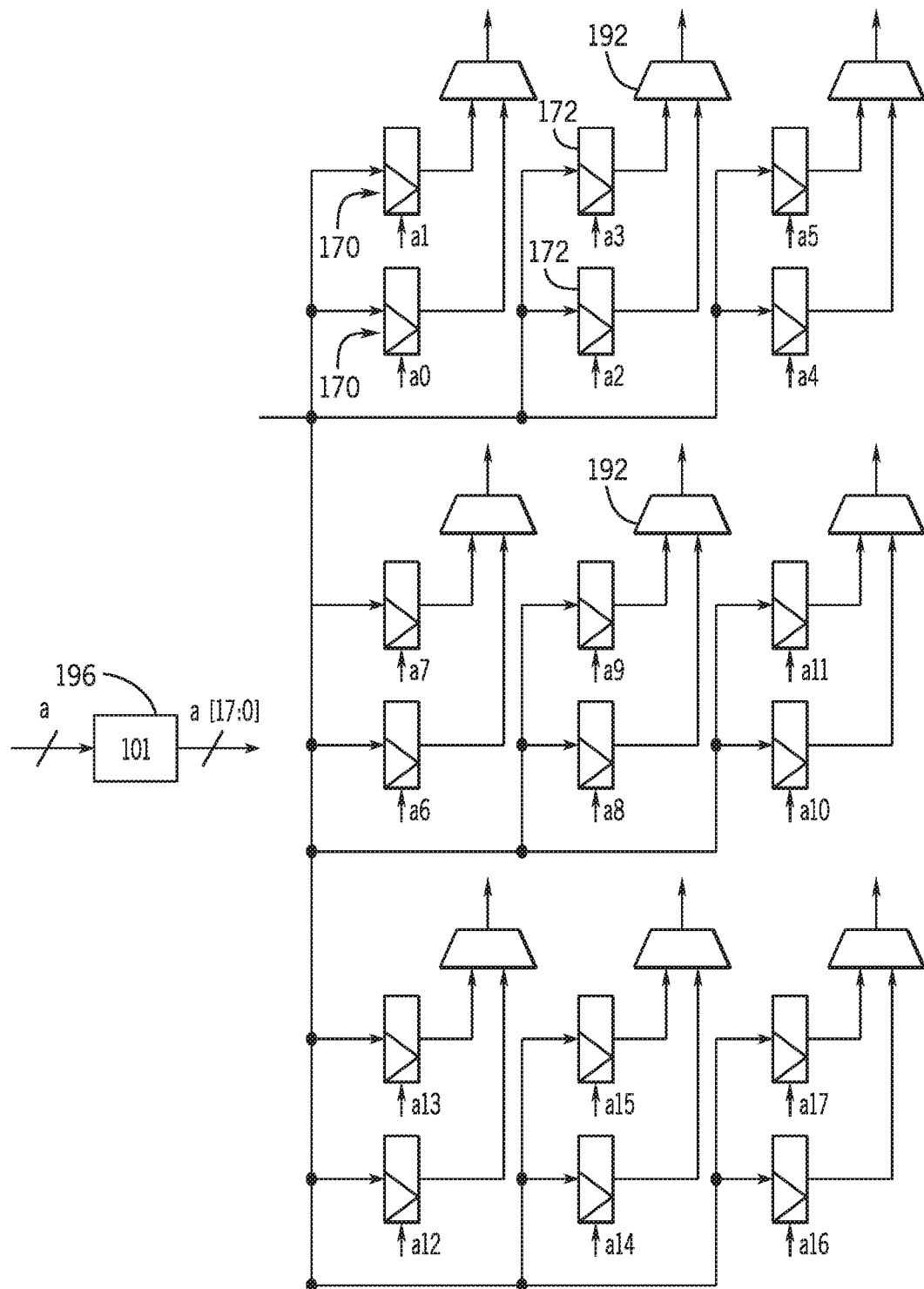
FIG. 18 is a block diagram illustrating independently addressed weight registers, in accordance with an embodiment of the present disclosure.

As illustrated in FIG. 18, the technique described above with respect to FIG. 17 can be expanded to address weight registers 172 independently. In other words, rather than sending weights to be loaded to a row 170 of weight registers 172, the address decoder 196 may provide weights to a specific weight registers 172 rather than a particular row of weight registers 172.

Moreover, multiple registers for any row can be loaded in parallel. This can be done by the address decoder 196 in embodiments illustrated in FIGS. 17 and 18 or, when using sequential loading (e.g., embodiments illustrated in FIGS. 15 and 16), by enabling load controls in parallel (e.g., load_bb_oneff and load_bb_two_ff in FIGS. 6-8). This may be useful in certain cases, such as were different weight sets are similar, but offset to each other. This is shown below in Tables 1 and 2. In Table 1, both sets of weight registers 172 are loaded with the same data (e.g., weight values W0, W1, and W2) in parallel. In Table 2, the second set is offset from the first by one new weight value W3.

TABLE 1

Initial Parallel Load

| Column 1 | Column 2 | Column 3 |
|---|---|---|
| W2 | W1 | W0 |
| W2 | W1 | W0 |

TABLE 2

Offset Parallel Load

| Column 1 | Column 2 | Column 3 |
|---|---|---|
| W2 | W1 | W0 |
| W3 | W2 | W1 |

Figure 19:
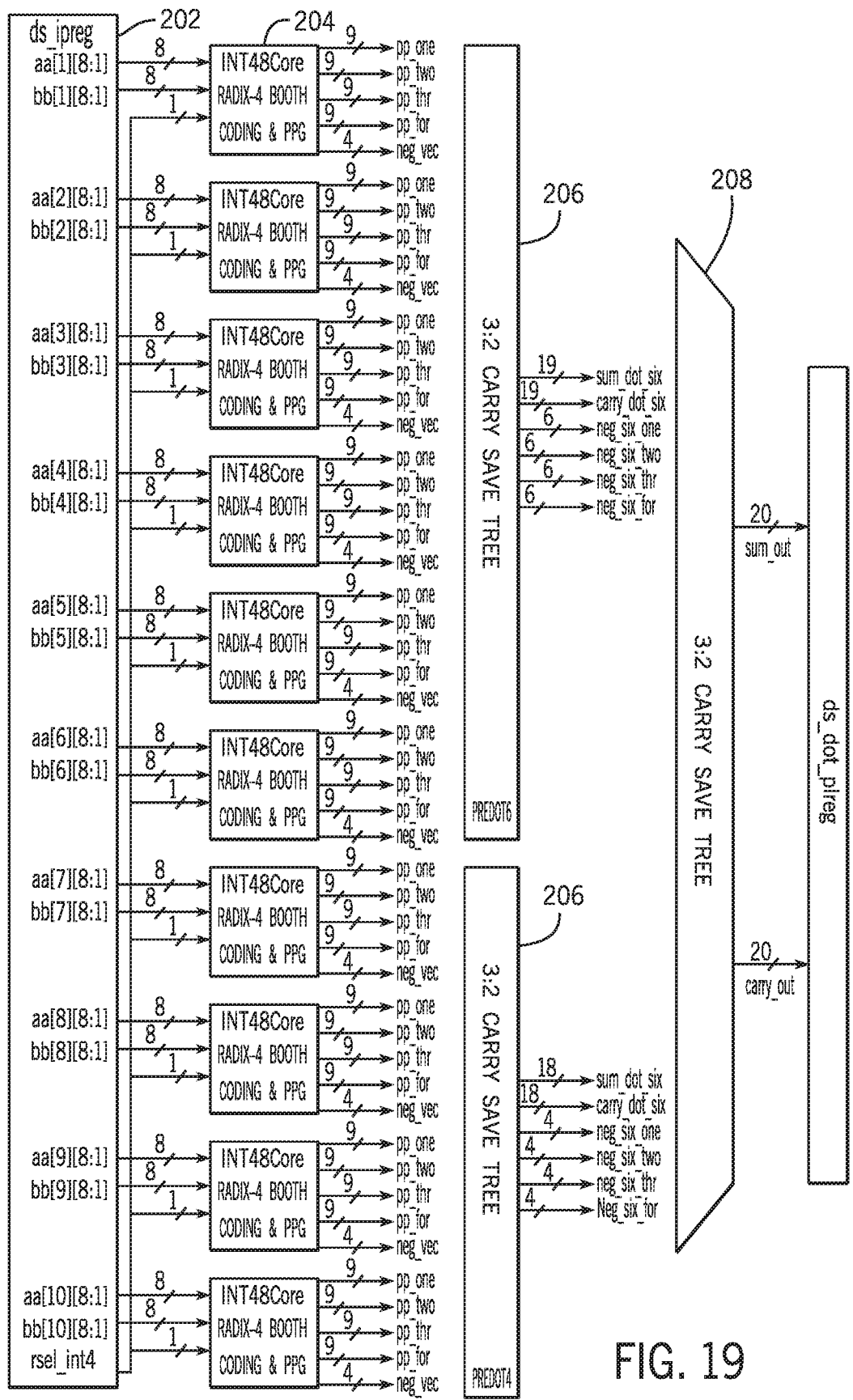
FIG. 19 is a block diagram of a stage of the tensor processing block of FIG. 5A and FIG. 5B, in accordance with an embodiment of the present disclosure.

Returning briefly to FIG. 5A and FIG. 5B, the weights (e.g., column values) may be multiplied by incoming data (e.g., row values) by the multiplier blocks 200, which may include several multipliers (e.g., four or six multipliers) that generate partial products. For instance, FIG. 19 is a block diagram of a portion of FIG. 5A showing a first stage of circuitry that may be included in the DSP block 26 and used to determine the partial products for a particular column. As illustrated, circuitry 202 may provide inputs to multipliers 204, which may determine partial products by multiplying the inputs by other values (e.g., weights). In the illustrated example, partial products from ten INT8 multipliers (e.g., multipliers 204) are summed. More specifically, four partial products generated by each multiplier 204 are then compressed by a series of 3-2 compressors (e.g., adders 206 and multiplexer 208 that may be included in compression circuitry 210 of FIG. 5A). In other embodiments, other types of compression or compression circuitry may be utilized (e.g., 4-2 compressors). The circuitry 202 may include registers and wires that enable data from the inputs 152, 154 to be provided to the multipliers 204, thereby enabling many inputs to be routed as desired to perform various determinations (e.g., multiplication operations). Thus, the circuitry 202 enables the virtual bandwidth expansion structure 100 to be implemented.

Returning to FIG. 5A and FIG. 5B, compressed data (e.g., redundant vectors) may be summed by adders 220 (e.g., carry-propagate adders) to generate a single number output. A fixed-point to floating-point conversion circuit 222 may convert the output of the adder 220 into a floating point value. For example, the fixed-point to floating-point conversion circuit 222 may convert a twenty-bit dot product result determined by the adder 220 into a single-precision (e.g., FP32) value using the shared exponents values that the fixed-point to floating-point conversion circuit 222 receives.

The tensor processing block 150 also includes FP32 adders 240 (e.g., single-precision floating-point adders). In other embodiments, floating-point adders having other levels of precision may be utilized. The FP32 adder 240 can be used as a cascade summation operation or an accumulator for each column of data. That is, the FP32 adder 240 may receive values from another DSP block 26 and add the received values to values generated by the fixed-point to floating-point conversion circuit 222 to generate another value (e.g., a single-precision floating-point value). The FP32 adder 240 may also output another value, such as a bfloat24 floating-point value indicative of the product of a multiplication operation performed by the DSP block 26. Additionally, it should be noted that registers (e.g., pipeline stages) may be inserted at a number of places in the datapath to provide the used area/frequency tradeoff.

Figure 20:
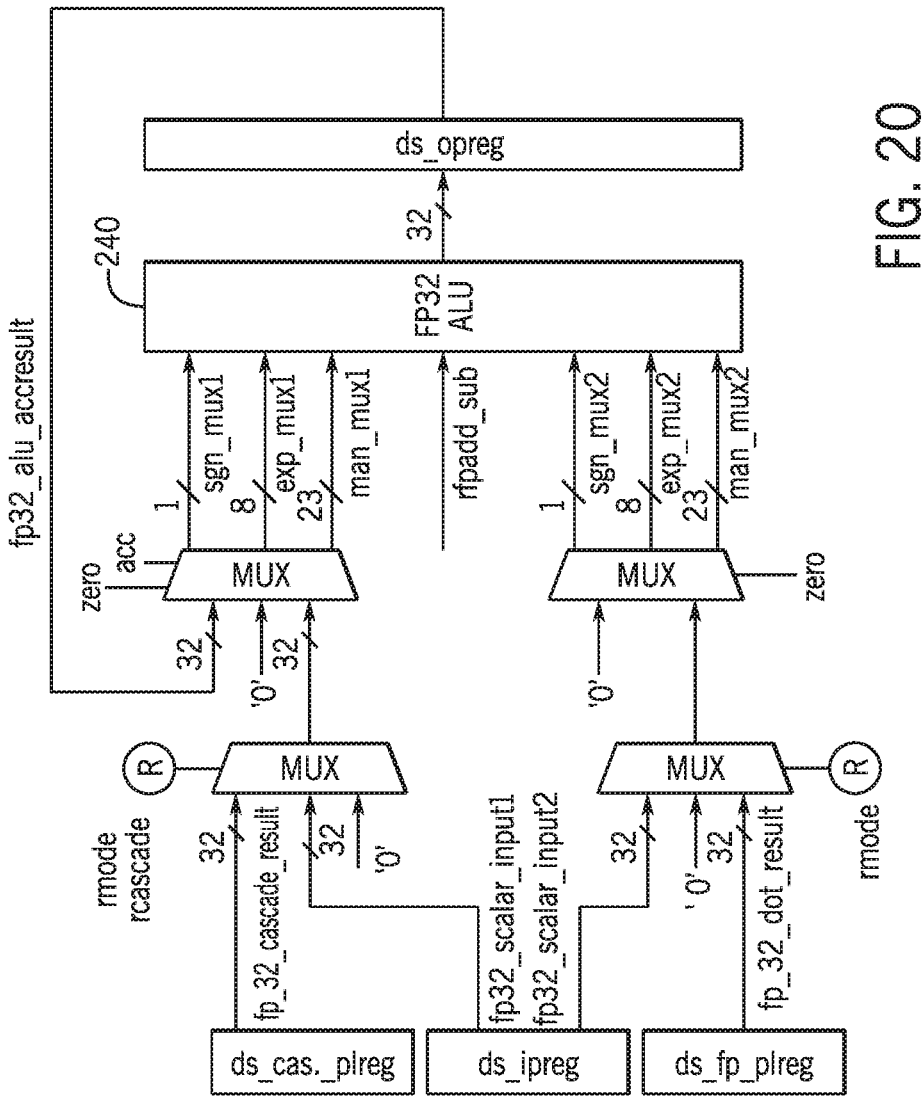
FIG. 20 is a block diagram of another stage of the tensor processing block of FIG. 5A and FIG. 5B, in accordance with an embodiment of the present disclosure.

The DSP block 26 (and tensor processing block 150) may function in several different modes. As discussed in more detail below, these modes include a tensor mode, a vector mode, and a scalar mode. To help explain, FIG. 20 is a block diagram of another stage of the tensor processing block 150 (e.g., "ds_stage3" of FIG. 5B). In each of the modes, inputs may be multiplexed based on the mode of operation to control which data the FP32 adder 240 receives. For example, the FP32 adder 240 can receive a cascade input (i.e., the output from another DSP block 26 communicatively coupled to the DSP block 26), an input directly from the input of the DSP block 26 (e.g., when operating in a scalar mode), or from the (registered) output of the FP32 adder 240 as a first input when the FP32 adder 240 is used as an accumulator. The FP32 adder 240 may accept data from the dot product or directly from the input of the DSP block 26 (e.g., when operating in the scalar mode). Additionally, the inputs to the FP32 adder 240 can also be zeroed, which can be used to reset the FP32 adder 240 (e.g., when functioning as an accumulator).

Bearing this in mind, the tensor mode of operation will now be discussed. In the tensor mode, each of the columns of weight registers may be active with pre-loaded weights. Generally, this mode may be used with a number of DSP blocks 26 cascaded, meaning the subsequent DSP blocks 26 may perform a fixed or floating point addition operation on values received from a previous DSP block 26, and the last DSP block 26 (or two) in a cascade chain is used as a tensor accumulator. As discussed below, the tensor mode of operation may be utilized to add floating-point or fixed-point values.

Figure 21:
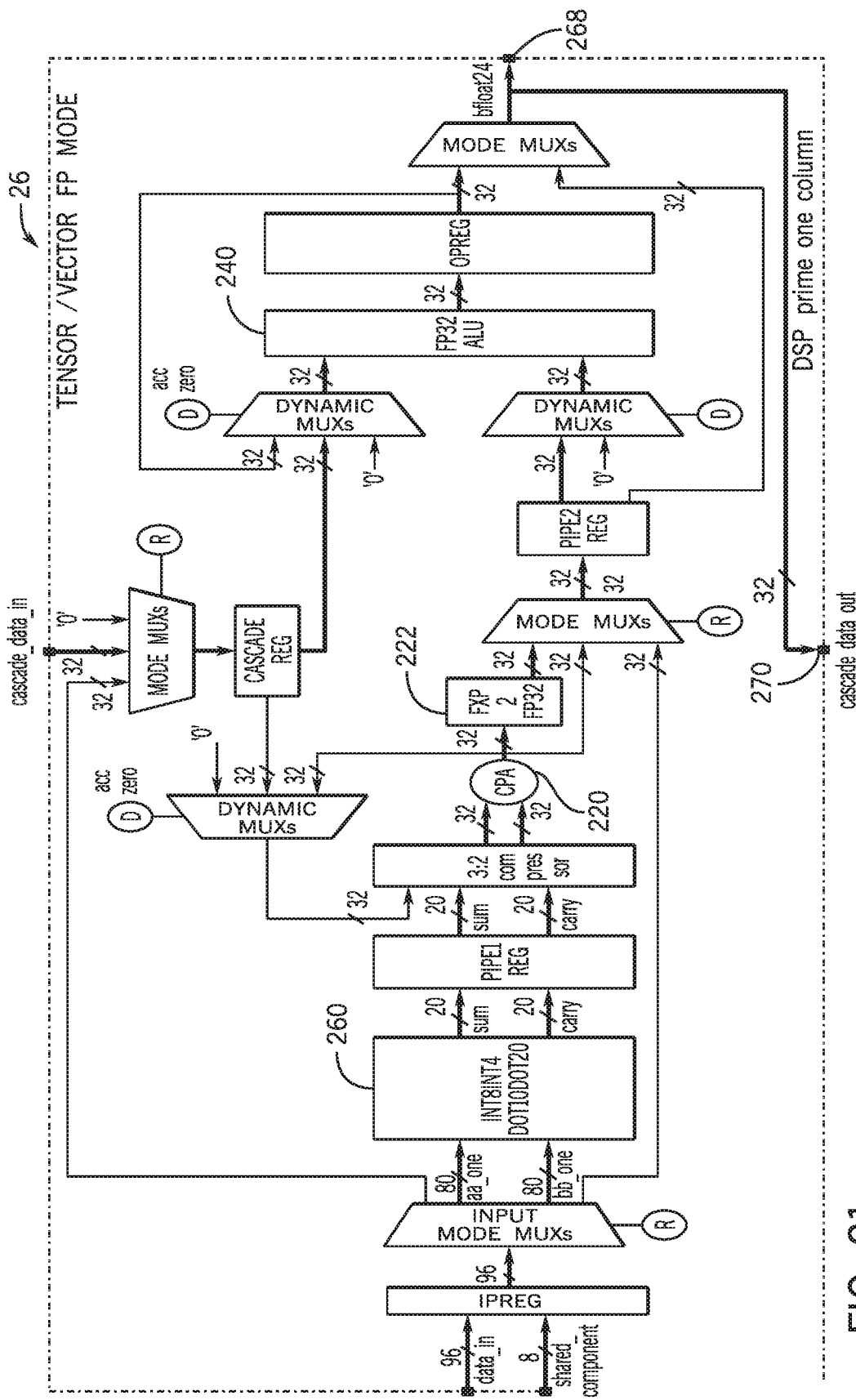
FIG. 21 is a block diagram of a DSP block when used in floating-point tensor mode, in accordance with an embodiment of the present disclosure.

FIG. 21 is a block diagram of the DSP block 26 when used in floating-point tensor mode, with three columns of 80-bit weights and 8-bit shared exponents first preloaded (e.g., as described above). The activations are then fed in from data_in[79:0] such that each column of weights receive the same activations at the same time. Three DOT engines (represented by block 260) start to calculate signed 20-bit fixed-point DOT products simultaneously. The output of each DOT product is converted to 32-bit floating-point operands, as discussed above, and adjusted by a shared_exponent[7:0]. These three FP32 values are then either added to their respective FP32 values from the cascade data_in [95:0] bus, or the previous cycle's accumulation value, by FP32 adder 240. The outputs of the FP32 adder 240 can either be sent out to the fabric (e.g., in a bfloat24 data format via outputs 268) or cascaded to the next DSP block 26 in the chain via outputs 270.

Figure 22:
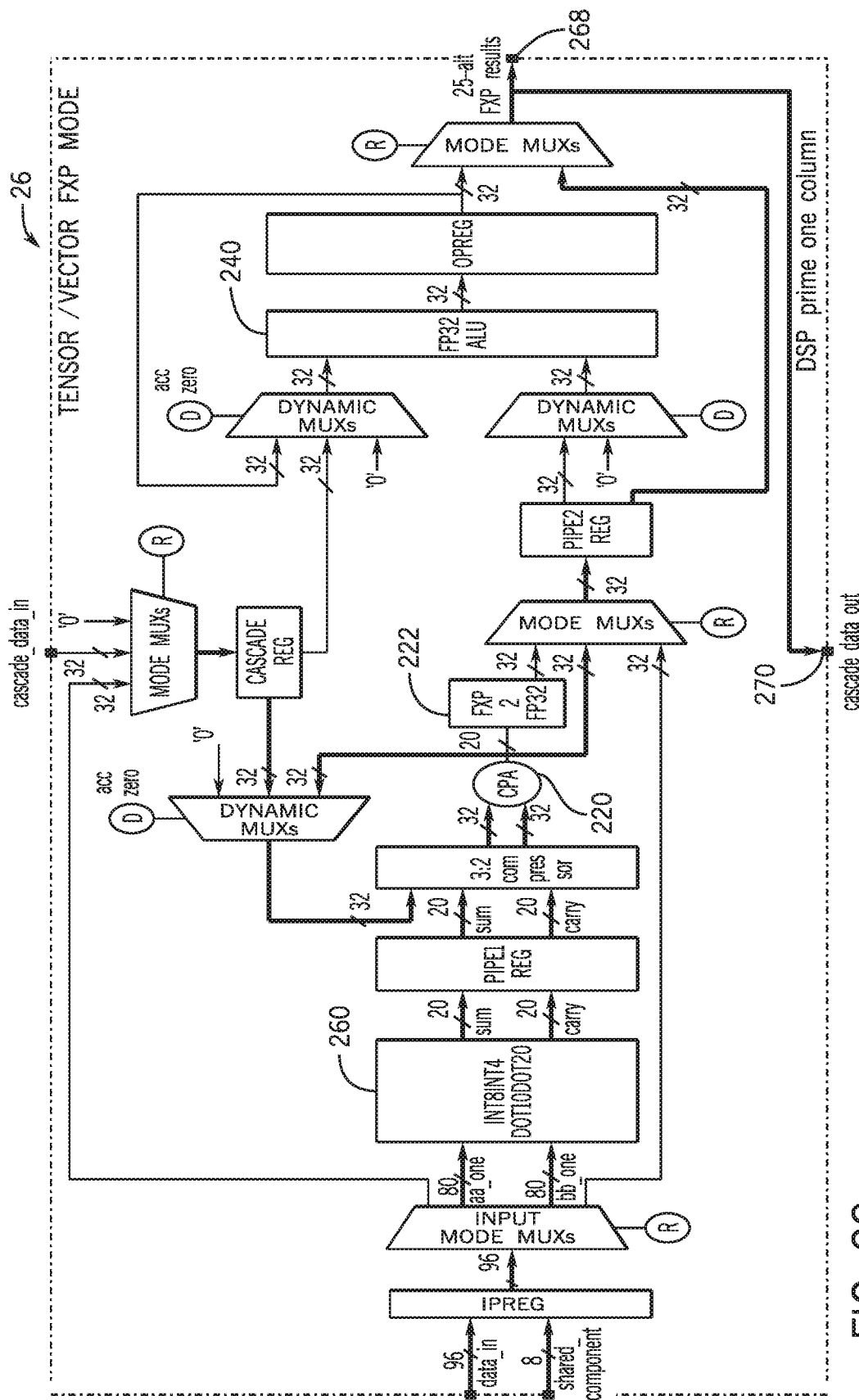
FIG. 22 is a block diagram of a DSP block when used in fixed-point tensor mode, in accordance with an embodiment of the present disclosure.

FIG. 22 is a block diagram of the DSP block 26 when used in fixed-point tensor mode. Similar to the fixed-point tensor mode, three columns of 80-bit weights are first preloaded. The activations are then fed in from data_in[79:0] and the three DOT engines (represented by block 260) start to calculate the signed 20-bit fixed-point DOT products simultaneously. The output of each DOT product is then either added to their respective 32-bit fixed-point values from the cascade_data_in[95:0] bus, or the previous cycle's accumulation value, by adder 220 (e.g., in combination with 3-2 compressor). The outputs of the adder 220 can either be sent out to the fabric in a (25-bit) fixed-point data format or cascaded to the next DSP block 26 in the chain via cascade_data_out[95:0].

Continuing with the discussion of the modes of operation, vector mode is similar to tensor mode except that only a single column of weight registers is active, and both inputs come from outside of the DSP block 26. In other words, weights may not be preloaded as with the tensor mode of operation. Because the number of inputs may be limited while operating in the vector mode, only half of the column may be used. For example, if each column has ten multipliers, the vector mode of operation may utilize five of the multipliers because the weights are directly input. In other words, the weights, when operating in vector mode, will be taken from the pins normally used for the data input of the multipliers not being used in this mode. The multipliers are summed and flow through the fixed-point to floating point conversion circuitry 222, and then into the FP32 adder 240. FIGS. 21 and 22, in addition to illustrating operation of the DSP block 26 in tensor mode, also illustrate operation of the DSP block 26 when operating in vector mode.

Returning briefly to FIG. 5A and FIG. 5B, the scalar mode of operation isolates either one multiplier per column or only the FP32 adder 240. In other words, when operating in scalar mode, a single row of weight registers may be utilized, for example, when performing multiplication operations. Alternatively, the scalar mode may be used to utilize the FP32 adders 240. Therefore, either three INT8 values (i.e., 8-bit fixed-point values) or up to 3 floating-point adders can be supported. When utilizing bfloat16 values, three adders are available. Two adders are available when using bfloat24 values, and one adder is available when using FP32 values. The number of adders that can be utilized depends on the precision of the values to be added due to the amount of input/output wires available to send and receive the values.

As noted above, the DSP blocks 26 may be used in a cascade chain, where one a value for a column determined by a DSP block 26 is added to an output received from a previous DSP block 26 in the cascade chain. The last block of the chain may be configured as an accumulator block, for example, when multiplication operations involving relatively large matrices are performed by blocking the DSP blocks 26.

Figure 23:
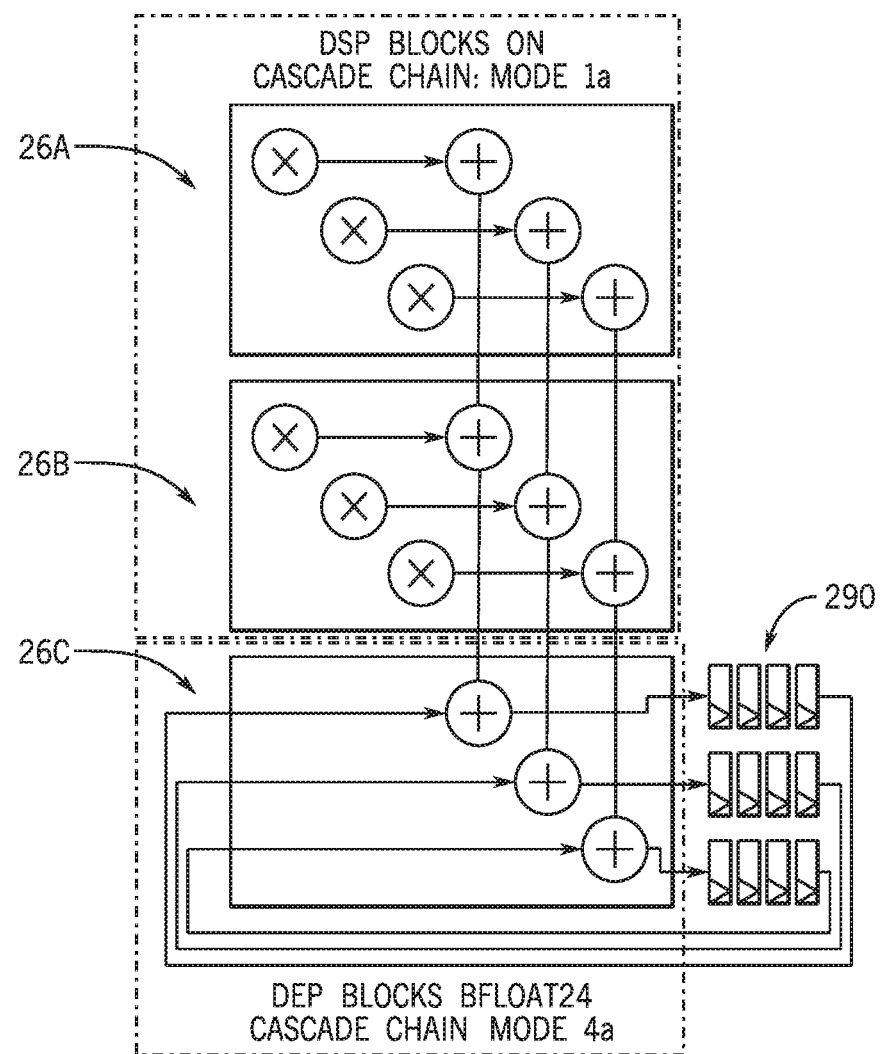
FIG. 23 illustrates a dataflow into and through a last DSP block of a chain of DSP blocks, in accordance with an embodiment of the present disclosure.

FIG. 23 illustrates an example dataflow into and through a last DSP block 26C configured as an accumulator block. As illustrated, the DSP block 26C may receive data that are outputs of other DSP blocks (e.g., DSP blocks 26A, 26B). Direct accumulation in which all three tensors are accumulated in a single block may provide bfloat24 or bfloat16 sums. The accumulation values are stored may be stored outside of the DSP block 26 in soft logic (represented by buffers 290). In other words, the outputs of many DSP blocks 26 may be summed and result in a final value that has a bfloat24 or bfloat16 format. In other embodiments, other data formats (e.g., data formats having twenty-four or fewer than twenty-four bits) may be utilized.

Figure 24:
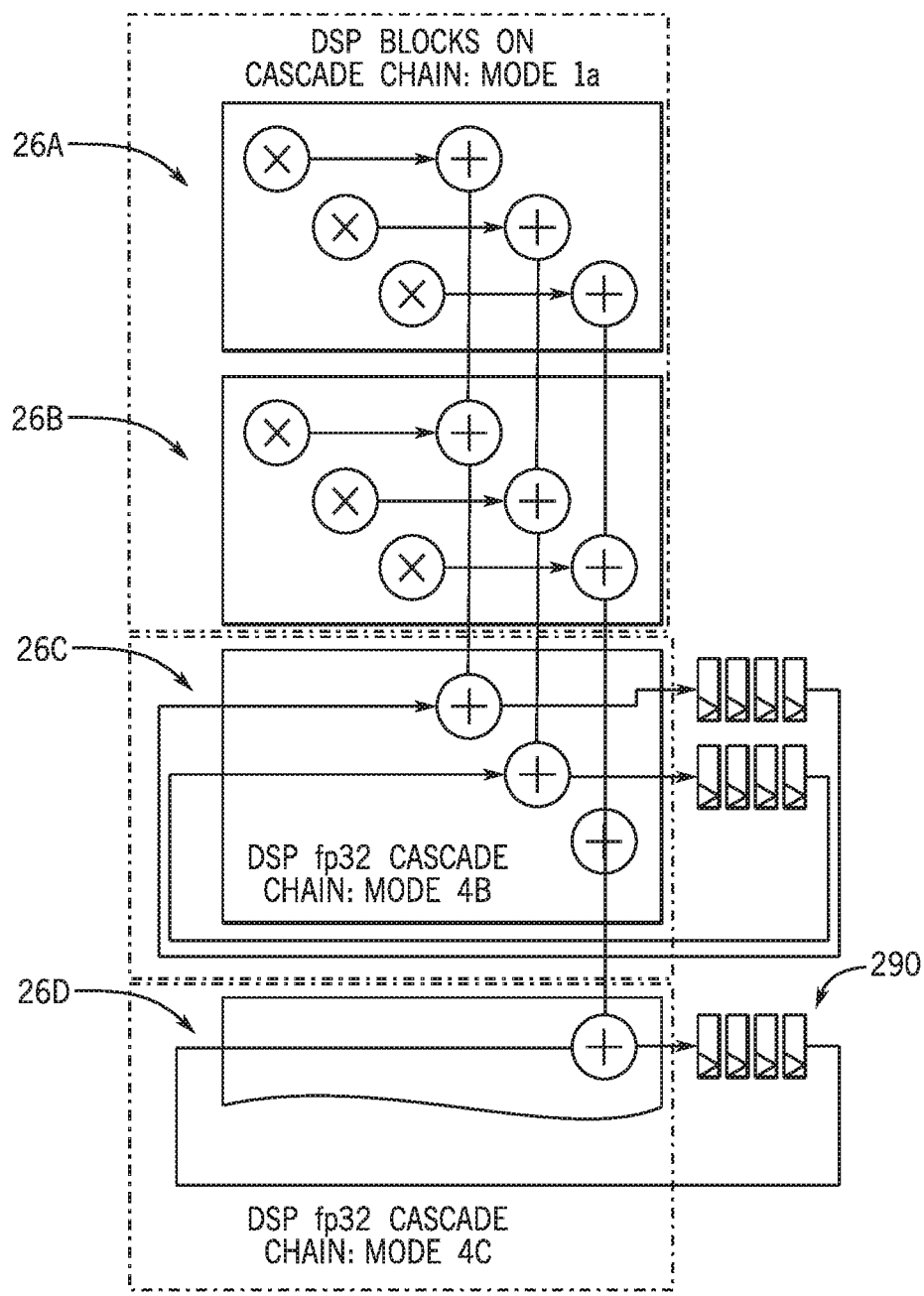
FIG. 24 is illustrates accumulation of floating-point values generated by a DSP block, in accordance with an embodiment of the present disclosure.

Accumulation can also be performed using single-precision floating-point values (e.g., FP32 values). As illustrated in FIG. 24, two accumulators are implemented using DSP block 26C. A third chain is forwarded to another DSP block 26D for the final accumulation. The accumulated values are stored and managed in soft logic outside the DSP block 26, such as in buffers 290. In particular, the other DSP block 26D may be utilized due to the size of the values (e.g., FP32 values) being added and the number of input/output wires available on the DSP block 26. In other words, relative to the accumulation illustrated in FIG. 23 using less precise data types (e.g., bfloat24 or bfloat16 values), accumulation involving single-precision floating-point values utilizes more input/output wires, and the amount of input/output wires to be utilized may be more than single DSP block 26 includes. Thus, to accumulate larger values (e.g., FP32 values or other types of values more precise than bfloat24 values), multiple DSP blocks 26 can be utilized. For example, in the illustrated embodiment, each DSP block 26 includes seventy-two output wires. Thus, each DSP block 26 can output up to three 24-bit values (e.g., bfloat24) or up to two FP32 values.

As indicated above, the DSP block 26 may be utilized for several applications, such as to perform operations associated with artificial intelligence (e.g., machine learning) and digital signal processing. For example, as described above, the DSP blocks 26 may perform multiplication operations (e.g., matrix-matrix multiplication, vector-vector multiplication, and vector-matrix multiplication) involving relatively low precision values, such as four-bit or eight-bit values. As described below, the DSP blocks 26 may be utilized to perform higher precision multiplication operations, such as multiplication operations involving data having fifteen or sixteen bits. In particular, the DSP blocks 26 may be used to emulate different components of larger multipliers, larger precision dot products, and larger precision complex multiplications. To that end, end users may be able to mix AI and DSP applications on the same device (e.g., the integrated circuit device 12). In some cases, such as when the integrated circuit device 12 is an FPGA, the efficiency of the DSP block 26 can provide approximately ten times higher density denser compared to typical digital signal processing for similar precision. Accordingly, the DSP block 26 is well-suited for both AI applications as well as digital signal processing applications.

Figure 25:
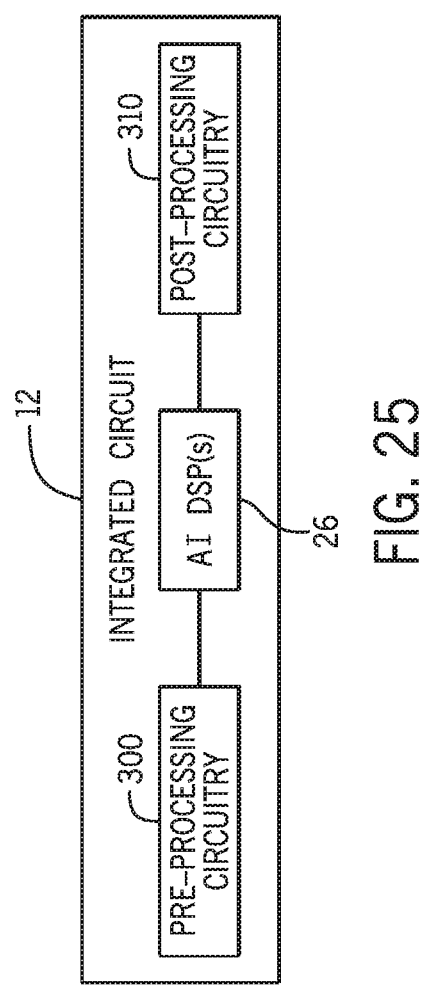
FIG. 25 is a block diagram of the integrated circuit device of FIG. 1, in accordance with an embodiment of the present disclosure.

Bearing this in mind, FIG. 25 is a block diagram of the integrated circuit device 12. As illustrated, the integrated circuit device 12, which may be a programmable logic device (PLD) such as an FPGA, includes pre-processing circuitry 300, DSP blocks 26, and post-processing circuitry 310. The pre-processing circuitry 300 may perform various operations on data and provide the data to the DSP blocks 26. For example, the pre-processing circuitry 300 may split incoming data into lower precision data types. For instance, a sixteen-bit data value may be split into two values having fewer bits (e.g., seven or eight bits). The pre-processing circuitry 300 may provide values the DSP blocks 26, such as the weighs discussed above as well as values that will be multiplied by the weights. The post-processing circuitry 310 may receive outputs of the DSP blocks 26 and perform mathematical operations on the received data. For example, the post-processing circuitry 310 may be an adder or accumulator that can determine the sum of values received from the DSP blocks 26. The pre-processing circuitry 300 and post-processing circuitry 310 are discussed in more detail below, as are multiplication operations involving fifteen and sixteen-bit values.

Figure 26:
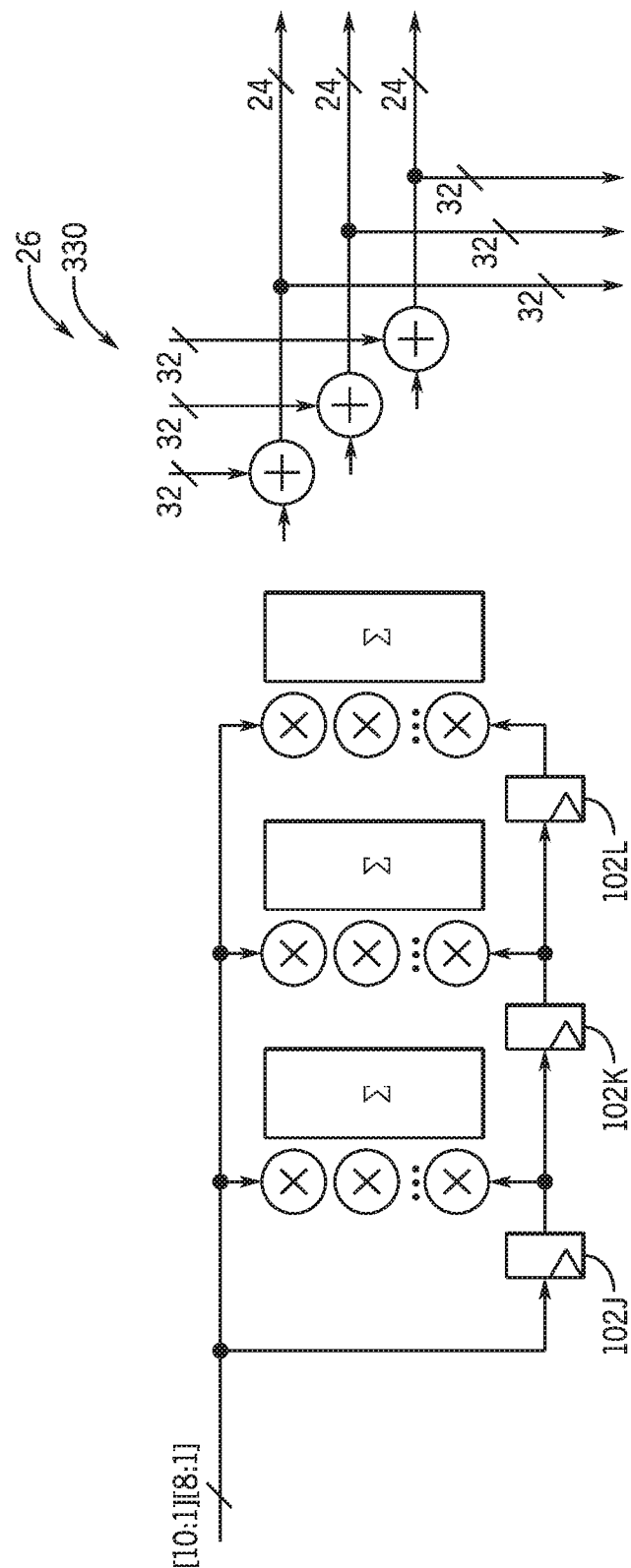
FIG. 26 is a is a block diagram representative of a tensor block that can be implemented using the DSP block of FIG. 1, in accordance with an embodiment of the present disclosure.

Continuing with the drawings, FIG. 26 is a block diagram representative of a tensor block 330 that can be implemented using the DSP block 26. The tensor block 330 generally corresponds to the tensor processing block 150 of FIG. 5A and FIG. 5B. The tensor block 330 packs many smaller precision multipliers in the space of a traditional DSP block that may be included in the integrated circuit device 12, including, but not limited to, embodiments in which the integrated circuit device 12 is an FPGA. As discussed above, weights are preloaded, and activations are shared across multiple columns, each of which implements a DOT product. Three columns or dot products are provided. In one case, each DOT consists of the sum of ten INT8 multipliers (e.g., signed 8-bit x 8-bit multiplication operations). The output of the tensor block 330 may be three fixed point numbers (e.g., the result of ten INT8 multiplications may use a 20-bit output per column). Alternatively, the result can be converted to floating-point, as also discussed above.

The tensor blocks 330 can also be cascaded in series. This cascade may be in fixed-point (with, for example, a 32-bit word to allow multiple blocks to be cascaded, and optionally accumulated). The cascade may also be in floating point, where a 32 bit (such as IEEE754 single-precision floating point) floating point value is used. Dedicated cascade busses can support large bus widths more efficiently than the busses into the programmable fabric, where additional multiplexing may be involved to support the flexible nature of the integrated circuit device 12.

INT8 (optionally with shared exponents) values are useful for deep learning inference, but more limited for deep learning training. The INT8 tensor block may also have limited utility for regular signal processing applications in which higher precision data values may more typically be used. Integer precisions closer to INT16 (C short) or FP32 (or FP24) would be useful for these applications. However, supporting these data types in the DSP block 26 would increase area and complexity to the point where the DSP block 26 could be too large to include on the integrated circuit device 12 efficiently. Bearing this in mind, performing multiplication operations involving higher precision data types using the DSP blocks 26 is discussed below. Indeed, rather than expand the size of the tensor block 330 to perform such multiplication operations, the DSP block 26 may be virtually expanded to enable these multiplication operations to be performed.

Figure 27:
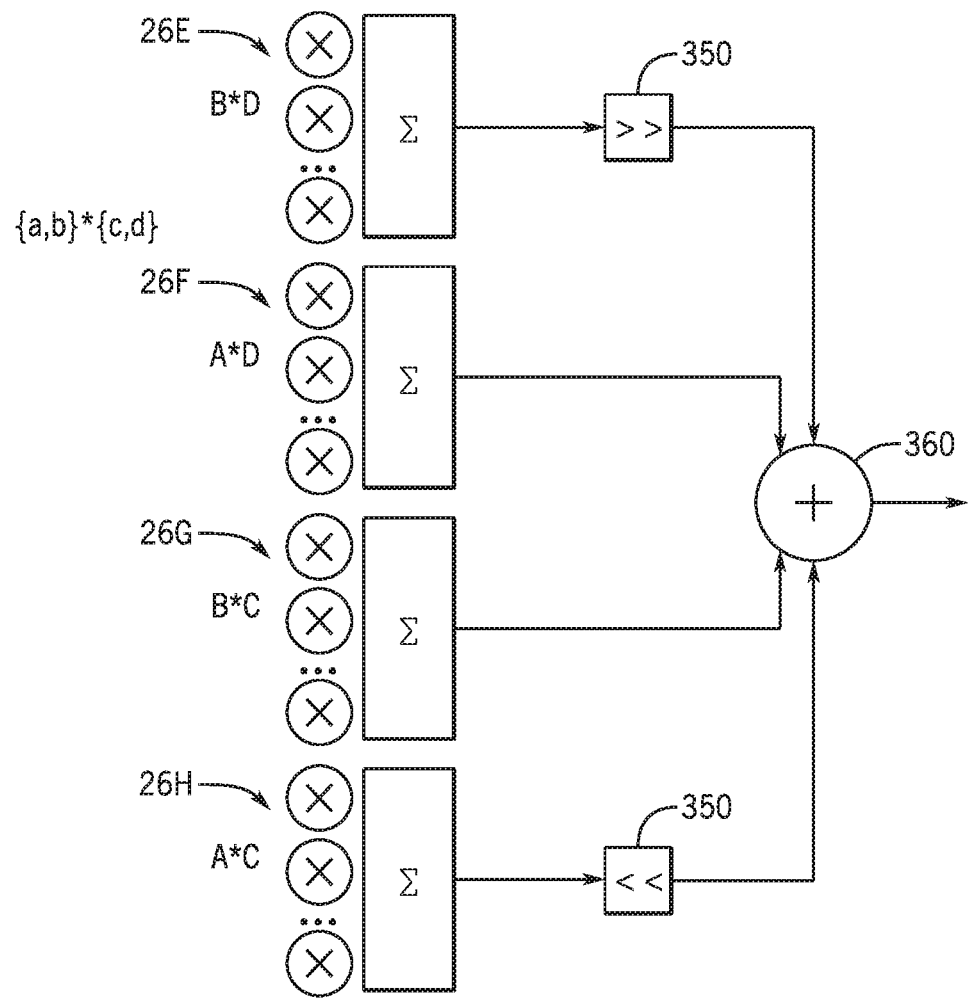
FIG. 27 is a block diagram illustrating a construction of a vector multiplier that can be implemented using the DSP block of FIG. 1, in accordance with an embodiment of the present disclosure.

FIG. 27 is a block diagram illustrating a construction of an INT15 vector multiplier that can be implemented using the DSP block 26. In other words, the DSP block 26 may be utilized to perform multiplication operations involving INT15 values. An INT15 number can be decomposed into two halves —an eight-bit upper value and a seven-bit lower value. The pre-processing circuitry 300 may perform such a decomposition. The INT15 multiplication is then performed using four eight-bit multiplication operations. For example, {a, b} and {c, d} may be two INT15 values, where 'a' and 'c' are signed eight-bit values and 'b' and 'd' are unsigned seven-bit values. In this example, the product of these values is (ac<<14)+((ad+cb)<<7)+bd, with "<<x" indicating that values are a magnitude of x bits different than the magnitude of 'bd.' The lower two values (e.g., least significant values remaining after splitting an initial INT15 values) are represented as unsigned numbers, which may involve setting the most significant bit of each eight-bit input to be set to '0'. Due to some of the values being signed and others being unsigned, depending on the values being multiplied, products may be signed, unsigned, or mixed sign partial products.

Because the tensor block 330 includes dot products, the maximum efficiency of the larger multipliers may be achieved by implementing DOT products. The values 'A', 'B', 'C', and 'D' represent vectors of arrays of 'a', 'b', 'c', and 'd', respectively. In one case, multiple tensors are supported, where up to three vectors of 'C' and 'D' are pre-loaded, and then multiplied with the same vector of 'A' and 'B'. In other words, 'C' and 'D' may be used as weights that are preloaded into two column of weight registers of the DSP block 26, up to three different sets of weights (e.g., C1-C3 and D1-D3) may be used, and 'A' and B' may be multiplied by the weights in the manner described above. In another embodiment, such as when operating in vector mode, a single DOT product may be used, with 'A', 'B', 'C', and 'D' input simultaneously.

In the illustrated embodiment, four DSP blocks 26 are used, and each DSP block 26 is independent of one another (e.g., not cascaded to other DSP blocks 26). Outputs (e.g., which correspond to values determined by adding circuitry of the DSP blocks 26 such as adders 220 or FP32 adders 240) may be shifted relative to each other using shifter circuitry 350, and then summed using an adder 360, both of which may be included in the post-processing circuitry 310. Additionally, the adder 360 may be implemented in soft logic of the integrated circuit device 12. In other words, the decimal place associated with two of the DSP blocks 26E-26H may be shifted using the shifter circuitry 350 so that sums generated by the DSP blocks 26E-26H share a common exponent and can be summed the adder 360.

This scheme can be expanded to larger or smaller versions of multi-component multiplication. For example, a 22-bit signed multiplier could be implemented with a decomposition of {a, b, c}*{d, e, f}, or (ad<<28)+((de+bd)<<21)+((af+be +cd)<<14)+((bf+ce)<<7)+cf, where 'a' and 'd' are eight-bit signed values, and 'c', 'e', and 'f' are seven-bit unsigned values.

Unsigned numbers, such as fourteen-bit unsigned multiplications using a decomposition into only seven-bit unsigned values can also be implemented. Asymmetric multiplications, such as multiplication operations between fifteen-bit and eight-bit numbers can also be implemented. In this case the fifteen-bit multiplicand value is {a, b}, where 'a' is an eight-bit signed value, 'b' is a seven-bit unsigned numbers, and the eight-bit multiplier value is signed. Many other combinations can be assembled this way.

Figure 28:
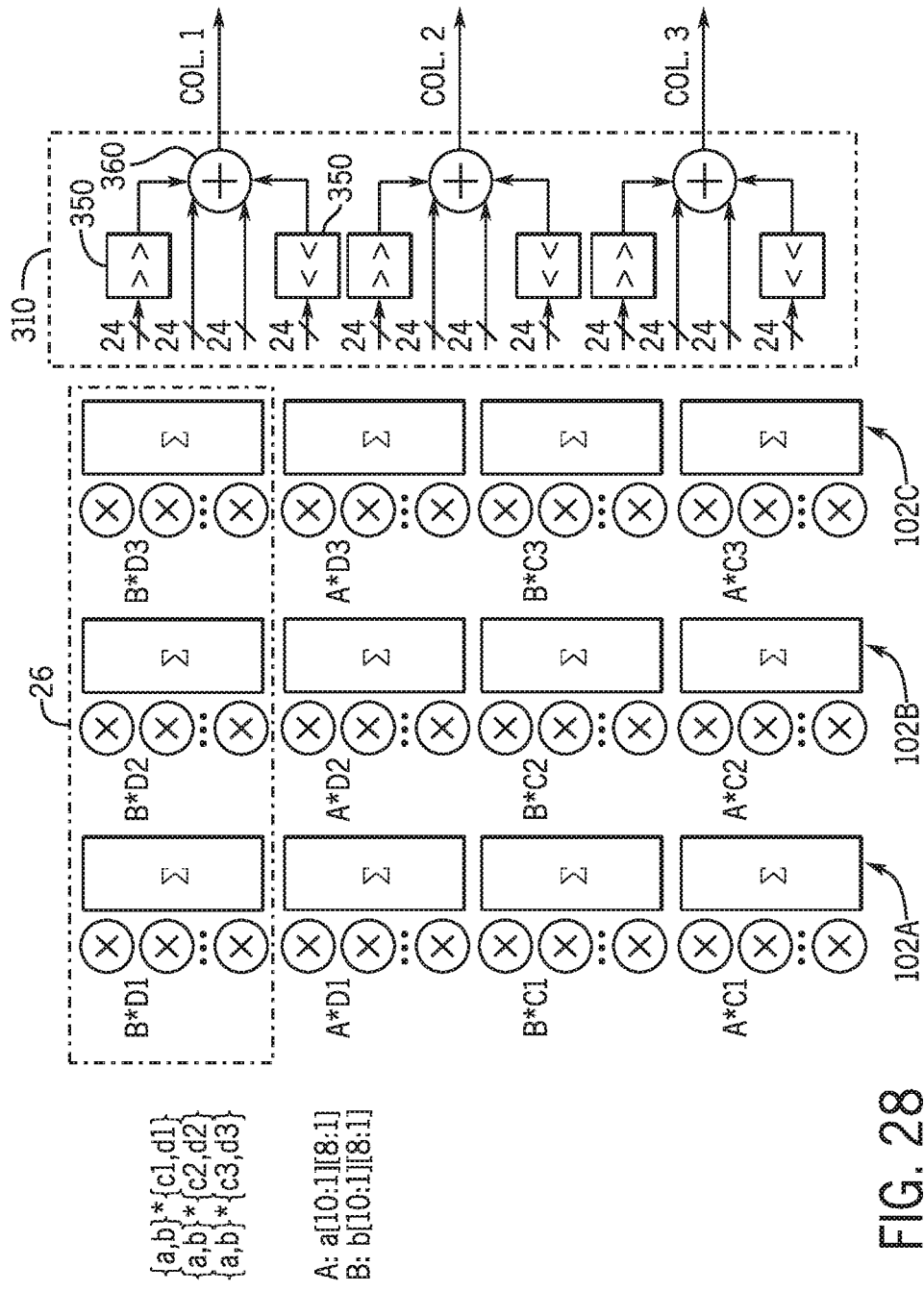
FIG. 28 illustrates a multiplication operation in which three columns of four DSP blocks are utilized, in accordance with an embodiment of the present disclosure.

Continuing with the drawings, FIG. 28 illustrates a multiplication operation in which three columns 102 of four DSP blocks 26 are utilized. In particular, weights C1 and D1 are loaded into a first column 102A, C2 and D2 are loaded into a second column 102B, and C3 and D3 are loaded into a third column 102C. Values A and B may then be streamed through each of the DSP blocks 26, which may then generate sums (e.g., 24-bit numbers). Post-processing circuitry 310 may receive the outputs of the DSP blocks 26, shift values as described above, and then determine a sum using adders 360. In other words, the values for each column 102 may be provided to a particular portion of the post-processing circuitry 310 and then summed.

However, this embodiment still depicts the DSP blocks 26 being independent of one another. In other words, cascading is not being utilized. However, in some embodiments, cascading may be utilized. For instance, although the logical additions in FIG. 28 show all four vector or tensor components being summed in soft logic (e.g., by the post-processing circuitry 310), components with the same rank (bit positions) could be summed by cascading the DSP blocks 26 containing the components having the same rank. Accordingly, only three external components would be summed when cascading is used. An example of multiple vectors being added via cascading is shown in illustrated in FIG. 29. In particular, two vectors (e.g., ad and cb) are summed by cascading. Therefore, the post-processing circuitry 310 may only receive and sum three inputs.

Figure 29:
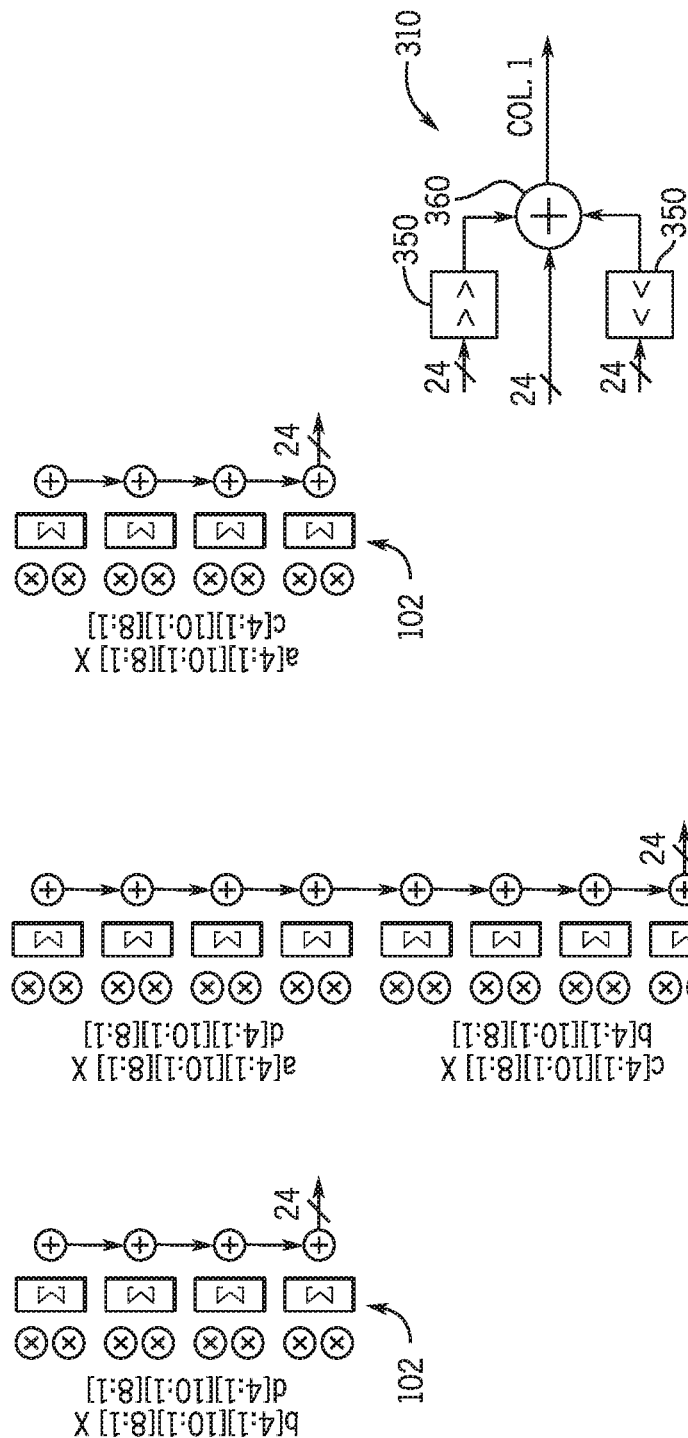
FIG. 29 illustrates multiple vectors being added using cascading, in accordance with an embodiment of the present disclosure.
Figure 30:
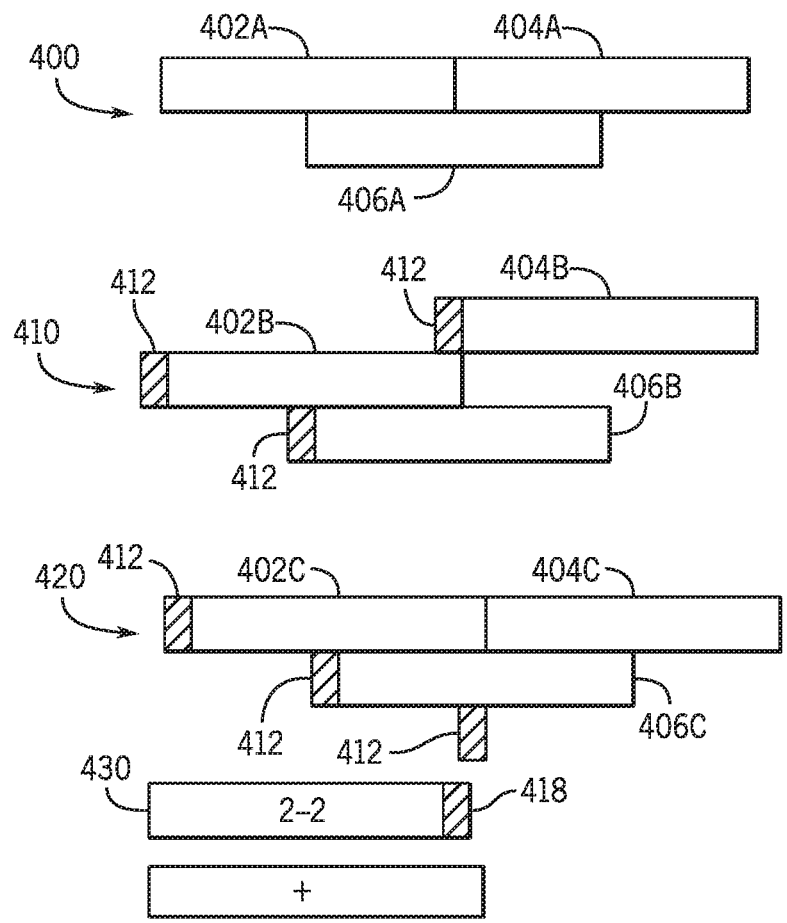
FIG. 30 is alignment of components generated by determined partial products of inputs to a DSP block, in accordance with an embodiment of the present disclosure.

The vector/tensor components may have wordgrowth over the natural multiplier size. For example, the low component (b*d) could have four bits of wordgrowth within a single DSP block 26, which could overlap the other component (e.g., a*c) ranges. This is shown in FIG. 30. More specifically, FIG. 30 illustrates the alignment of the three components (e.g., in cases in which the middle two components are already added via cascading, such as shown in FIG. 29).

A first portion 400 of FIG. 30 illustrates the alignment of a single multiplier component. In particular, section 402A may correspond to a single multiplication operation performed when calculating (A*C), section 404A may correspond to a single multiplication operation performed when calculating (B*D), and section 406A may correspond to the sum of a single multiplication operation performed when calculating (A*D) and a single multiplication operation performed when calculating (B*C). A second portion 410 of FIG. 30 shows the alignment of the three components of several multipliers, with wordgrowth extensions 412. In other words, section 402B corresponds to (A*C), section 404B corresponds to (B*D), and section 406B corresponds to the sum of (A*D) and (B*C). Due to the wordgrowth extensions 412, the sections 402B, 404B overlap as illustrated in the second portion 410 of FIG. 30. The wordgrowth extension 412 of the lower component (b*d) can be compressed from three bits into two bits using a 3-2 compressor (as indicated by block 418 in a third section 420 of FIG. 30). Additionally, space for the most significant carry bit of this compression can be made by using a 2-2 compressor 430 on the portions of the two remaining two components (e.g., A*C and the sum of (A*D) and (B*C)), as indicated by section 420. Additionally, it should be noted that more complicated overlaps occur where more components used, such as in embodiments in which INT22 values are used. Compression strategies providing a higher level of compression may be used before performing a final summation.

Figure 31:
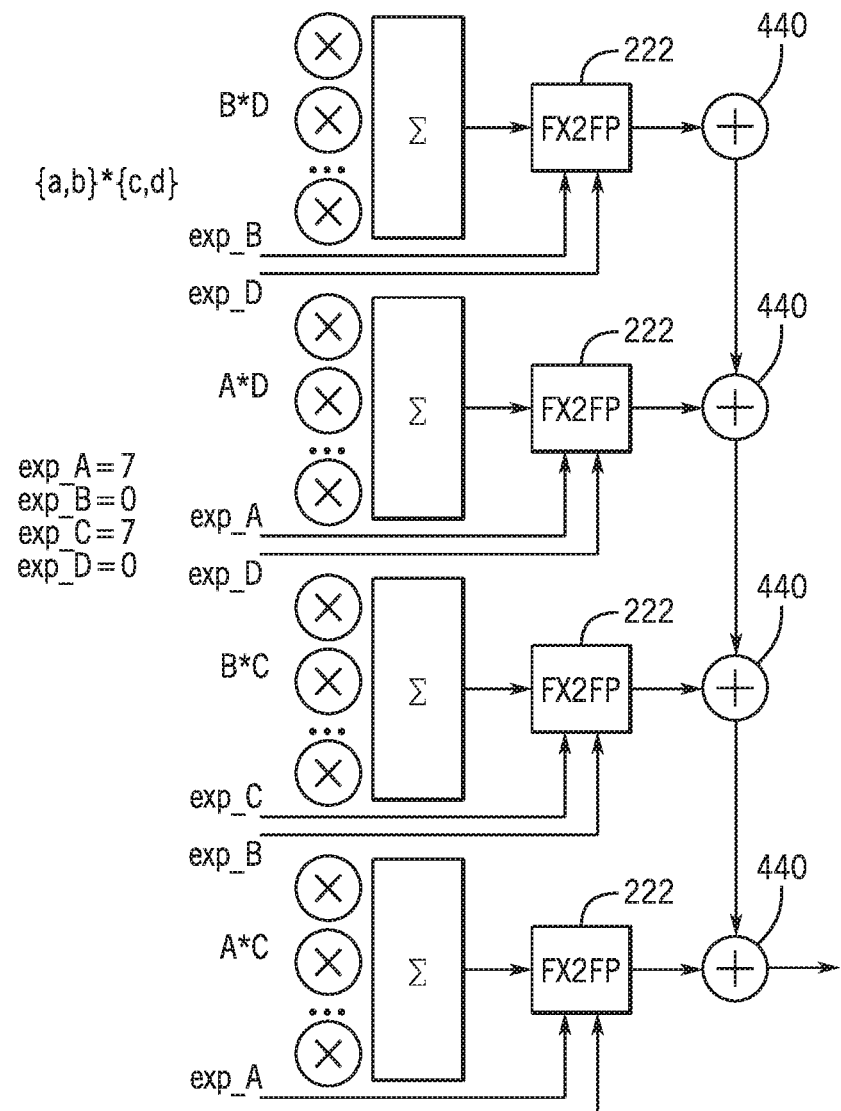
FIG. 31 is representative of four DSP blocks that are communicatively coupled to another, in accordance with an embodiment of the present disclosure.

As discussed above, cascading may be employed. Cascading may be more efficient than when cascading is not used. An example in which cascading is utilized is illustrated in FIG. 31, which is representative of four DSP blocks 26 that are communicatively coupled to another. In particular, shared exponents (e.g., values of either zero or seven as indicated in FIG. 31) may be utilized when converting a fixed-point sum to a floating-point value. For instance, a bias point of a sum provided to fixed-point to floating-point conversion circuitry 222 may be adjusted based on the values of the shared exponents that the fixed-point to floating-point conversion circuitry 222 also receives. Floating-point values may be provided (e.g., as cascaded outputs) to subsequent DSP blocks 26, which may determine a sum between a received floating-point value and a floating-point value generated by the fixed-point to floating-point conversion circuitry 222 For example, adders 440 in FIG. 31 correspond to the FP32 adders of the DSP block 26 illustrated in FIG. 5A and FIG. 5B.

Figure 32:
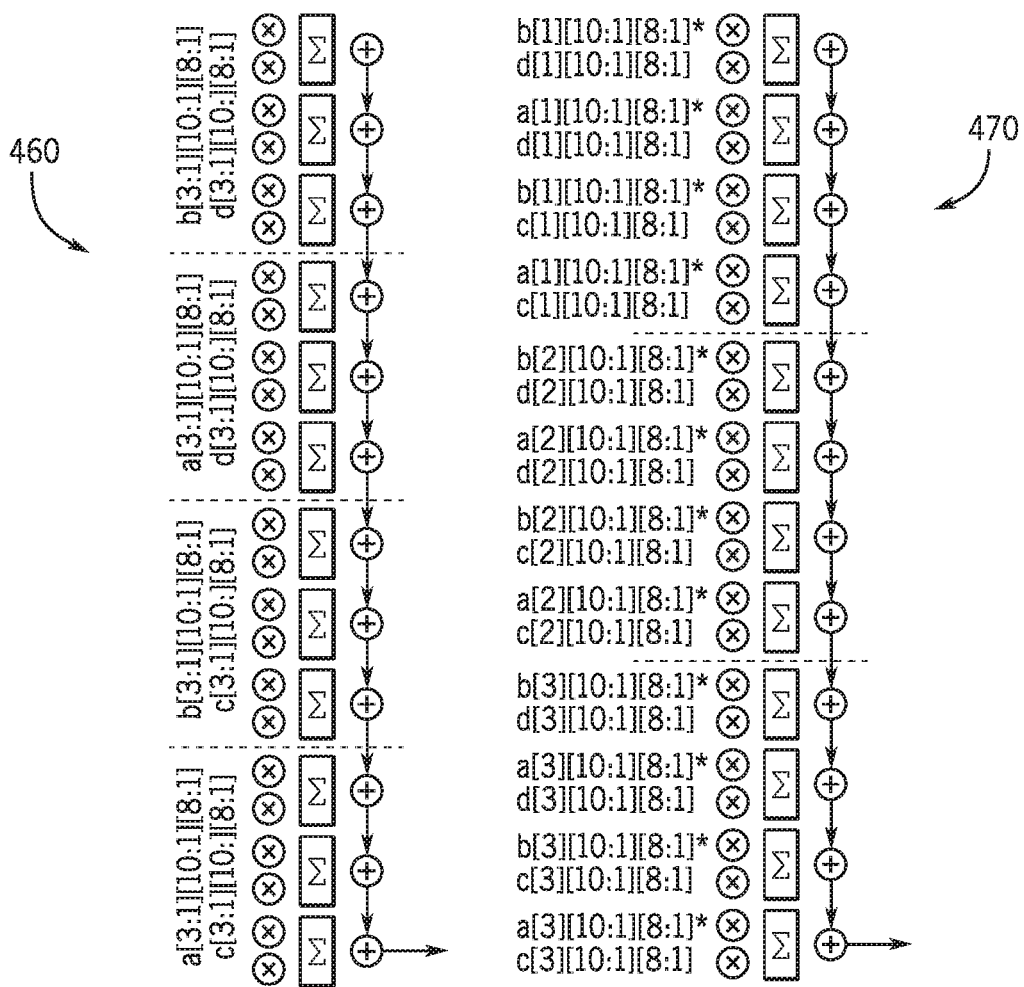
FIG. 32 illustrates two types of vector multipliers implementable using floating-point cascades, in accordance with an embodiment of the present disclosure.

Keeping the discussion of FIG. 31 in mind, FIG. 32 illustrates two types of vector multipliers implementable using floating-point cascades. In arrangement 460, the vectors are grouped by their rank values. In other words, vectors are grouped based on the sum of the values of the shared exponents associated with the values being multiplied. In arrangement 470, the ranks are mixed on a DSP block by DSP block basis. In the arrangement 470, ranks may be shifted as described above with respect to FIG. 31. In either case, both of the arrangements 460, 470 may be utilized. Additionally, it should be noted that although each of the 'b' and 'd' inputs are eight bits, they are the unsigned lower values as described above. Accordingly, each of the 'b' and 'd' inputs include a seven-bit unsigned value having a most significant bit of zero.

Figure 33:
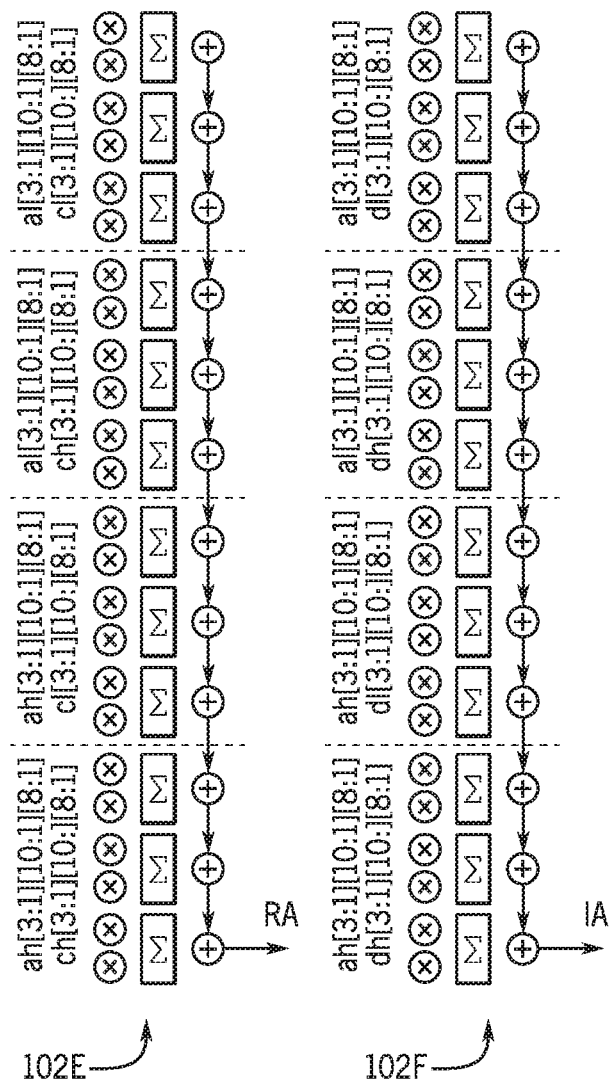
FIG. 33 and FIG. 34 illustrate how an INT15 complex vector multiple can be implemented with multiple DSP blocks, in accordance with an embodiment of the present disclosure.
Figure 34:
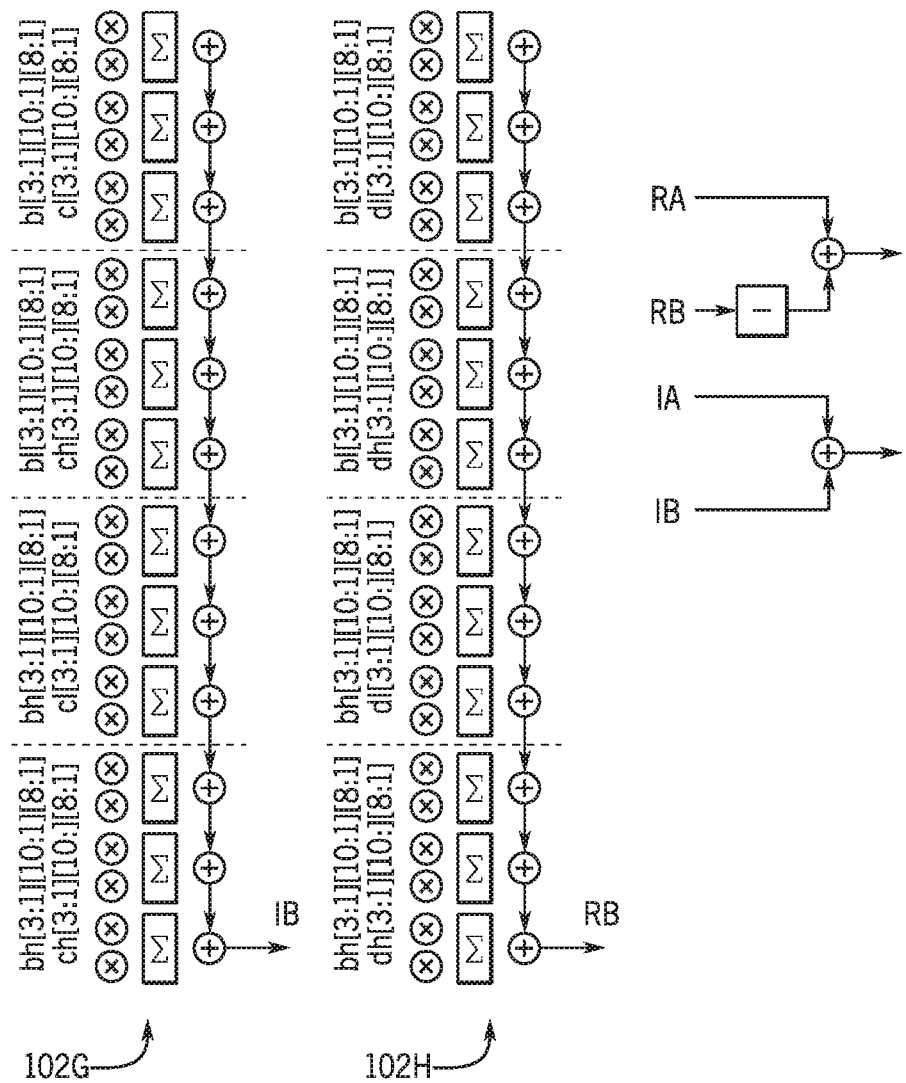

The DSP blocks 26 may also be utilized to perform multiplication operations involving complex values. In particular, FIGS. 33 and 34 illustrate how an INT15 complex vector multiple can be implemented with multiple DSP blocks 26. More specifically, FIGS. 33 and 34 illustrate how a product of {a+bj} and {c+dj} can be determined, where {a+bj} and {c+dj} are each fifteen-bit values. As illustrated, a total of four columns are used. In particular, columns 102E, 102H are utilized to determine the real component of the product, and columns 102F, 102G are utilized to determine the imaginary components. For example, in columns 102E, 102F the 'C' and 'D' vectors may be pre-loaded as weights, and the 'A' vector may be an input that streamed across the DSP blocks 26. For columns 102G, 102H '(−D)' and the 'C' vectors are pre-loaded weights and the 'B' vector may be streamed across the DSP blocks 26. The '(−D)' values may be pre-calculated, or the negation can be applied as the values are loaded as weights. Each set of columns (e.g., a first set of columns 102E, 102H associated with real components and another set of columns 102F, 102G associated with the imaginary components) may be added using an adder of a DSP block 26, such as the FP32 adder 240

While the examples of multiplication operations discussed above include operations involving fifteen-bit values, each of the examples involving fifteen-bit multipliers can be utilized to perform multiplication operations involving other data types, such as FP23 multiplier analogues with shared exponents.

Furthermore, the DSP blocks 26 may be utilized to perform multiplication operations involving sixteen-bit values, which may be utilized for artificial intelligence determinations (e.g., machine learning inference determinations) and when performing digital signal processing. As discussed below, multiplication operations involving sixteen-bit values (e.g., sixteen-bit integer values) may be performed by dividing values to be multiplied into signed byte pairs. However, before discussing signed byte pairs, slicing will first be discussed.

As discussed above, to perform multiplication involving values that are wider than the native width of the circuitry utilized to perform the multiplication operation, the values to be multiplied may be split into several lower-precision values (e.g., splitting a fifteen-bit value into a signed eight-bit value and an unsigned seven-bit value as discussed above). These resulting values may be called "slices." To determine the product of two values, slices may be generated, the slices may be multiplied, and products of the multiplication operations involving the slices may be summed (with values shifted as appropriate to account for values having different exponents).

As another example, if a and b are sixteen-bit numbers, a and b can each be divided into two eight-bit slices. That is a, can be divided into slices $a_1$ and $a_0$, where $a=(a_1<<8)+a0$. That is, a is equal to the sum of $a_0$ and $a_1$ shifted to the left eight places. Similarly, b, can be divided into slices $b_1$ and $b_0$, where $b=(b_1<<8)+b_0$. Additionally, it should be noted that $a_1$ and $b_1$ are signed while $a_0$ and $b_0$ are unsigned. In this example, the product of a and b may be given according to Equation 1 listed below:

$$a*b=((a_1*b_1)<<16)+(((a_1*b_0)+(a_0*b_1))<<8)+(a_0*b_0) \quad \text{Equation 1}$$

Similarly, if A and B are vectors that include sixteen-bit numbers, the scalar product (or dot product) of A and B can be calculated bit-slicing each vector, then calculating scalar products for the slices:

$$A \cdot B=((A_1 \cdot B_1)<<16)+(((A_1 \cdot B_0)+(A_0 \cdot B_1))<<8)+(A_0 \cdot B_0) \quad \text{Equation 2}$$

Where $A_1$ and $A_0$ are the slices of A, and $B_1$ and $B_0$ are the slices of B.

Slicing values according to Equations 1 and 2 may be impractical though. For instance, multiplying $a_0$ and $b_0$ may require an unsigned multiplier (e.g., unsigned eight-bit multiplier circuitry). Moreover, mixed sign multipliers may be needed to determine the product of $a_1$ and $b_0$ as well as the product of $b_1$ and $a_0$. However, hardware that is typically optimized to perform machine learning inference operations (e.g., a central processing unit (CPU), or graphics processing unit (GPU) may not be configured to perform unsigned multiplication, mixed sign multiplication, or both unsigned and mixed sign multiplication. To circumvent this, values may be sliced into one eight-bit slice and one seven-bit slice. For instance, a can be divided into slices $a_1$ and $a_0$, where $a=(a_1<<7)+a_0$, and b can be divided into slices $b_1$ and $b_0$, where $b=(b_1\ 7)+b_0$. This type of slicing is generally what is described above with respect to fifteen-bit values. Additionally, the product of a and b can be given according to Equation 3:

$$a*b=((a_1*b_1)<<14)+(((a_1*b_0)+(a_0*b_1))<<7)+(a_0*b_0) \quad \text{Equation 3}$$

In this modified scheme, each multiplication operation can be performed using signed 8-bit multipliers. For instance, any unsigned arguments are first zero-extended to eight bits. However, when using this scheme, a and b are 15 bits wide, while many quantities encountered when performing digital signal processing are 16 bits wide. Furthermore, it should be noted that this scheme can accommodate wider operands (e.g., operands wider than 15 bits) by using more slices. For instance, using three slices each for a and b would result in a 22-bit multiplier. However, this approach would call for more 8-bit multipliers to be used.

To enable the DSP blocks 26 to perform multiplication operations involving sixteen-bit values, thereby enabling the DSP blocks 26 to be able to efficiently perform when used for artificial intelligence and digital signal processing applications, an alternative representation of integers may be used: signed byte tuples. A signed byte tuple is a collection of 8-bit signed slices. Each tuple represents an integer. For example, a sixteen-bit integer a can be represented by the signed byte pair ($a_1$, $a_0$) (where $(a_1<<8)+a_0=a$). As another example, a signed byte triple of ($a_2$, $a_1$, $a_0$) can be used, which represents $(a_2<<16)+(a_1<<8)+a_0$. Larger tuples that include more slices (e.g., four, five, or more than five slices) may also be used. In other words, signed byte tuples are not limited to including only two or three slices.

Because the slices of signed byte tuples are signed, the range of values that can be represented is different than the range of values that can be represented with a value is sliced into signed and unsigned values. For example, a conventional 16-bit number can represent integers in the range $[-2^{15}, 2^{15}-1]$ (i.e., -32768 to 32767), while a signed byte pair (i.e., a signed byte tuple having two slices) can represent integers in the range $[-2^{15}-2^7, 2^{15}-2^7-1]$. The largest signed byte pair is (127, 127), which represents 32639, while the smallest signed byte pair is (-128, -128), which represents -32896. To determine the product of two integers a and b, Equation 1 may be utilized. However, in this case, each of the values $a_1$, $a_0$, $b_1$, and $b_0$ is a signed eight-bit value. Because $a_0$ and $b_0$ are signed when employing signed byte tuples, each individual multiplication operation can be performed using signed 8-bit multipliers.

Keeping in mind that the range of values that can be represented using signed byte tuples (e.g., signed byte pairs) different from the range of values that exists when using signed and unsigned slices, the conversion of signed integers to signed byte tuples will now be discussed. Converting a signed 16-bit integer into a signed byte pair while preserving its value can be achieved by splitting the integer into slices $a_1$ and $a_0$, where $a_1$ is signed, and $a_0$ is unsigned. If the value of $a_0$ is less than 128, when the signed byte pair representation of a is ($a_1$ and $a_0$). Otherwise, the signed byte pair representation of a is ($a_1+1$, $a_0-256$). In other words, 256 (i.e., $2^8$) may be added to $a_1$ to account for 256 being subtracted from $a_0$. It should be noted that ($a_0-256$) as a signed byte has the same bit-pattern as the representation of $a_0$ as an unsigned byte. No physical operation is performed on the lower byte (i.e., $a_0$).

However, as noted above, the range of values represented by signed byte tuples (e.g., signed byte pairs), differs from the range of conventional sixteen-bit values. This means that a few 16-bit integers (i.e., relatively high values) cannot be represented as standard base pairs that maintain the same value as the initial 16-bit value. Before discussing mapping of integers to signed byte tuples, it should be noted that similar procedures exist to convert wider signed integers into signed byte tuples (e.g., when the signed byte tuple maintains the same value as the integer from which the signed byte tuple is derived).

Rather than attempting to preserve the exact value of a 16-bit integer value a when it is mapped to a signed byte pair, a mapping that enables the entire range of such integers to be represented as signed byte pairs may be employed. Such a mapping, f(a), can be implemented by splitting a 16-bit integers into 8-bit slices $a_1$ and $a_0$, where $a_1$ is signed, and $a_0$ is unsigned, where:

$$f(a)=(a_1, a_0-128) \quad \text{Equation 4}$$

Thus, the value represented by the standard byte pair f(a) is (a-128). It should be noted that the representation of ($a_0-128$) as a signed byte has the same bit-pattern as the representation of $a_0$ as an unsigned byte except for the most significant bit, which is inverted. Accordingly, this mapping can be implemented using a single NOT gate.

Mapping larger signed integers can also be performed. For example, when a is a 24-bit signed integer, a can be represented by a signed byte triple by splitting a into 8-bit slices $a_2$, $a_1$, and $a_0$, where $a_2$ is signed, and $a_1$ and $a_0$ are unsigned. For a signed byte triple:

$$f(a)=(a_2, a_1-128, a_0-128) \quad \text{Equation 5}$$

In this case, the value represented by the signed byte triple is $(a-2^{15}-2^7)$. Additionally, it should be noted that wider integers can be mapped to signed byte tuples in a similar way.

When performing multiplication using signed byte tuples, the signed byte tuple for a may be given using $(a_1$ and $a_0)$ or $(a_1+1, a_0-256)$ depending on the value of $a_0$, as discussed above. A signed byte tuple for a value x being multiplied by given using the Equation 4, with a being substituted for x. For example, to determine a product of a and x in which a is a known 16-bit integer and x is an unknown 16-bit integer, signed byte tuples may be used. The value-preserving conversion to map a to the signed byte pair $(a_1, a_0)$ or $(a_1+1, a_0-256)$ can be used because the value of a is known. However, Equation 4 would be used to generate the signed byte tuple for x because x could potentially be a value that is outside of the range that a signed byte pair can provide. In other words, x can be mapped to a signed byte pair by determining to f(x), in which case the signed byte pair will be equivalent to (x−128). Once the mapping of a and x into signed byte pairs has occurred, the product of the signed byte pairs, when multiplied would be equal to the product of a and (x−128), which is equivalent to the product of a and x minus the product of 128 and a. To find the product of a and x, the product of 128 and a can be added to that value. However, because 128 is a power of two, the product of 128 and 2 can be calculated as $(a<<7)$. Therefore, no extra multiplication operations are required to determine (128*a) that will be added the product of the signed byte pairs. As such, the product of a and x can be given as:

$$a*x=((a_1)<<16)+(((a_1*x_0)+a_0x_1))<<8)+(a_0*x_0)+(a<<7) \quad \text{Equation 6}$$

where $(a_1, a_0)$ is the signed byte pair representation of a, and $(x_1, x_0)$ is the signed byte pair representation of x.

Bearing this in mind, an example multiplication will now be discussed. In this example, a is equal to 5001, and x is equal to −763. Signed byte pairs of a and x can be determined as discussed above. For example, converting 5001 into two eight-bit slices in which $a_1$ is signed and $a_0$ is unsigned would give a signed byte pair of (19, 137) (i.e., $19 \times 2^8 + 128$ equals 5001). However, because $a_0$ has a value of 137, which is not less than 128, the signed byte pair for a that will be used to perform the multiplication a and x is (20, −119). Before continuing to discuss x, it should be noted that 137 as an unsigned 8-bit integer has the same bit-pattern as −119 as a signed 8-bit integer.

To determine the signed by pair for x, f(x) is determined. Thus, the signed byte pair for x having a value of −763 will be (−3, −123), which is equivalent to −891 (i.e., $-3*2^8-123$), which is equal to x−128. This gives the following partial products:

$$a_1*x_1=20*-3=-60;$$

$$a_1*x_0=20*-123=-2460;$$

$$a_0*x_1=-119*-3=357;$$

$$a_0*x_0=-119*-123=14637$$

Substituting these partial products into Equation 6 gives:

$$a*x=((-60)<<16)+((-2460+357)<<8)+14637+(5001<<7)$$

which can be reduced to:

$$a*x=-3932160+-538368+14637+640128=-3815763$$

Thus, Equation 6 gives that the product of a and x is −3815763, which is indeed the product of 5001 and −763.

Signed byte pairs can also be utilized to determine scalar products (also known as dot products). For example, if $A=<a_i>$ is a vector of known 16-bit integers and $X=<x_i>$ is a vector of unknown 16-bit values, the scalar product of A and X is:

$$A \cdot X = \Sigma_i(a_i*x_i) \quad \text{Equation 7}$$

The scalar product of A and X can also be determined as:

$$A \cdot X = \Sigma_i(a_i*(x_i-k)) + \Sigma_i(a_i*k) = \Sigma_i(a_i*(x_i-k)) + k*\Sigma_i a_i \quad \text{Equation 8}$$

where k=128 for sixteen-bit integers.

Because k is known, each value of $(x_i-k)$ can be represented as a signed byte pair. Additionally, the value $(k*\Sigma_i a_i)$ will be a known value because both each of $a_i$ is known, as is k. Thus, to determine the scalar product of A and X can be determined by bit-slicing each a and mapping each $x_i$ to a signed byte pair such that $a_i=(a1_i, a0_i)$ and $f(x_i)=(x1_i, x0_i)$, thereby forming the bit-sliced vectors $(A_1, A_0)$ and $(X_1, X_0)$, where $A_1=<a1_i>$, $A_0=<a0_i>$, $X_1=<x1_i>$, and $X_0=<x0_i>$. Thus:

$$A \cdot X = ((A_1 \cdot X_1)<<16) + ((A_1 \cdot X_0)<<8) + A_0 \cdot X_0 + K \quad \text{Equation 9}$$

where $K=k*\Sigma_i a_i$. As such, a native signed 8-bit scalar product operation for each of the 8-bit scalar products can be given.

Additionally, a similar technique may be utilized to perform multiplication operations involving complex numbers. For instance, in a scenario in which a equals $(a_0, j \cdot a_1)$ and x equals $(x_0, j \cdot x_1)$, the imaginary part of the result can be given as $(a_1*x_0+a_0*x_1)$. Using the techniques discussed above, this is equal to the scalar product of $<a_1, a_0>$ and $<x_0, x_1>$. For the real part of product, the result is $(a_0*x_0-a_1*x_1)$, which is equal to the scalar product of $<a_0, -a_1>$ and $<x_0, x_1>$.

Continuing with the discussion of performing multiplication operations using signed byte tuples, there may be cases where a sixteen-bit integer cannot be converted directly from a normal binary representation of the integer to a signed byte tuple representation such as a signed byte pair. For instance, when the value of a lies outside the range of $[-2^{15}-2^7, 2^{15}-2^7-1]$ (e.g., an integer relatively high in value), a may not be convertible to a signed byte tuple using the techniques discussed above. However, because a lies in the range $[2^{15}-2^7, 2^{15}-1]$, −a will be convertible into a signed byte tuple. Accordingly, for values of a falling outside the range of $[-2^{15}-2^7, 2^{15}-2^7-1]$, the negative value of a can be used in place of a. Additionally, a different mapping, g(x) can be used (e.g., instead of f(x)):

$$g(x)=-x-(k+1) \quad \text{Equation 10}$$

where k has a value of 128 (i.e., $2^7$) for signed byte pairs and a value of 32896 (i.e., $2^{15}+2^7$) for signed byte triples.

Like values determined using f(x), values of g(x) can be represented using signed byte tuples (e.g., signed byte pairs). Applying the mapping g(x) to the binary representation of a 16-bit value produces a signed byte pair representation where each bit of x, except the most significant bit of the lower byte (e.g., $x_0$), have been inverted. This mapping can also be implemented using NOT gates.

Furthermore, because $(a*x)=(-a*-x)$, the product of a and x can be given as:

$$a*x=-a*(-x-(k+1))+-a*(k+1) \quad \text{Equation 11}$$

where k is 128 for signed byte pairs. Additionally, the product of a and x can be given as:

$$a*x=((a_1*x_1)<<16)+(((a_1*x_0)+(a_0x_1))<<8)+(a_0*x_0)+K \quad \text{Equation 12}$$

where $(a_1, a_0)$ is the signed byte pair representation of $-a$, $(x_1, x_0)=g(x)$, and $K=-a*(k+1)$, which equals $=-129*a$. For scalar products (including complex multiplications), a similar adjustment for each individual $a_i$ can also be made. This affects the constant that will be added at the end of the calculation (because there is now a sum of positive and negative terms). This means that some $x_i$ will use the f(x) transformation and others will use the g(x) transformation. In particular, whether f(x) or g(x) is used depends on whether a is convertible to a signed byte tuple. For instance, f(x) can be used when the value of a lies in the range $[2^{15}-2^{15}-1]$, while g(x) is used when $a_i$ lies outside of this range. In other words, when a is convertible into a signed byte tuple (e.g., signed byte pair), f(x) is used. When a is not convertible into a signed byte tuple (e.g., because the value of a lies outside of the range $[2^{15}-2^{15}-1]$), $-a$ may be used as a signed byte tuple, and the function g(x) may be utilized.

Keeping the discussion of signed byte tuples above in mind, the performance of multiplication operations on DSP block 26 using signed byte tuples will be discussed. Turning back to FIG. 26, which represents a single DSP block 26, the DSP block 26 receives a vector of ten signed bytes during each clock cycle. Each vector corresponds to X discussed above. Each vector may be multiplied by signed bytes that are stored in weight registers of the DSP block 26. For instance, the values stored in the weight registers are associated with A discussed above. The DSP block 26 calculates the scalar products of the input vector with each weight vectors (e.g., values stored in the weight registers). As discussed above, values calculated by the DSP block 26 can be output immediately or chained into the next DSP block 26 (e.g., using cascading), which allows scalar products to be computed for vectors containing more than ten elements.

With this in mind, an example in which a 5-element signed byte pair scalar product of A and X will now be discussed. In particular, this can be done by using $\langle X_1, X_0 \rangle$ into the inputs, storing $\langle A_1, 0 \rangle$ in a first column 102J of weight registers, storing $\langle A_0, A_1 \rangle$ in a second column 102K of weight registers, and storing $\langle 0, A_0 \rangle$ in a third column 102L of weight registers. In this case, $X_1$ and $X_0$ are 5-element vectors containing the upper and lower bytes of the SBP representation of each element of X, where $\langle X_1, X_0 \rangle$ is a 10-element vector containing the concatenation of the elements of X Additionally, $A_1$ and $A_0$ are defined similarly. The value "0" is a 5-element vector containing only zeroes. In other words, five weight registers in a column having ten weight registers may be stored five-element vectors $A_1$, A0, and 0.

With these values stored as weights (e.g., when the DSP block 26 is operating in tensor mode), $\langle X_1, X_0 \rangle$ can be streamed across the columns of weight registers of the columns 102. The first column 102J will generate a value $S_1$, which is equal to the scalar product of $A_1$ and $X_1$. The second column 102K will generate a value $S_2$, which is equal to the sums of the scalar product of: 1) $A_0$ and $X_1$ and 2) $A_1$ and $X_0$. The third column 102L will generate a value $S_3$, which is equal to the scalar product of $A_0$ and $X_0$. Thus, the value determined by the DSP block 26 can be defined as $(S_1<<16)+(S_2<<8)+S_3$, which can be determined using the post-processing circuitry 310. The values of $S_1$, $S_2$, and $S_3$ may also be cascading to another DSP block for larger scalar products.

Figure 35:
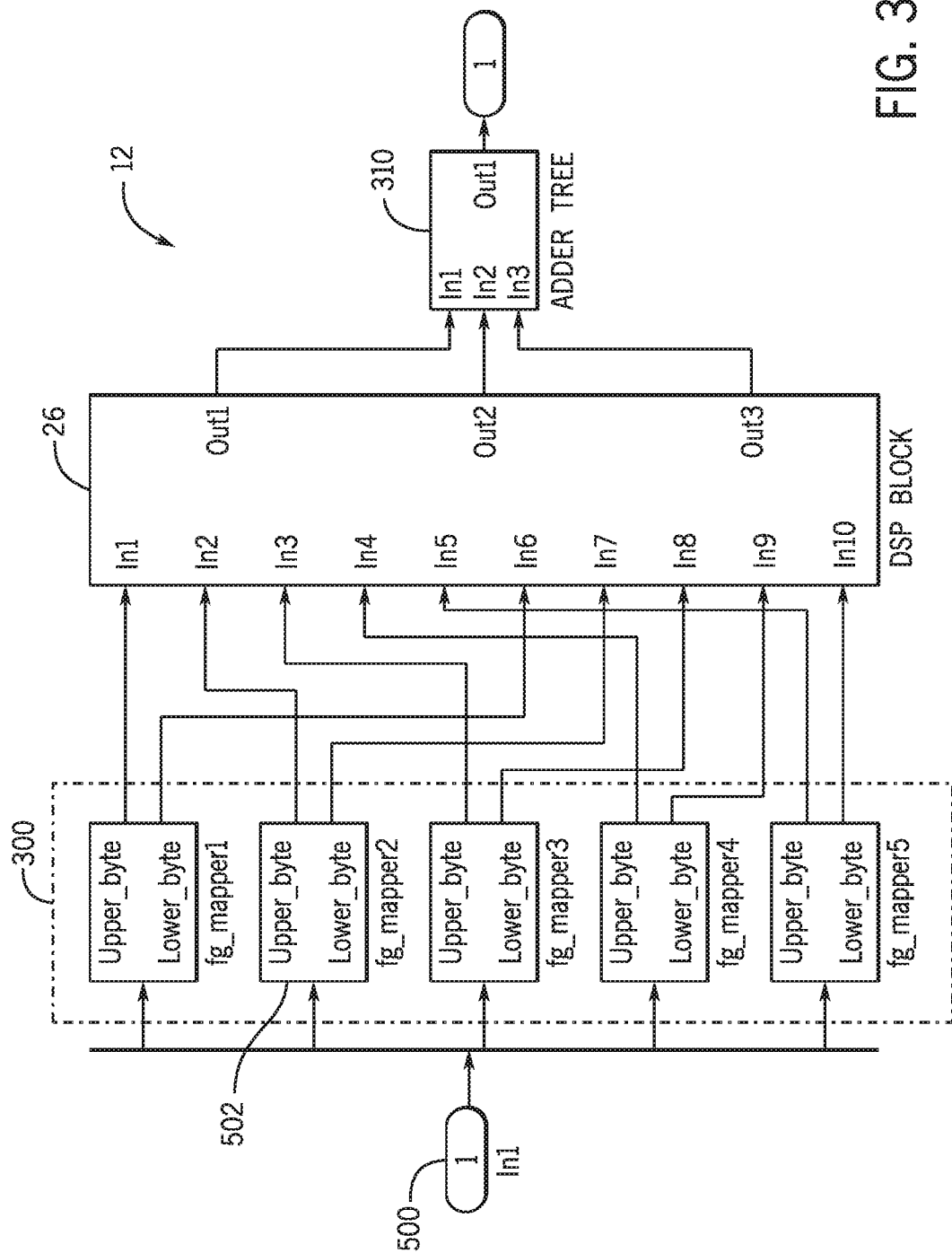
FIG. 35 illustrates a block diagram of the integrated circuit device of FIG. 1 including pre-processing circuitry, a DSP block, and post processing circuitry, in accordance with an embodiment of the present disclosure.

However, this discussion generally assumes that the 16-bit inputs $\langle x_i \rangle$ are already in signed byte pair format. Keeping this in mind, FIG. 35 illustrates a block diagram of an embodiment of the integrated circuit device 12 that includes the pre-processing circuitry 300, DSP block 26, and post-processing circuitry 310. An input 500, which in this example would be the A vector or the X vector (depending on whether weights are being loaded or partial products are being determined), can be converted into signed byte pair format by the pre-processing circuitry 300. More specifically, the pre-processing circuitry 300 includes mapping circuits 502 that can convert A and X into signed byte pair format. For instance, A may be converted into a signed byte pair as described above (e.g., by adjusted the sign of each value a, as needed to ensure convertibility into a signed byte pair). For X, the mapping circuits 502 may determine which mapping function (e.g., f(x) or g(x)) to utilize based on the value of a, stored in a weight register that $x_i$ will be multiplied with to generate a partial product. Each mapping circuit 502 may perform the mapping for one sixteen-bit integer input.

Figure 36:
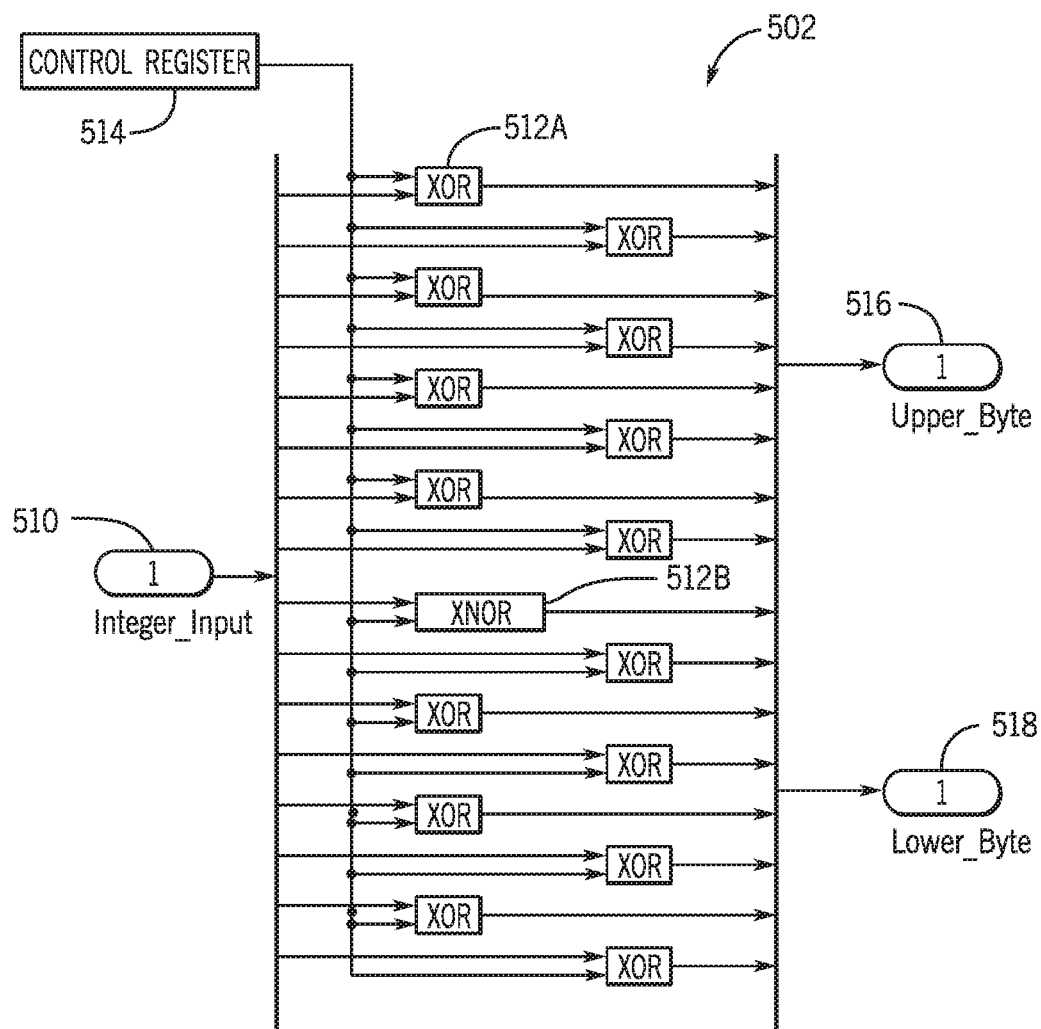
FIG. 36 is a block diagram of a mapping circuit of the pre-processing circuitry of FIG. 35, in accordance with an embodiment of the present disclosure.

Continuing with the discussion of the mapping circuits 502, FIG. 36 is a block diagram of a mapping circuit 502. The mapping circuit 502 may receive an input 510 (e.g., a signed sixteen-bit integer). Each bit of the input may be provided to a different gate 512 (including gate 512A and gate 512B) of the mapping circuit 502. In the illustrated embodiment, each of the gates 512 is an XOR gate except for gate 512B (which receives the most significant bit of the lower byte of the input 510), which is an XNOR gate. The gates 512 may also receive a value from a control register 514 based on whether f(x) or g(x) is used as the mapping function. In other words, the control register 514 may determine which mapping to use (based on the value of $a_i$) and output a specific value to each gate 512 so that the determined mapping is used. For instance, each time a value a, is loaded into the weight registers, a value may be stored in the control register 514. This value may be updated each time a new weight is used. The output of the control register 514 to the gates 512 may be based on the value stored in the control register 514. Based on the inputs to the gates 512 (e.g., the output of the control register 514 and the input 510), the gates 512 will generate the bytes of the signed byte representation (e.g., a signed byte pair having an upper byte 516 and a lower byte 518).

However, keeping in mind that the value of each $x_i$ may be mapped to a value that is not equivalent to the original input $x_i$, when the signed byte pairs are stream across the DSP block 26 that has weights (e.g., bits of the signed byte pair representation of A), value determined by the DSP block 26 can be given as $(S1<<16)+(S2<<8)+S_3+K$, where the value of K can be determined when the bits of the signed byte pair representation of A are loaded into the weight registers. The value of K can be determined using Equation 13 below:

$$K=\Sigma_i h(A_i) \qquad \text{Equation 13}$$

where: $A_i$ is the value of the $i^{th}$ element of the vector A before conversion to a signed byte pair; h(y)=128*y when y is less than $2^{15}-2^7$; and h(y)=−129*y when y is not less than $2^{15}-2^7$.

Figure 37:
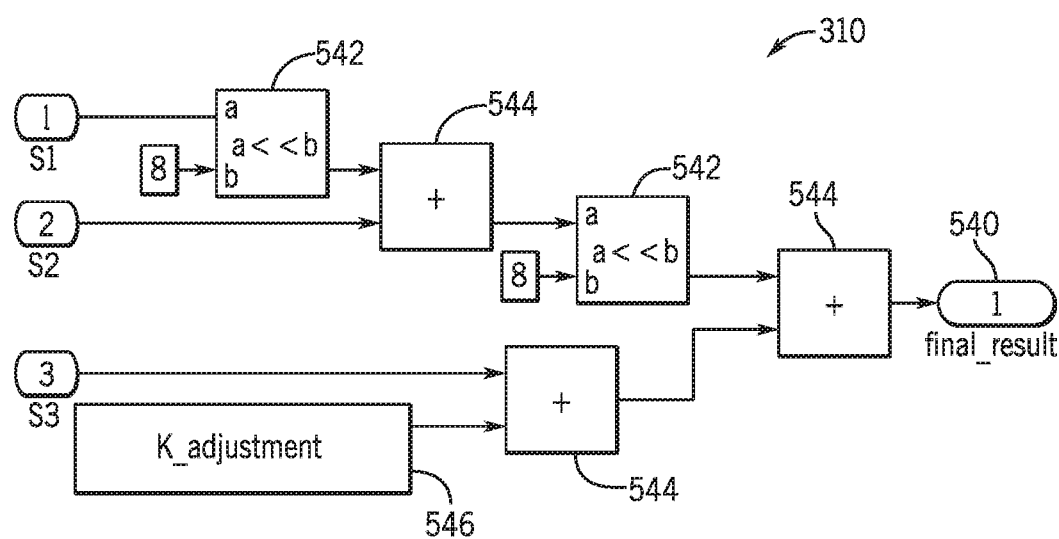
FIG. 37 is a block diagram of post-processing circuitry, in accordance with an embodiment of the present disclosure.

Returning briefly to FIG. 35, the post-processing circuitry 310 accounts for the output of the DSP block 26 including the value K. For example, FIG. 37 is a block diagram of an embodiment of the post-processing circuitry 310, which receives S1, $S_2$, and $S_3$ from the DSP block 26 as inputs, and determine a sum 540 of S1, $S_2$, and $S_3$ using shifting circuitry 542 (which accounts for the S1, $S_2$, and $S_3$ having different radix points) and adders 544. More specifically, a value (e.g., a "K-adjustment factor") may be stored in an adjustment register 546 each time a weight is loaded into a weight register. The K-adjustment factor is summed with S1, S$_2$, and S$_3$ to account for the output of the DSP block 26 including K.

Returning again to FIG. 35, it should be noted that additional datapaths may be provided. For example, datapaths used to update the control registers 514 in the mapping circuits 502, K-adjustment factor in the K-adjustment register 546, and the a$_i$ coefficients in the DSP block 26 may also be included. It should also be noted that larger scalar products can be determined by chaining several DSP blocks 26 together and by cascading values from DSP blocks 26 to subsequent DSP blocks 26 in the chain. Furthermore, it should be noted that inputs of the DSP block 26 illustrated in FIG. 35 may be inputs that are used to stream data across the DSP block 26 or inputs different than those used to stream data across the DSP block 26. For example, when utilizing cascade weight loading or port weight loading, the DSP block 26 may receive the A vector (e.g., as input 500) via separate inputs than those used to load the Xvector. More specifically, the outputs of the pre-processing circuitry 300 may be received via inputs of the DSP block 26 utilized for parallel loading (e.g., the same inputs used to load data to be multiplied by the values stored as weights). Thus, by utilizing different inputs, such as inputs utilized in cascade weight loading and port weight loading, the DSP block 26 receives values to be stored as weights (e.g., the A vector) without the values being processed by the pre-processing circuitry 300. In other words, when cascade weight loading and port weight loading are utilizing, the pre-processing circuitry 300 may be bypassed when loading weights.

Figure 38:
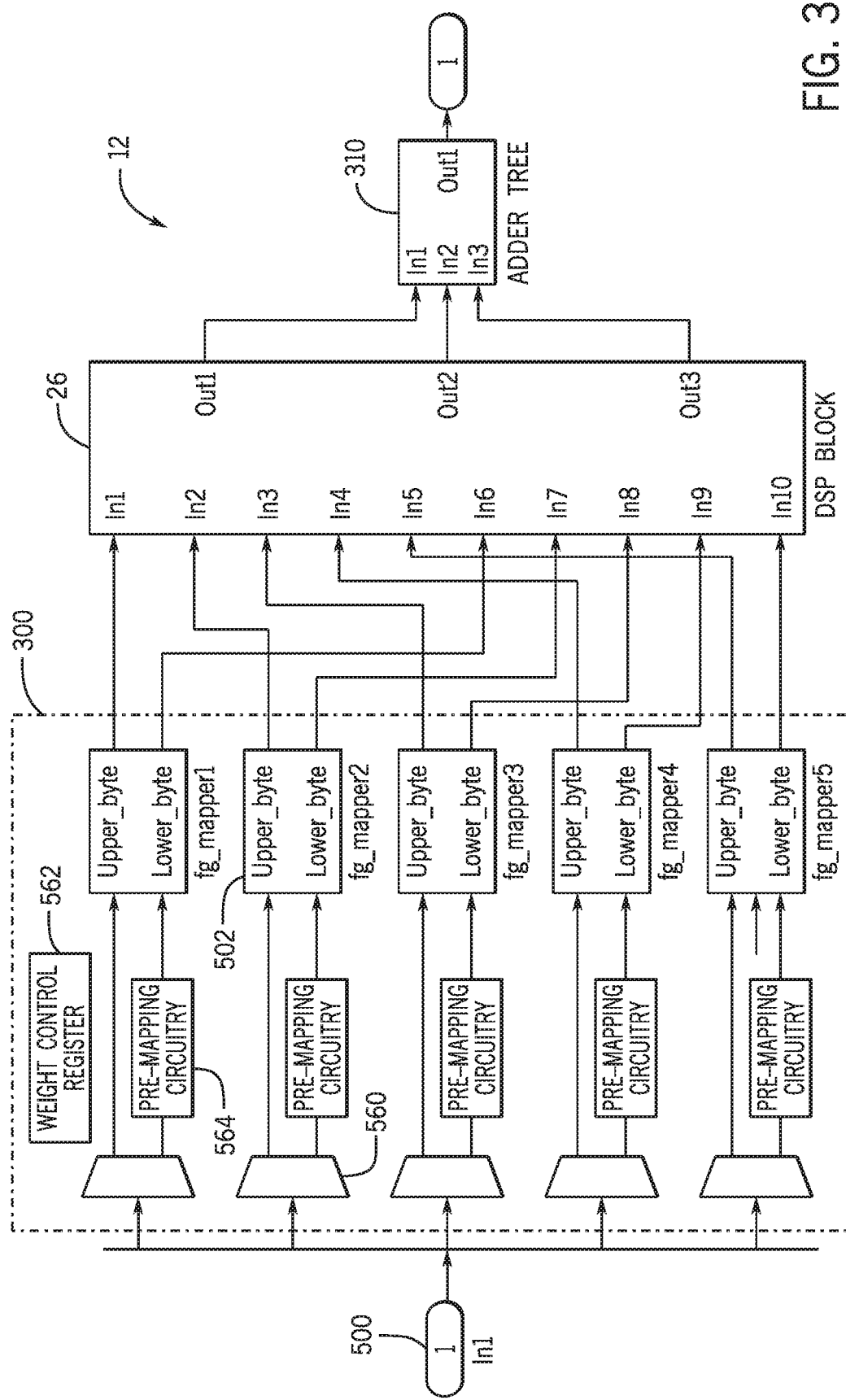
FIG. 38 is block diagram of the integrated circuit device of FIG. 1 including pre-processing circuitry, a DSP block, and post processing circuitry, in accordance with an embodiment of the present disclosure.

Parallel weight loading may be performed in several different ways. For example, the control registers 514 may temporarily disable the mapping circuits 502 so that values of weights will not be modified by the mapping circuits 502. In another embodiment, the integrated circuit device 12 may include additional circuitry to account for values to be modified by the mapping circuits 502. In other words, the weights being loaded into the DSP block 26 may be further pre-processed to modify the weights so that the outputs of the mapping circuits 502 are correct. For example, as illustrated in FIG. 38, the pre-processing circuitry 300 may include demultiplexers 560 that select route (e.g., based on one or more values stored in a weight control register 562 communicatively coupled to the demultiplexers 560) received values to the mapping circuitry 502 or to pre-mapping circuitry 564. When the input 500 is a weight (e.g., vector A), the demultiplexers 560 route values of the input 500 to pre-mapping circuitry 564, which output adjusted values that are modified by the mapping circuitry 502 to produce the original values of the input 500. The values are then received by the DSP block 26 and stored in the weight registers 172. When the input 500 corresponds to values to be multiplied by the weight (e.g., vector X to be multiplied by vector A) the demultiplexers 560 may directly route the values of the input to the mapping circuitry 502, thereby bypassing the pre-mapping circuitry 564.

In other embodiments, the pre-processing circuitry 300 may include other routing circuitry (e.g., demultiplexers) that can be utilized to bypass the mapping circuitry 502, the pre-mapping circuitry 564, and the demultiplexers 560. For example, when performing multiplication of fifteen-bit values (e.g., value {a, b} discussed above), the mapping circuitry 502 of FIG. 35 as well as the demultiplexers 560, pre-mapping circuitry 564, and mapping circuitry 502 of FIG. 38 may be bypassed so that the components of the value (e.g., a and b) can be stored in the weight registers 172 without being modified.

Figure 39:
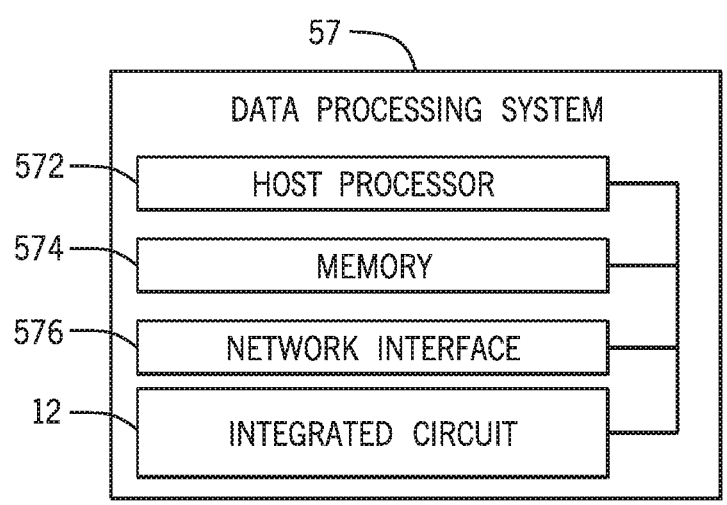
FIG. 39 is a data processing system, in accordance with an embodiment of the present disclosure.

The integrated circuit 12 may include AI specialist DSP blocks 26, which may have interfaces to connect to other integrated circuit devices. In addition, the integrated circuit device 12 may be a data processing system or a component included in a data processing system. For example, the integrated circuit device 12 may be a component of a data processing system 570, shown in FIG. 39. The data processing system 570 may include a host processor 572 (e.g., a central-processing unit (CPU)), memory and/or storage circuitry 574, and a network interface 576. The data processing system 570 may include more or fewer components (e.g., electronic display, user interface structures, application specific integrated circuits (ASICs)). The host processor 572 may include any suitable processor, such as an INTEL® Xeon® processor or a reduced-instruction processor (e.g., a reduced instruction set computer (RISC), an Advanced RISC Machine (ARM) processor) that may manage a data processing request for the data processing system 570 (e.g., to perform encryption, decryption, machine learning, video processing, voice recognition, image recognition, data compression, database search ranking, bioinformatics, network security pattern identification, spatial navigation, or the like). The memory and/or storage circuitry 574 may include random access memory (RAM), read-only memory (ROM), one or more hard drives, flash memory, or the like. The memory and/or storage circuitry 574 may hold data to be processed by the data processing system 570. In some cases, the memory and/or storage circuitry 574 may also store configuration programs (bitstreams) for programming the integrated circuit device 12. The network interface 576 may allow the data processing system 570 to communicate with other electronic devices. The data processing system 570 may include several different packages or may be contained within a single package on a single package substrate. For example, components of the data processing system 570 may be located on several different packages at one location (e.g., a data center) or multiple locations. For instance, components of the data processing system 570 may be located in separate geographic locations or areas, such as cities, states, or countries.

In one example, the data processing system 570 may be part of a data center that processes a variety of different requests. For instance, the data processing system 570 may receive a data processing request via the network interface 576 to perform encryption, decryption, machine learning, video processing, voice recognition, image recognition, data compression, database search ranking, bioinformatics, network security pattern identification, spatial navigation, digital signal processing, or some other specialized task.

Furthermore, in some embodiments, the DSP block 26 and data processing system 570 may be virtualized. That is, one or more virtual machines may be utilized to implement a software-based representation of the DSP block 26 and data processing system 570 that emulates the functionalities of the DSP block 26 and data processing system 570 described herein. For example, a system (e.g., that includes one or more computing devices) may include a hypervisor that manages resources associated with one or more virtual machines and may allocate one or more virtual machines that emulate the DSP block 26 or data processing system 570 to perform multiplication operations and other operations described herein.

Accordingly, the techniques described herein enable particular applications to be carried out using the DSP block 26. For example, the DSP block 26 enhances the ability of integrated circuit devices, such as programmable logic devices (e.g., FPGAs), be utilized for artificial intelligence applications while still being suitable for digital signal processing applications.

While the embodiments set forth in the present disclosure may be susceptible to various modifications and alternative forms, specific embodiments have been shown by way of example in the drawings and have been described in detail herein. However, it should be understood that the disclosure is not intended to be limited to the particular forms disclosed. The disclosure is to cover all modifications, equivalents, and alternatives falling within the spirit and scope of the disclosure as defined by the following appended claims.

The techniques presented and claimed herein are referenced and applied to material objects and concrete examples of a practical nature that demonstrably improve the present technical field and, as such, are not abstract, intangible, or purely theoretical. Further, if any claims appended to the end of this specification contain one or more elements designated as "means for [perform]ing [a function] . . . " or "step for [perform]ing [a function] . . . ", it is intended that such elements are to be interpreted under 35 U.S.C. 112(f). However, for any claims containing elements designated in any other manner, it is intended that such elements are not to be interpreted under 35 U.S.C. 112(f).

Example Embodiments of the Disclosure

The following numbered clauses define certain example embodiments of the present disclosure.

CLAUSE 1.
An integrated circuit device comprising:
a digital signal processing (DSP) block comprising:
a plurality of columns of weight registers;
a plurality of inputs configured to receive a first plurality of values and a second plurality of values, wherein the first plurality of values is stored in the plurality of columns of weight registers after being received, wherein the first plurality of inputs, the second plurality of inputs, or both are derived from higher precision values; and a plurality of multipliers configured to simultaneously multiply each value of the first plurality of values by each value of the second plurality of values.

CLAUSE 2.
The integrated circuit device of clause 1, wherein the higher precision values are fifteen-bit integers or sixteen-bit integers.

CLAUSE 3.
The integrated circuit device of clause 1, wherein the first plurality of values comprise signed values and the second plurality of values comprise unsigned values.

CLAUSE 4.
The integrated circuit device of clause 1, wherein the first plurality of value and the second plurality of values comprise unsigned values.

CLAUSE 5.
The integrated circuit device of clause 1, wherein the multipliers are configured to perform signed multiplication.

CLAUSE 6.
The integrated circuit device of clause 1, comprising a second DSP block configured to receive data from the DSP block.

CLAUSE 7.
The integrated circuit device of clause 1, comprising:
pre-processing circuitry configured to provide the first and second plurality of values to the DSP block; and post-processing circuitry configured to receive one or more values from the DSP block and determine one or more sums based on the one or more values.

CLAUSE 8.
An integrated circuit device comprising:
a plurality of digital signal processing (DSP) blocks, wherein each of the plurality of DSP blocks comprises:
a plurality of columns of registers;
a plurality of inputs configured to receive a first plurality of values and a second plurality of values, wherein the first plurality of values is stored in the plurality of columns of registers after being received, wherein the first plurality of inputs, the second plurality of inputs, or both are derived from higher precision values; and
a plurality of multipliers configured to simultaneously multiply each value of the first plurality of values by each value of the second plurality of values.

CLAUSE 9.
The integrated circuit device of clause 8, comprising post-processing circuitry configured to receive a third plurality of values from plurality of DSP blocks and determine a sum of the third plurality of values.

CLAUSE 10.
The integrated circuit device of clause 9, comprising pre-processing circuitry configured to:
receive a fourth plurality of values; and
generate the second plurality of values by modifying the fourth plurality of values according to one or more mappings.

CLAUSE 11.
The integrated circuit device of clause 10, wherein:
the one or more mappings comprise at least two mappings; and
the pre-processing circuitry is configured to determine which of the at least two mappings to utilize when modifying a value of the fourth plurality of values based on whether a value of the first plurality of values exceeds a threshold.

CLAUSE 12.
The integrated circuit device of clause 11, wherein the post-processing circuitry is configured to account for the modification of the value of the fourth plurality of values when determining the sum of the third plurality of values.

CLAUSE 13.
The integrated circuit device of clause 8, comprising pre-processing circuitry configured to convert the higher precision values into signed byte tuples.

CLAUSE 14.
The integrated circuit device of clause 13, wherein:
the higher precision values comprise sixteen-bit integers; and
the values of the second plurality of values are eight-bit integers.

CLAUSE 15.
The integrated circuit device of clause 8, wherein the plurality of DSP blocks are configured to emulate one or more multipliers configured to perform multiplication operations involving higher precision data types relative to a data type of the first plurality of values or the second plurality of values.

CLAUSE 16.
The integrated circuit device of clause 8, comprising a field-programmable gate array that comprises the plurality of DSP blocks.

CLAUSE 17.

A system comprising:
an integrated circuit device; and
a programmable logic device communicatively coupled to the integrated circuit device, wherein the programmable logic device comprises a plurality of digital signal processing (DSP) blocks, wherein each of the plurality of DSP blocks comprises:
  a plurality of columns of weight registers;
  a plurality of inputs configured to receive a first plurality of values and a second plurality of values, wherein the first plurality of values is stored in the plurality of columns of weight registers after being received, wherein the first plurality of inputs, the second plurality of inputs, or both are derived from higher precision values; and
  a plurality of multipliers configured to simultaneously multiply each value of the first plurality of values by each value of the second plurality of values.

CLAUSE 18.

The system of clause 17, wherein the multipliers are configured to multiply values having up to eight bits wide.

CLAUSE 19.

The system of clause 18, wherein each of the plurality of DSP blocks is configured to determine products of fixed-point values having fifteen bits or sixteen bits.

CLAUSE 20.

The system of clause 17, wherein:
the programmable logic device comprises a field-programmable gate array (FPGA); and
the integrated circuit device comprises a central processing unit (CPU).

What is claimed is:

1. An integrated circuit device comprising:
   a digital signal processing (DSP) block comprising:
     a plurality of columns of weight registers;
     a plurality of inputs configurable to receive a first plurality of values and a second plurality of values, wherein the first plurality of values is stored in the plurality of columns of weight registers after being received, wherein the first plurality of values, the second plurality of values, or both are derived from higher precision values; and
     a plurality of multipliers configurable to:
       simultaneously multiply each value of the first plurality of values by each value of the second plurality of value*s*. and
       emulate one or more multipliers that perform multiplication operations involving higher precision data types relative to a data type of the first plurality of values or the second plurality of values.

2. The integrated circuit device of claim 1, wherein the higher precision values are fifteen-bit integers or sixteen-bit integers.

3. The integrated circuit device of claim 1, wherein the first plurality of values comprise signed values and the second plurality of values comprise unsigned values.

4. The integrated circuit device of claim 1, wherein the first plurality of values and the second plurality of values comprise unsigned values.

5. The integrated circuit device of claim 1, wherein the multipliers are configurable to perform signed multiplication.

6. The integrated circuit device of claim 1, comprising a second DSP block configurable to receive data from the DSP block.

7. The integrated circuit device of claim 1, comprising:
pre-processing circuitry configurable to provide the first plurality of values and the second plurality of values to the DSP block; and
post-processing circuitry configurable to receive one or more values from the DSP block and determine one or more sums based on the one or more values.

8. An integrated circuit device comprising:
a plurality of digital signal processing (DSP) blocks, wherein each of the plurality of DSP blocks comprises:
  a plurality of columns of registers;
  a plurality of inputs configurable to receive a first plurality of values and a second plurality of values, wherein the first plurality of values is stored in the plurality of columns of registers after being received, wherein the first plurality of inputs values, the second plurality of values, or both are derived from higher precision values; and
  a plurality of multipliers configurable to:
    simultaneously multiply each value of the first plurality of values by each value of the second plurality of values; and
    emulate one or more multipliers that perform multiplication operations involving higher precision data types relative to a data type of the first plurality of values or the second plurality of values.

9. The integrated circuit device of claim 8, comprising post-processing circuitry configurable to receive a third plurality of values from plurality of DSP blocks and determine a sum of the third plurality of values.

10. The integrated circuit device of claim 9, comprising pre-processing circuitry configurable to:
receive a fourth plurality of values; and
generate the second plurality of values by modifying the fourth plurality of values according to one or more mappings.

11. The integrated circuit device of claim 10, wherein:
the one or more mappings comprise at least two mappings; and
the pre-processing circuitry is configurable to determine which of the at least two mappings to utilize when modifying a value of the fourth plurality of values based on whether a value of the first plurality of values exceeds a threshold.

12. The integrated circuit device of claim 11, wherein the post- processing circuitry is configurable to account for the modification of the value of the fourth plurality of values when determining the sum of the third plurality of values.

13. The integrated circuit device of claim 10, wherein the fourth plurality of values comprises one or more floating-point values or one or more integer values comprising bits derived from the one or more floating-point values.

14. The integrated circuit device of claim 8, comprising pre-processing circuitry configurable to convert the higher precision values into signed byte tuples.

15. The integrated circuit device of claim 8, wherein:
the higher precision values comprise sixteen-bit integers; and
the values of the second plurality of values are eight-bit integers.

16. The integrated circuit device of claim 8, comprising a field-programmable gate array that comprises the plurality of DSP blocks.

17. A system comprising:
an integrated circuit device; and
a programmable logic device communicatively coupled to the integrated circuit device, wherein the programmable logic device comprises a plurality of digital signal processing (DSP) blocks, wherein each of the plurality of DSP blocks comprises:
a plurality of columns of weight registers;
a plurality of inputs configurable to receive a first plurality of values and a second plurality of values, wherein the first plurality of values is stored in the plurality of columns of weight registers after being received, wherein the first plurality of values, the second plurality of values, or both are derived from higher precision values; and
a plurality of multipliers configurable to:
simultaneously multiply each value of the first plurality of values by each value of the second plurality of values; and
emulate one or more multipliers that perform multiplication operations involving higher precision data types relative to a data type of the first plurality of values or the second plurality of values.

18. The system of claim 17, wherein the multipliers are configurable to multiply values having up to eight bits.

19. The system of claim 18, wherein each of the plurality of DSP blocks is configurable to determine products of fixed-point values having fifteen bits or sixteen bits.

20. The system of claim 17, wherein:
the programmable logic device comprises a field-programmable gate array (FPGA); and
the integrated circuit device comprises a central processing unit (CPU).

* * * * *